(12) United States Patent
Shau

(10) Patent No.: US 8,709,945 B2
(45) Date of Patent: Apr. 29, 2014

(54) AREA EFFICIENT THROUGH-HOLE CONNECTIONS

(76) Inventor: Jeng-Jye Shau, Palo Alto, CA (US)

( * ) Notice: Subject to any disclaimer, the term of this patent is extended or adjusted under 35 U.S.C. 154(b) by 0 days.

(21) Appl. No.: 13/413,561

(22) Filed: Mar. 6, 2012

(65) Prior Publication Data

US 2012/0190193 A1 Jul. 26, 2012

Related U.S. Application Data

(63) Continuation-in-part of application No. 13/013,923, filed on Jan. 26, 2011.

(51) Int. Cl.
*H01L 21/44* (2006.01)
*H01R 43/16* (2006.01)
*H01L 29/40* (2006.01)
*H01L 21/768* (2006.01)
*H01L 23/48* (2006.01)

(52) U.S. Cl.
CPC ........ *H01L 21/76898* (2013.01); *H01L 23/481* (2013.01)
USPC ............. 438/667; 29/874; 257/621; 257/774; 257/E23.011; 257/E23.145; 257/E21.577

(58) Field of Classification Search
CPC .................. H01L 21/76898; H01L 23/481
USPC ................. 438/597, 666, 667; 29/872, 875; 257/621, 773, 774
See application file for complete search history.

(56) References Cited

U.S. PATENT DOCUMENTS

| | | | |
|---|---|---|---|
| 6,667,551 B2 | 12/2003 | Hanaoka et al. | |
| 7,157,372 B1 | 1/2007 | Trezza | |
| 2007/0045858 A1* | 3/2007 | Kirby et al. | 257/774 |
| 2010/0001378 A1* | 1/2010 | Denatale et al. | 257/621 |
| 2010/0264548 A1* | 10/2010 | Sanders et al. | 257/774 |
| 2013/0249091 A1* | 9/2013 | Chen et al. | 257/737 |

* cited by examiner

*Primary Examiner* — Alonzo Chambliss

(57) ABSTRACT

Using printing technologies to fill conductor materials into holes in silicon substrate, the preferred embodiments of the present improve cost efficiency of through-hole connections. Using silicon substrate as cathode terminal during electrical plating that fill holes in a silicon substrate with conductors, the preferred embodiments of the present improve alignment accuracy and cost efficiency of through-hole manufacturing processes.

12 Claims, 43 Drawing Sheets

FIG. 1(e): Prior Art

FIG. 2(d): Prior Art IC Package
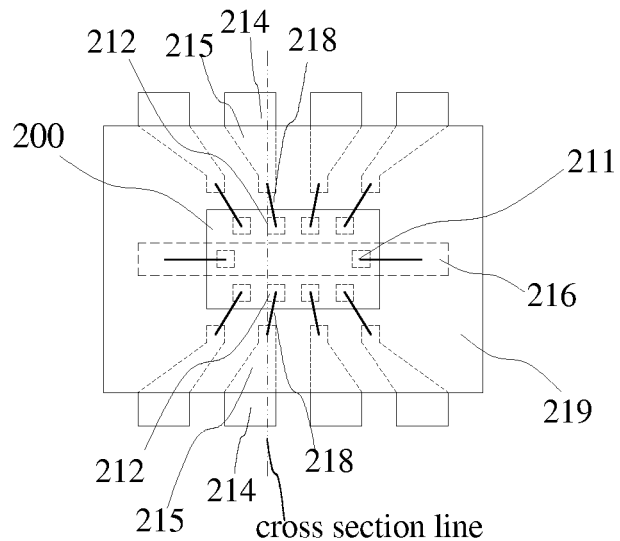
FIG. 2(e): Prior Art IC Package
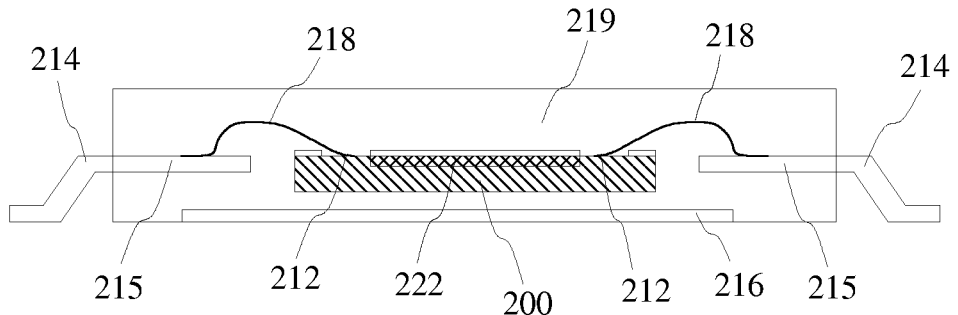
FIG. 2(f): Prior Art BGA Package
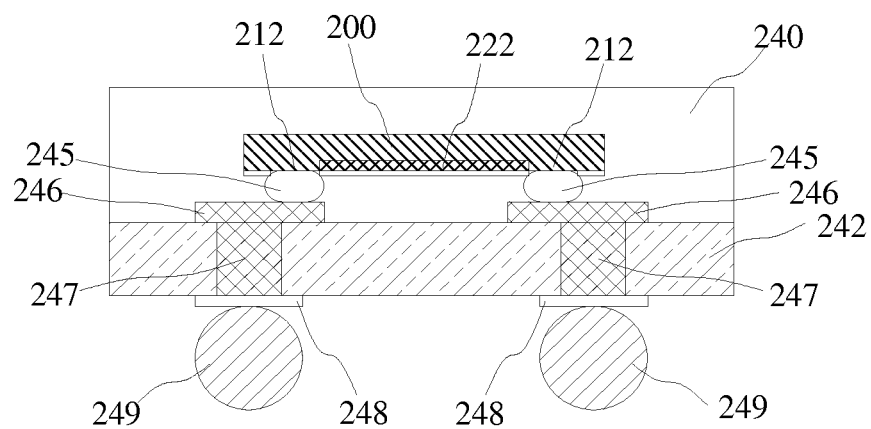

FIG. 3(e)Prior art resistor array

FIG. 3(f)Prior art resistor

FIG. 4(g)
FIG. 4(h)
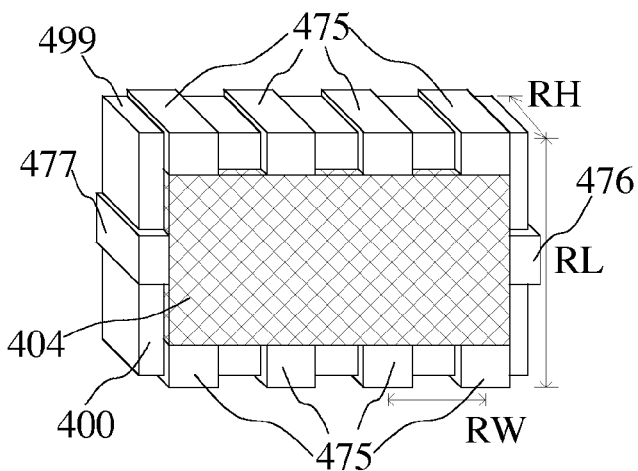
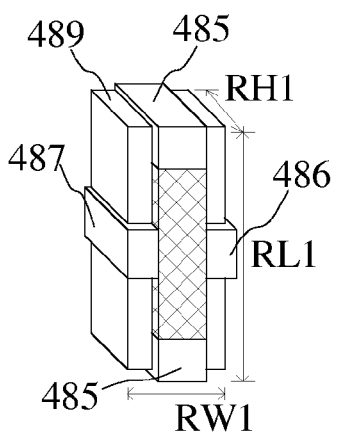
FIG. 4(i)
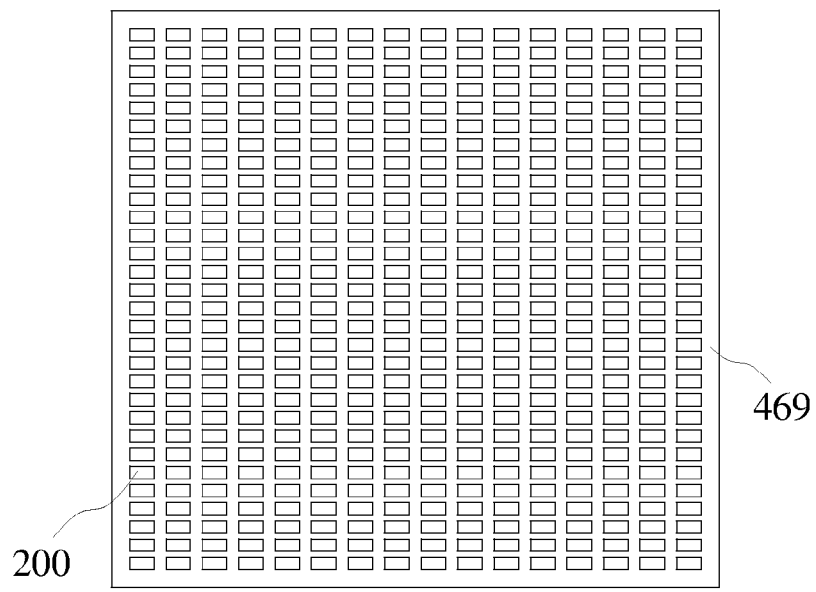

FIG. 12(g) ESD/EMI chip

FIG. 12(h) OPAMP

FIG. 12(i) RF circuits
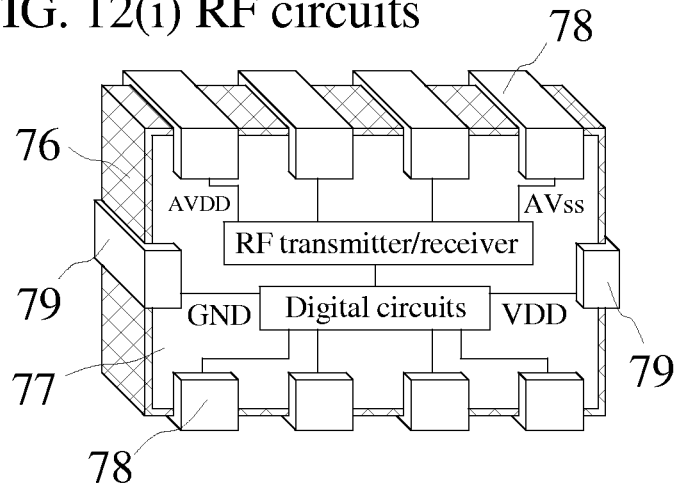
FIG. 12(j) clock chip
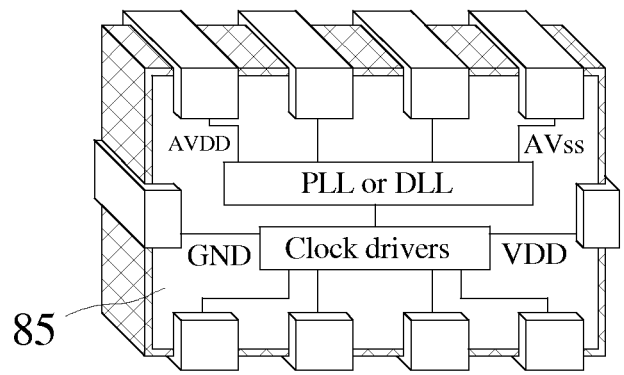
FIG. 12(k) 74 series chips
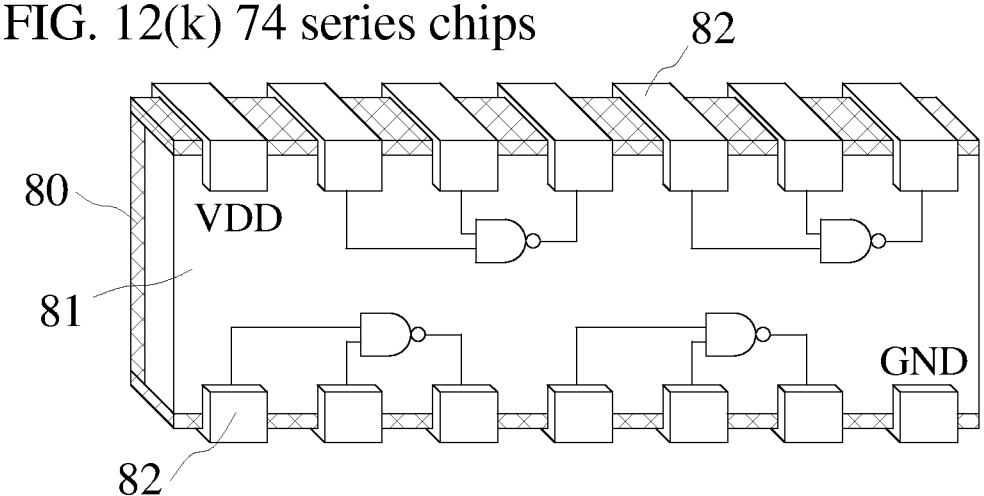

AREA EFFICIENT THROUGH-HOLE CONNECTIONS

This application is a continuation-in-part application of previous patent application with a Ser. No. 13/013,923, with a title "Area Efficient Through-Hole Connections", and filed by the applicant of this invention on Jan. 26, 2011.

BACKGROUND OF THE INVENTION

The present invention relates to methods and structures for reducing the area of semiconductor devices, and more particularly to methods and structures developed to improve area efficiency of semiconductor devices using through-hole connections.

Semiconductor electrical diodes are commonly used for rectifying circuits and for electrostatic discharge (ESD) protections. By definition, an electrical diode is a two-terminal rectifying semiconductor device used for rectifying or for ESD protection. Examples of electrical diodes include P-N junction electrical diodes, Schottky diodes, and breakdown diodes such as transient-voltage-suppression (TVS) electrical diodes, avalanche diodes, or Zener diodes. Optical devices such as solar cells, optical or infrared sensors, and light emitting diodes (LED) are not considered electrical diodes because their major functions are optical instead of electrical. FIG. 1(a) shows a schematic symbol of a P-N junction electrical diode or a Schottky diode; FIG. 1(b) shows a schematic symbol for a breakdown diode. One of the methods to make a break down diode is to increase the doping density of junction diodes. Another common method is to connect the base and emitter of a bipolar junction transistor (BJ) as shown in FIG. 1(f). Sometimes a resistor (Rbe) is placed between the base and emitter of the bipolar transistor (BJ) as shown in FIG. 1(f). Due to transistor snap back mechanisms, the devices in FIGS. 1(f, g) can function as equivalent circuits of breakdown diodes. The same symbol in FIG. 1(b) is used to represent TVS diodes, avalanche diodes, Zener diodes, bipolar transistors with shorted emitter/base, or other types of diodes that are designed to break down safely at pre-defined ranges of reverse biased voltages; these diodes are called "breakdown diodes" in this patent application. FIG. 1(c) shows an exemplary electrical diode circuit that is a rectifier using 4 electrical diodes.

Electrostatic discharge (ESD) is the sudden and momentary electric current that flows between two objects at different electrical potentials caused by direct contact or induced by an electrostatic field. ESD is a serious issue in solid state electronics, such as integrated circuits (IC). State of the art integrated circuits comprise high performance components with dimensions measured in nanometers (nm). Such high sensitive circuit components are not designed to survive ESD attacks. They are typically isolated from external connections to avoid ESD damage. IC input and/or output (I/O) circuits that are exposed to external environments are typically thick gate, long channel, low performance devices manufactured by processes different than those for high performance core circuits. In addition, on-chip ESD protection circuits such as snap-back transistors and electrical diodes are used to protect I/O circuits from ESD attacks. Circuits designed to survive ESD attacks and circuits designed for performance have conflicting requirements. The super-fine precision of advanced IC technology makes ESD protection more difficult. For example, the nano-meter contacts and vias used in advanced IC technologies often become the weak spots during ESD attacks. To build ESD tolerant components, additional manufacture steps (ESD implant, silicide block, thick gate transistors, . . . ) are required to support ESD tolerant circuits. Therefore, on-chip ESD protection circuits occupy significant areas, require additional manufacture steps, and cause performance problems. It is therefore highly desirable to provide ESD protection chips external to integrated circuit chips in order to replace or to simplify on-chip ESD protection circuits.

By definition, a "chip" is a packaged semiconductor device that is ready for board level assembly. Therefore, a chip comprises semiconductor devices as well as conductor leads and protection materials packaged around the semiconductor devices. A die without packaging is therefore not a chip. By definition, "external electrostatic discharge (ESD) protection circuits" are ESD protection circuits that are produced to protect circuits that are external to the chip that comprises the ESD protection circuits.

Traditional ESD protection devices include snap-back transistors and electrical diodes. Electrical diodes used for ESD protection devices are used as examples of preferred embodiments in this patent application. External ESD protection chips have been developed using electrical diodes as the major protection components. For example, Texas Instruments (TI) TPD4E001 is an external ESD protection chip that can protect 4 I/O signals. FIG. 1(d) shows a schematic diagram for TI TPD4E001. This device has 4 I/O pins (IO1-IO4), one power supply pin (VDD) and one ground pin (VSS). The first I/O pin (IO1) is connected to two electrical diodes (DD1, DS1); electrical diode DD1 is connected to power supply pin (VDD), and electrical diode DS1 is connected to the ground pin (VSS), as shown in FIG. 1(d). Similarly, the other three I/O pins (IO2-IO4) are connected to electrical diodes (DD2-DD4) that are connected to the power supply pin (VDD) and electrical diodes (DS2-DD4) that are connected to the ground pin (VSS). A breakdown diode (ZD1) is connected between VDD and VSS, as shown in FIG. 1(d). At normal operation conditions, all the electrical diodes (DD1-DD4, DS1-DS4, ZD1) are under reverse biased conditions with high impedances. If a negative charge is placed on IO1 during ESD attack, DS1 is forward biased and provides a safe path to discharge to ground. If a positive charge is placed on IO1 during ESD attack, DD1 is forward biased and ZD1 breakdown, which provides safe paths to discharge to VDD and/or ground. The protection mechanisms are similar for other I/O pins (IO2-IO4).

ESD protection electrical diodes also can be integrated with other types of circuits. For example, Texas Instruments SLLS876 comprises 6 channels of ESD protection circuits integrated with electromagnetic interference (EMI) filters in one chip. FIG. 1(e) shows a schematic diagram for one channel of the TI SLLS876 EMI/ESD protection chip. The channel input (Ch_In) of the device is connected to a breakdown diode (ZD41), a capacitor (C41) and a resistor (R41), while the channel output (Ch_Out) is connected to another breakdown diode (ZD42), another capacitor (C42), and the other terminal of R41. The other terminals of ZD41, C41, C42, ZD42 are connected to ground, as shown in FIG. 1(e). The resistor (R41) and the two capacitors (C41, C42) form an EMI filter. "Pi" filter is used in this example while "T" filter is also commonly used for this application. Sometimes, the parasitic capacitors of the diodes (ZD41, ZD42) are used to serve the functions of the capacitors (C41, C42) of the EMI filters. The breakdown diodes (ZD41, ZD42) provide ESD protections to circuits connected to Ch_In and Ch_Out. If a negative charge is placed on Ch_In during ESD attack, ZD41 is forward biased and it provides a safe path to discharge to ground. If a positive charge is placed on Ch_In during ESD attack, ZD41 provides a safe path to discharge to ground using the breakdown mechanism of the breakdown diode. If a negative charge is placed on Ch_Out during an ESD attack, ZD42 is forward biased and it provides a safe path to discharge to ground. If a positive charge is placed on Ch_Out during an ESD attack, ZD42 provides a safe path to discharge to ground using the breakdown mechanism of the breakdown diode.

These and other external ESD protection devices are typically manufactured by IC technologies that are optimized for ESD protection circuits. FIGS. 2(a-e) are simplified symbolic diagrams illustrating exemplary manufacture steps for prior art ESD protection chips. FIG. 2(a) is a simplified view of a single-crystal semiconductor substrate (209) that comprises a plurality of dice (200). A die (200) is a repeating unit on a substrate that can be sliced to support a chip. A common example of single-crystal semiconductor substrate is silicon wafer. FIG. 2(b) shows a magnified picture of the marked area of the wafer in FIG. 2(a). In this example, the die (200) in the semiconductor substrate (209) is separated by scribe lanes (208) from other dice; and bonding pads (212) on the surface of the die provide openings for external connections. After the electrical diodes and other electrical components have been manufactured on the semiconductor substrate (209), the die (200) in the wafer is sliced along the scribe lanes (208) to serve as an individual device. FIG. 2(c) is a simplified symbolic diagram for one sliced die (200). In this example, the die (200) comprises 4 channels (210) of ESD/EMI circuits with components shown by the schematic in FIG. 1(e). A channel (210) in the die (200) comprises two bonding pads (212), two breakdown diodes (201), two capacitors (202), and one resistor (203) as illustrated in FIG. 2(c). Sometimes the capacitors (202) can be replaced by parasitic capacitors without using separated capacitor devices. For clarity, in FIG. 2(c) and in other figures, simplified symbols are used to represent structures that can be very complex. The structures of semiconductor components (222) are not discussed in detail. The bonding pads (212) provide openings on the semiconductor substrate for external connections to the circuit components (222) on the semiconductor substrate. Two ground and/or power pads (216) provide ground and/or power connections.

External ESD protection circuits are typically manufactured by IC manufacture processes on single crystal semiconductor substrates. The technologies used to manufacture external ESD circuits are optimized for ESD protections. Therefore, external ESD protection chips are typically more effective against ESD attacks than typical on-chip ESD protections. On-chip ESD protection typically can pass human body model ESD tests at 2000 volts, while external ESD protection chips typically can pass the test at higher than 16000 volts. However, the ESD protection circuit on the semiconductor die (200) in FIG. 2(c) is not ready for application; it needs conductor leads to allow board level electrical connections to the electrical components on the die. Prior art ESD protection circuits are typically placed in integrated circuit packages to provide conductor leads for external connections. For example, TI SLLS876 is placed inside a "thin dual-in-line flat" (TDFN) package. FIG. 2(d) is the top view illustrating the structures when the die (200) in FIG. 2(c) is placed into an integrated circuit package (219) to form a chip, and FIG. 2(e) shows the cross-section view of the packaged chip along the marked line in FIG. 2(d). The bonding pad (212) on the die (200) provides openings for external connections to the electrical components (222) on the single crystal semiconductor device. Bonding wires (218) connect the bonding pads (212) to metal traces (215) in the package (219). Such package level metal traces (215) are typically called "lead frames". The lead frames (215) are connected to external metal pins (214) at the edges of the package as illustrated in FIGS. 2(d, e). Ground connection (216) in this example is connected to a metal pad (216) at the bottom of the TDFN package through another bonding wire (211). Some chips may use pins to support ground connections.

Although prior art ESD protection chips have been proven to be highly effective against ESD attacks, their usage is limited. The most important reason is the area of prior art ESD chips are too large. External ESD protection chips use circuits manufactured on single crystal semiconductor substrates that are placed in IC packages. The sizes of prior art external ESD protection chips are similar to those of IC chips at equivalent I/O counts. For example, TI TPD6F002 uses a package that is 3 mm by 1.35 mm. There is typically not enough room to place such prior art external ESD chips to protect a large number of signals. For these reasons, prior art external ESD protection chips are only used for a small number of special signals, such as RF signals, or for special applications. ESD circuits are integrated into chips in order to save circuit board area for applications such as cellular phones. The capabilities of mobile devices typically are determined by the capability to pack chips into a small space. Therefore, the capability to reduce the area of external ESD protection chips is typically the most important factor in determining the value of ESD protection chips or diode chips. The electrical industry has invested tremendous efforts trying to reduce the area of ESD chips using various IC packaging technologies. The present invention discloses effective methods and structures to reduce areas of ESD protection chips or electrical diode chips by printing technologies.

Prior art external ESD protection chips use single crystal diode circuits that are placed in IC packages. The costs of prior art external ESD protection chips are therefore similar to those of IC chips at equivalent I/O counts. It is typically more cost effective to use on-chip ESD protections than to use prior art external ESD protection chips. The bonding wires and the lead frames in the integrated circuit packages typically introduce parasitic inductance around 2 nh and parasitic capacitance around 2 pf—values that are large enough to cause problems for high performance signals. It is therefore highly desirable to reduce the costs and the parasitic impedances of external ESD protection chips.

One prior art method to reduce the size and the parasitic impedance of external ESD protection chips is to use ball grid array (BGA) packages. For example, TI places two breakdown diodes into one BGA package that is 1.2 mm by 1.2 mm in area. FIG. 2(f) shows exemplary cross section structures when the die (200) in FIG. 2(c) is placed in a BGA package (240). In this example, the semiconductor die (200) is placed upside down on top of a BGA substrate (242). To reduce parasitic impedance, bumping balls (245), instead of bonding wires, are used to form connections between bonding pads (212) on the die (200) and metal traces (246) on the BGA substrate (242). The metal traces (246) are connected to soldering balls (249) through vias (247) and pads (248) on the BGA substrate (242). BGA packages are typically smaller than TDFN packages, but the cost of BGA packages are typically higher than TDFN packages of the same I/O count. Sometimes bonding wires are used to form connections between the bonding pads (212) and the metal traces (246) at a lower cost but higher parasitic impedances.

The above examples show that formation of conductor leads is the major source of area, cost, and performance problems for prior art external ESD protection chips or electrical diode chips. "Conductor leads" of a chip, defined in this patent application, are the electrical conductors in a packaged chip that provide electrical connections from internal circuits to board level circuitry external to the chip. For the prior art example in FIGS. 2(d, e), a "conductor lead" comprises bonding wire (218), lead frame (215), and package pin (214). For the prior art example in FIG. 2(f), a "conductor lead" comprises a bumping ball (245), metal trace (246), via (247), pad (248), and soldering ball (249). Such complex conductor leads on integrated circuit packages typically result in large size, high cost, and high parasitic impedance. It is therefore desirable to use other methods to provide packaging for ESD protection chips or electrical diode chips.

Technologies similar to the printing technologies used for publication have been developed to manufacture passive electrical circuit components such as resistors, capacitors, or resistor-capacitor (RC) filters. FIGS. 8(a-e) are simplified diagrams illustrating examples of various electrical printing technologies. FIG. 8(a) shows a printing method where a roller (893) with a print pattern (894) rolls over a substrate (891). The substrate can be ceramic, metal, plastic, paper, semiconductor, or many other types of materials. Inks selectively attached on the roller (893) are printed on the substrate with the desired pattern (895) as illustrated on FIG. 8(b). Blocks, plates, films, or other types of printing media can also be used for printing in place of rollers. Besides rolling, printing media can have various motions. For example, print by "stamping" typically means print by linear motions of blocks, plates, or films. Electrical printing technologies are similar in principle to publication printing technologies except that the ink used by electrical printing comprises electrical materials so that dried-ink would function as conductors, insulators, resistors, dielectrics, or semiconductors. Electrical devices can be manufactured at low cost by printing layer(s) of electrical materials with desired patterns.

There are other variations of electrical printing technologies, such as screen printing and inkjet printing. Screen printing is a printing technique that uses a woven mesh to support an ink-blocking stencil. The attached stencil forms open areas of mesh that transfer ink as an image onto a substrate. When screen printing is used to manufacture electrical circuit components, materials with different electrical properties, such as conductors, insulators, resistors, or semiconductors, are mixed with solutions as ink and patterned onto a substrate by screen printing. FIGS. 8(c, d) are simplified symbolic illustrations of screen printing technologies. A stencil (802) with the desired printing pattern (804) is placed on top of a substrate (801) as illustrated in FIG. 8(c). Typical materials for stencils include woven meshes of silk or steel. The substrate can be ceramic, metal, plastic, paper, semiconductor, or many other types of materials. A roller (803) or other mechanism presses ink through the printing pattern (804). After the stencil (802) is removed, a patterned desired material (805) is printed on the substrate (801) as illustrated in FIG. 8(d). Typically, heating and drying processes are applied to solidify the printed materials. The final materials patterned by screen printing or other types of printing processes are typically "dried-ink" that was in liquid or paste form when printed and became solid form after heat treatment or other types of drying processes. Multiple layers of dried-ink materials can be printed on the same substrate using similar processes to form electrical components.

FIG. 8(e) is a simplified diagram illustrating an inkjet printing method. In this example, a printer head (812) injects electrical materials as ink (813) onto a substrate (811) to form a desired pattern (815). The locations and shapes of the printed patterns are controlled using a mechanism similar to those in computer inkjet printers.

FIGS. 8(f-h) illustrate a printing method called "dipping". Most printing technologies involve application of ink on flat substrates. Dipping is a variation of printing technology that dip printing objects into ink. FIG. 8(f) illustrates the situation when ink lines (831) in liquid or paste form are printed on a flat surface, and a substrate (830) is moved toward the ink lines (831). The substrate (830) is stopped when it is dipped into the ink lines (831), as illustrated in FIG. 8(g). When the substrate (830) is removed from the ink lines (831), ink with the desired pattern (833) stick to the edges of the substrate (830) as illustrated in FIG. 8(h). After heat treatments, dried-ink materials in solid form are deposited and patterned on the edges of the substrate (830). The shape of printed structure depends on the ink pattern as well as the shape of the substrate. Sometimes the ink is spread across the whole surface without shape. Sometimes the ink pattern can be very complex. FIGS. 8(f-h) are symbolic diagrams illustrating simplified views of dipping of a single substrate. In practice, a large number of substrates are dipped into ink of different patterns. Dipping is a printing technology that is typically used to build conductor leads at the side-wall of chips. The present invention also applies dipping for insulators. Besides dipping into inks, it is also applicable to dip into other types of materials such as photo-resist materials.

For clarity, simplified symbolic figures are used to describe complex technology, while details such as material processing, temperature control and precision control are not included in our discussions. Printing, by definition, comprises three basic steps: (1) preparing ink that comprises desired electrical material(s) mixed with liquid solution(s) or paste(s); (2) patterning the ink in liquid or paste forms on the surface of desired object; and (3) drying the ink to remove solution in the ink to form desired dried-ink materials as solid electrical materials. Examples of electrical printing technologies include screen printing, inject printing, stamping, flexography, gravure, dipping, or offset printing.

Resistor chips in surface mount packages have been manufactured by printing technologies. FIGS. 3(a-f) are simplified illustrations for the manufacturing of surface mount resistor chips using printing technologies. The first step is typically to print patterned conductors (301) on a substrate (300) as illustrated in FIG. 3(a). Alumina is a common substrate material. Silver pastes are common materials used as the ink for conductors. Heat treatments at a temperature and timing profile specified by manufacturers are typically applied after each printing process to transform the conductor inks into dried-ink electrical conductors. The next step is to print resistor films (302) between the conductors (301) as illustrated in FIG. 3(b). Silver and Palladium alloy is an example of the material used for printed resistors. The geometry and the sheet resistance of the resistor films (302) determine the resistance values. After heat treatments, a protective insulator layer (303) is typically printed to cover the resistor layer (302) as illustrated in FIG. 3(c). Epoxy resin is a typical material used for the protective insulator layer. The next step is to print an electrode layer (304) to cover the exposed conductor plates (301) as illustrated in FIG. 3(d). Nickel is a common material for the electrode layer (304). After electrical components have been printed, the substrate (300) is sliced into individual chips (310) as illustrated in FIG. 3(e). In this example, the chip (310) in FIG. 3(e) comprises the circuits in the area marked by dark lines on the substrate (300) in FIG. 3(d). Sometimes, a side-wall conductor (305) is printed by stamping or deposited by dipping after slicing. FIG. 3(f) shows simplified cross section structures along the line marked in FIG. 3(e). FIG. 3(g) shows three dimensional external views for printed chips such as the resistor chip in FIG. 3(e). For this example, each resistor chip (310) comprises 8 edge conductor leads (365) to support 4 resistors. An "edge conductor lead", by definition, is a conductor lead deposited on and connected to the edge(s) of the surface(s) of a surface mount package chip. The conductor leads illustrated in FIGS. 3(q-k) and FIGS. 4(g, h) are examples of edge conductor leads. The conductor leads shown in FIG. 2(f) or FIG. 5(c) are not "edge conductor leads" because they are placed in the middle of the chip without extending to the edge(s) of the chip. Using edge conductor leads typically leads to smaller chip sizes and excellent mechanical properties after soldering on printed circuit boards (PCB). The edge conductor leads (365) that provide board level I/O connections to the resistor chip (310) comprise conductors (304, 305, 301) that directly contact electrical components in the chip; no bonding wires, lead frames, or pins are used. The parasitic inductance of such connections is typically much lower than the parasitic inductance of the package connections on integrated circuit packages. A resistor chip typically has 1 to 8 resistors. FIG. 3(h) shows an exemplary three dimensional view of a two-I/O printed chip such as a resistor chip with one resistor. The size of an 8-I/O chip is roughly 4 times the size of a 2-I/O chip. There are various designs of printed circuit chips. Sometimes, side-wall conductors (375) are printed by stamping or deposited by dipping to extend the edge conductor leads, as illustrated by the chips (370, 378) in FIGS. 3(l, j). Sometimes, grooves (385) are added between edge conductor leads, as illustrated by the chip (380) in FIG. 3(k). Sometimes, the side-wall conductors are deposited in the grooves instead of between grooves. Chips with similar structures are also used for other electrical components such as resistor-capacitor (RC) filters.

The electrical industry is using a widely accepted naming convention that is related to the dimensions of resistor chips or other printed circuit chips. This naming convention uses two digit numbers related to the length (RL1, RL) of the chip followed by two or three digits related to the width or I/O pitch (RW1, RW) of the chip. For example, if the chip (368) in FIG. 3(h) is a standard "0402" resistor chip, then the length of the chip (RL1) should be about 0.04 inches, while the width of the chip (RW1) should be about 0.02 inches. The thickness (RH1) of the chip is relatively less important so it is typically not specified in the naming convention. For chips with more than two I/O edge conductor leads, the naming of the chips are typically related to the length (RL) between the ends of the opposite pair of edge conductor leads and the pitch between nearby edge conductor leads (RW), as illustrated in FIG. 3(g). For example, if the chip (310) in FIG. 3(g) is a standard 0402 resistor chip, then the length (RL) between the ends of the opposite pair of edge conductor leads should be about 0.04 inches, while the pitch between nearby edge conductor leads (RW) should be about 0.02 inches. The thickness (RH) of the chip is relatively less important so it is not specified in the naming convention. Table 1 lists commonly available resistor chips and their dimensions. For example, if the chip (368) in FIG. 3(h) is a standard "0402" resistor chip, then the length of the chip (RL1) should be about 0.04 inches, while the width of the chip (RW1) should be about 0.02 inches. If the chip (310) in FIG. 3(g) is a standard 0402 resistor chip, then the length (RL) between the ends of opposite pair of edge conductor leads should be about 0.04 inches, while the pitch between nearby edge conductor leads (RW) should be about 0.02 inches. For another example, if the chip (368) in FIG. 3(h) is a standard "0201" resistor chip, then the length of the chip (RL1) should be about 0.024 inches, while the width of the chip (RW1) should be about 0.012 inches. If the chip (310) in FIG. 3(g) is a standard 0201 resistor chip, then the length (RL) between the ends of opposite pair of edge conductor leads should be about 0.024 inches, while the pitch between nearby edge conductor leads (RW) should be about 0.016 inches. For another example, if the chip (368) in FIG. 3(h) is a standard "01005" chip, then the length of the chip (RL1) should be about 0.016 inches, while the width of the chip (RW1) should be about 0.008 inches. This industry naming standard has been widely used to describe the dimensions of not only resistor chips but also other types of printed electrical circuits such as RC components. This patent application will follow this industry standard to describe dimensions of ESD chips or electrical diode chips with printed edge conductor leads.

TABLE 1 standard dimensions of surface mount resistor chips

| name | Distance between opposite edge conductor leads in inches | width in inches | Pitch in inches |
|---|---|---|---|
| 0603 | 0.063 | 0.031 | 0.031 |
| 0402 | 0.04 | 0.02 | 0.02 |
| 0201 | 0.024 | 0.012 | 0.016 |
| 01005 | 0.016 | 0.008 | 0.012 |

In the electrical industry, packages shown in the above examples are commonly called "surface mount rectangular passive component" (SMRPC) packages because they are typically used for surface mount passive components such as resistor chips, capacitor chips, or resistor-capacitor (RC) chips. SMRPC packages are typically significantly smaller and cheaper than integrated circuit packages or electrical diode packages of equivalent I/O count. The major reason is that the conductor leads for SMRPC packages are typically edge conductor leads. Printing technologies, such as screen printing, inject printing, stamping, flexography, gravure, dipping, or offset printing, have been applied to print passive electrical components at low costs. The costs of printed circuits are typically significantly lower than the costs of circuits using integrated circuit packages. The areas of printed chips are typically smaller than the areas of packaged IC chips. Printing technologies not only can achieve smaller size and lower cost but also can reduce parasitic inductance. Edge conduct leads of printed circuit chips are typically directly printed on the substrates; there is no need to use lead frames and bonding wires. Therefore, the parasitic inductances of printed edge conductor leads are typically significantly lower than those of integrated circuit packages.

In the art of electrical designs, electrical printing technologies are often called "thick film technologies", in contrast to "thin film technologies" commonly used for integrated circuits. That is because the thicknesses of printed films are typically thicker than 10 micrometers while the thicknesses of "thin films" commonly used in integrated circuits are typically thinner than 2 micrometers. The resolutions of electrical printing technologies are typically measured in tens of micrometers. Such resolution is certainly not enough to support the manufacture of advanced integrated circuits, but it is enough to pattern conductor leads of external ESD protection chips or rectifying diodes.

This patent application is a continuation-in-part application of previous patent applications that focused on printed conductor leads, side-wall conductor leads, and side-wall insulators for chip-scale packages. While developing manufacture processes for side-wall insulators, it was realized that derivatives of the inventions can be used to build through-hole connections. The scope of this patent application is therefore extended.

A photo-resist, by definition, is a radiation-sensitive material used in lithography processes to form patterned structures on a substrate. Photo-resist materials may be patterned by different types of radiations such as visible light, ultra-violet light, X-ray, electron beam, or ion beam. Photo-resist materials are classified into two groups: positive resists and negative resists. A positive resist is a type of photo-resist in which the portion of the photo-resist that is exposed to radiation becomes soluble to the photo-resist developer. The portion of the positive photo-resist that is unexposed remains insoluble to the photo-resist developer. A negative resist is a type of photo-resist in which the portion of the photo-resist that is exposed to radiation becomes insoluble to the photo-resist developer. The unexposed portion of the negative photo-resist can be dissolved by the photo-resist developer. The terminology "Developed photo-resist materials" used in this patent application, by definition, are the photo-resist materials that are insoluble to the photo-resist developer and remain on the substrate after the developing procedures. For a positive photo-resist, the "developed photo-resist materials" are the photo-resist materials unexposed to radiation. For a negative photo-resist, the "developed photo-resist materials" are the photo-resist materials exposed to radiation.

In this patent application, a through-hole, by definition, is an opening in a semiconductor substrate that extends from the front surface of the semiconductor substrate all the way to the back surface of the semiconductor substrate. The opening of a through-hole maybe filled with other materials after it is opened. The front surface or the front side of a substrate is the surface built with electrical devices such as integrated circuits, transistors, resistors, and/or capacitors; the back surface or the back side of a substrate is opposite to the front surface. If electrical devices are manufactured on both sides of the semiconductor substrate, then the surface with more complex electrical devices is considered as the front surface.

FIGS. 14(a-l) are simplified illustrations of conventional manufacture procedures for through-hole connections. FIG. 14(a) shows the cross-section view of a silicon substrate. For clarity, electrical components build on the substrate are not draw in our figures. FIG. 14(b) shows the cross-section view and FIG. 14(c) shows the top view when through-holes (121) are opened in the substrate (120). FIG. 14(d) shows symbolic cross-section view when insulator materials (122) are applied on the substrate (120) to fill the through-holes (121) and cover both surfaces. FIGS. 14(e-j) illustrate conventional methods for opening through-holes (127) in the insulator materials (122) using lithograph technology. Photo-resist materials (123) are deposited on the surface, as shown in FIG. 14(e), and selectively exposed to radiation (125) with patterns defined by a photo mask (124), as illustrated in FIG. 14(f). For the example in FIG. 14(f), the photo-resist is a positive photo-resist so that the areas (126) exposed to radiation become soluble to the photo-resist developer. Those exposed photo-resist materials (126) are removed after the developing procedures, as illustrated in FIG. 14(g). The remaining photo-resist materials (123) are used as etching mask so that through-holes (127) in the insulator materials (122) can be etched with accuracy, as illustrated in FIG. 14(h). The developed photo-resist materials (123) are washed away after the through-holes (127) has been opened, as illustrated in the cross section view in FIG. 14(i) and the top view in FIG. 14(j). Using similar methods, conductor films (128) can be deposited to form through-hole conductor leads, as illustrated by the cross-section view in FIG. 14(k) and the top view in FIG. 14(l).

Using conventional methods, making electrical connections using through-holes is difficult. Existing methods typically require large distances between through holes, limiting the number of through-holes per die. Conventional through-hole connections typically have poor controls in the parasitic impedances, limiting their applications for high speed applications. Trezza in U.S. Pat. No. 7,157,372 disclosed a method that fills a semiconductor through-hole with insulator, then etch a through-hole in the insulator as a method to control the impedance and to reduce the size of through-hole connections. One of the preferred embodiments of the present invention uses developed photo-resist materials to form the side walls of the through-holes. The preferred embodiments of the present invention require less manufacture steps and provide better controls in parasitic impedances than Trezza. Hanaoka et al. in U.S. Pat. No. 6,667,551 disclose a through-hole that has small opening at the front surface, and larger opening inside the semiconductor substrate. Both the smaller and the larger opening in Hanaoka were opened from the front surface. One of the preferred embodiments of the present invention opens a small hole from the front surface then opens a larger hole from the back surface to form a through hole by combining those two holes. The preferred embodiments of the present invention requires less processing steps and provides better control than Hanaoka et al.

SUMMARY OF THE PREFERRED EMBODIMENTS

The primary objective of our preferred embodiment is, therefore, to reduce the area of surface mount package chips that comprise active electrical devices built on silicon substrate(s). The other objective of our preferred embodiment is to provide cost effective surface mount package chips. The other objective of our preferred embodiment is to reduce the parasitic inductance on the I/O connections of surface mount package chips. The other primary objective of our preferred embodiment is to reduce area occupied by through-hole conductors. Another objective of our preferred embodiment is to provide better control on the parasitic parameters of through-hole connections. These and other objectives are achieved by using side-wall conductor leads instead of bumping methods, and/or by using holes patterned in developed photo-resist materials.

While the novel features of the invention are set forth with particularly in the appended claims, our preferred embodiments, both as to organization and content, will be better understood and appreciated, along with other objects and features thereof, from the following detailed description taken in conjunction with the drawing.

DETAILED DESCRIPTION OF THE PREFERRED EMBODIMENTS

Figure 1A:
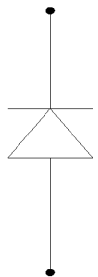
FIGS. 1(a-g) are schematic diagrams of electrical diodes and ESD protection circuits.
Figure 1B:
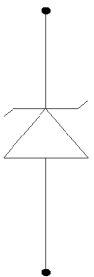
Figure 1C:
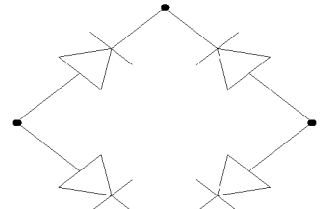
Figure 1D:
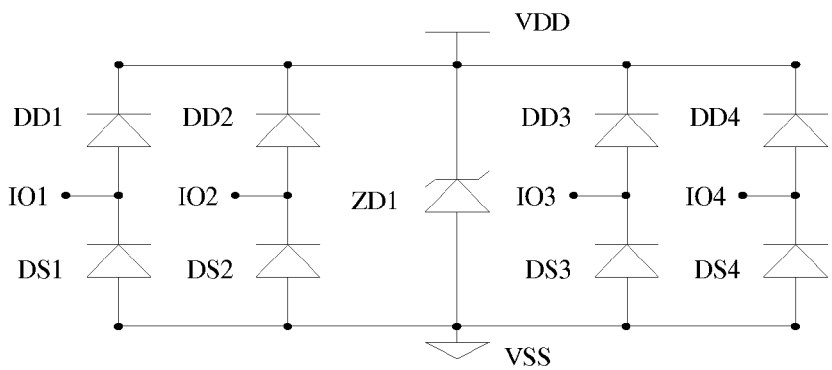
Figure 1D:
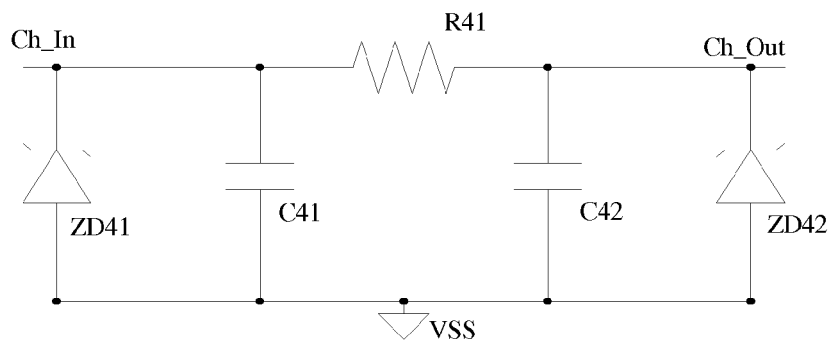
Figure 1F:
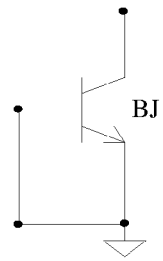
Figure 1G:
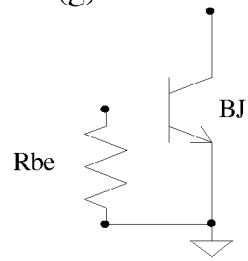
Figure 2A:
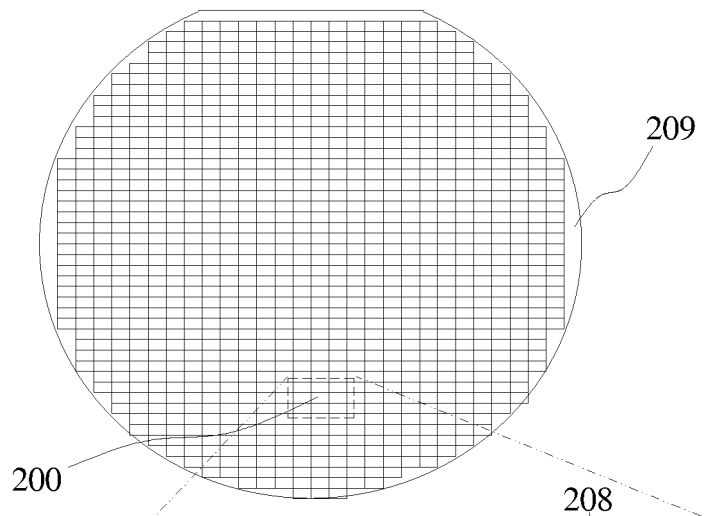
FIGS. 2(a-f) illustrate structures of a prior art ESD protection chip.
Figure 3A:
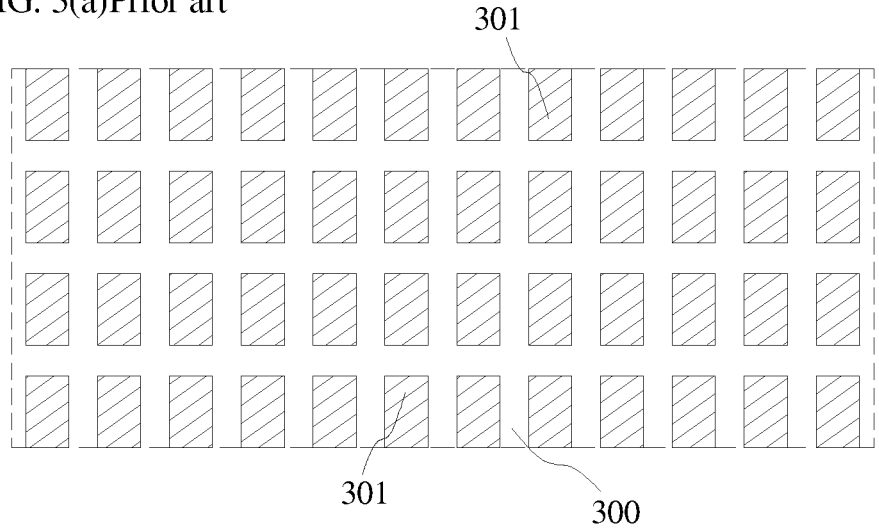
FIGS. 3(a-k) are simplified symbolic diagrams illustrating printing processes for making prior art resistor chips.
Figure 3B:
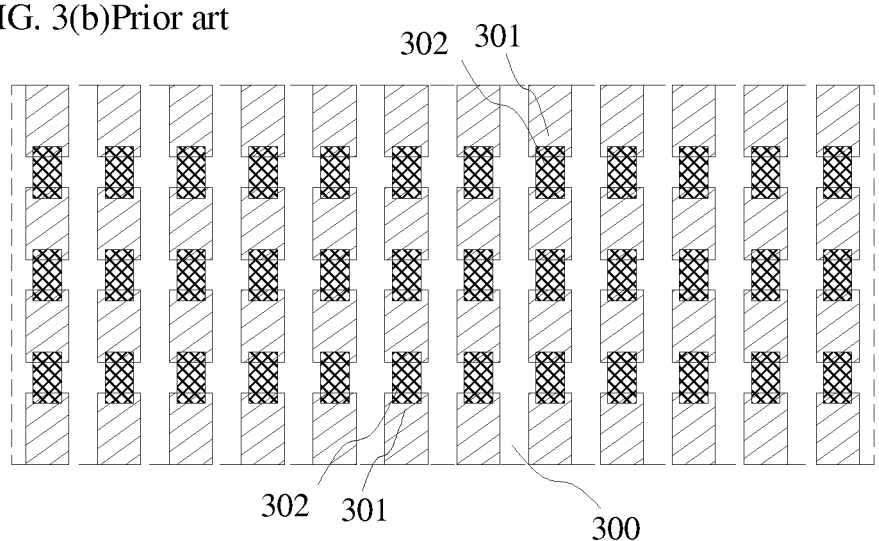
Figure 3C:
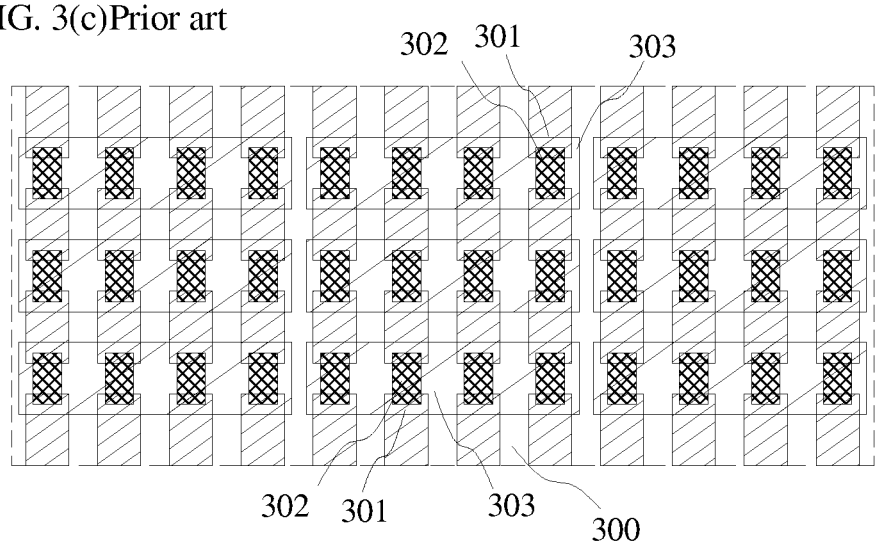
Figure 3D:
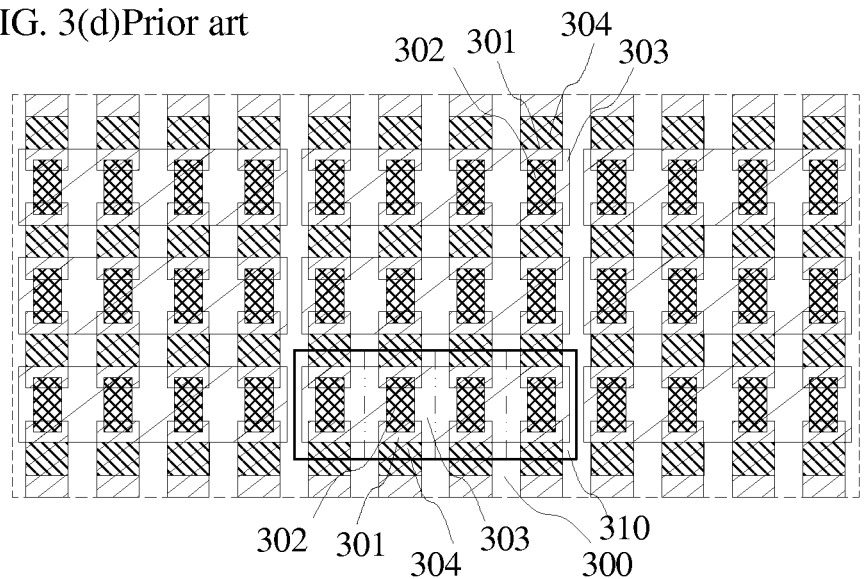
Figure 3D:
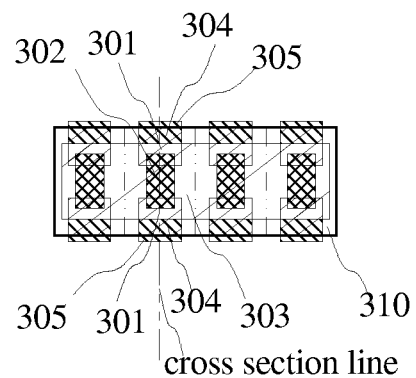
Figure 3D:
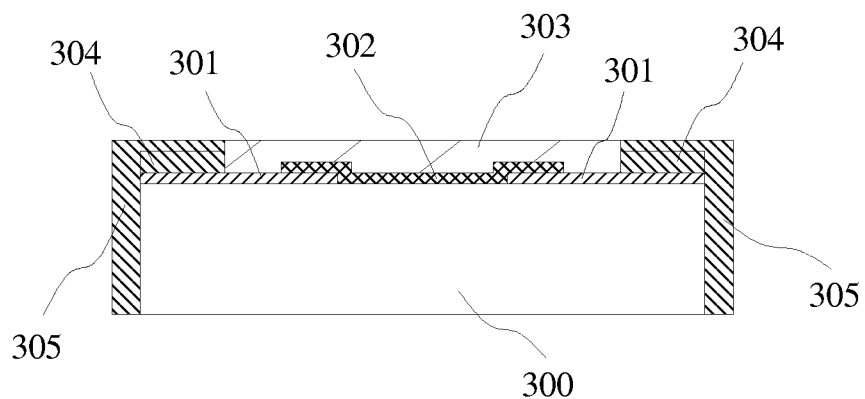
Figure 3G:
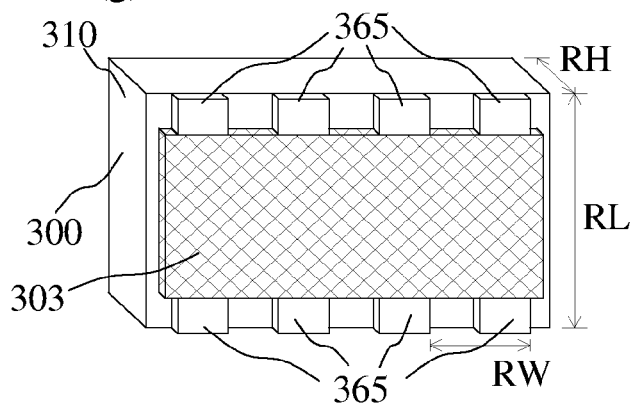
Figure 3H:
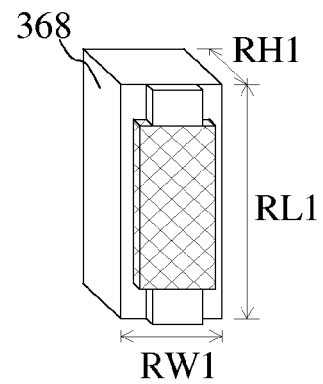
Figure 3I:
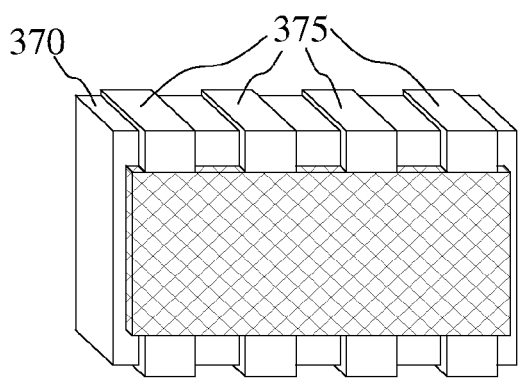
Figure 3J:
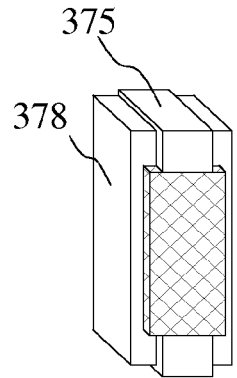
Figure 3K:
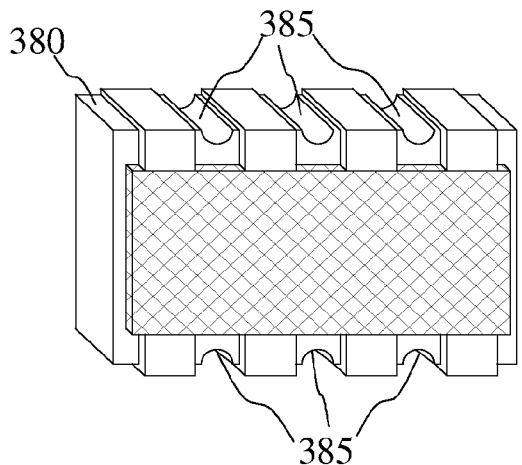
Figure 4A:
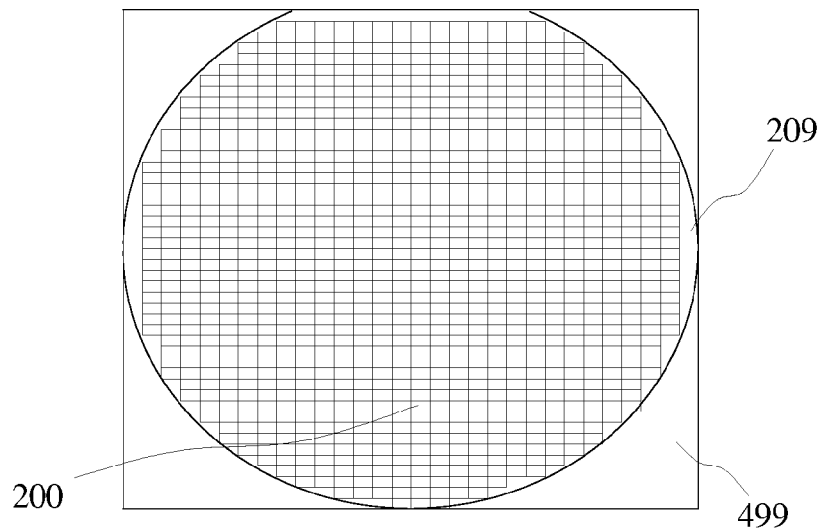
FIGS. 4(a-i) are simplified symbolic diagrams illustrating printing processes for an exemplary ESD protection chip packaged using resistor chip packaging technologies.
Figure 4B:
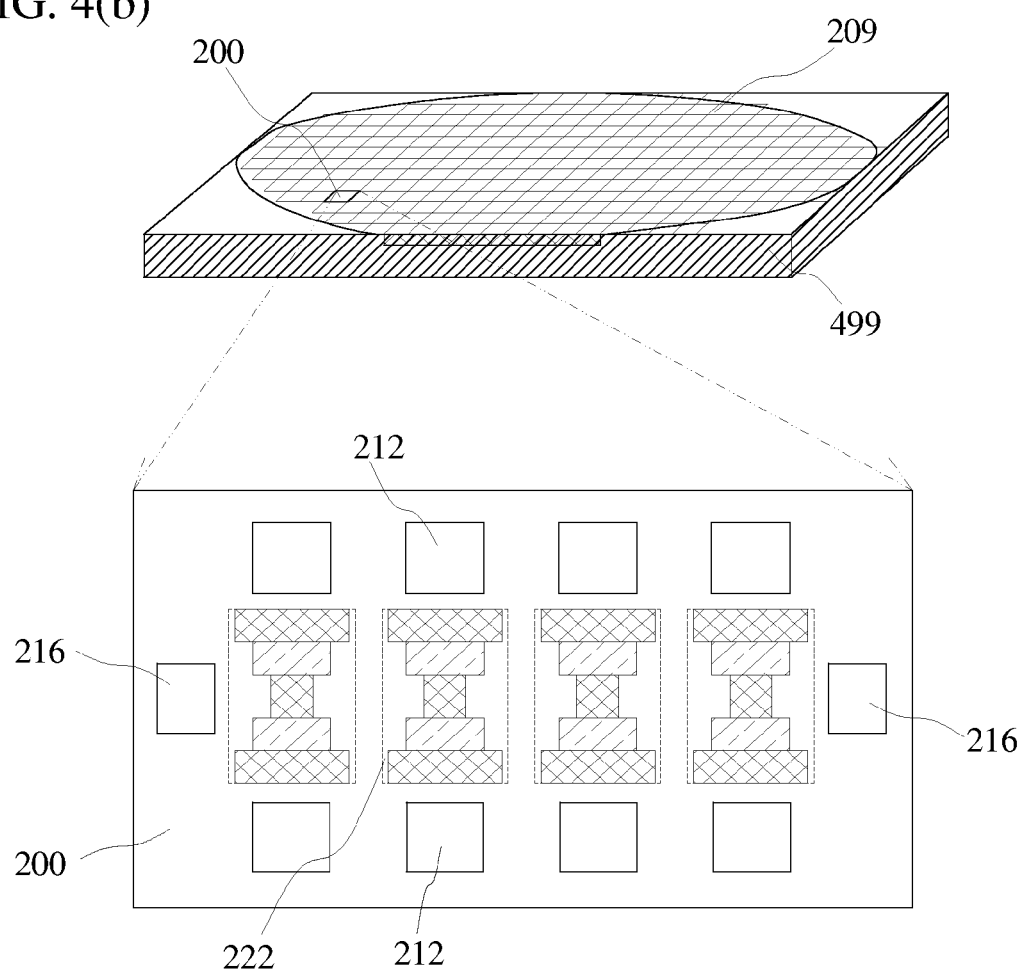
Figure 4C:
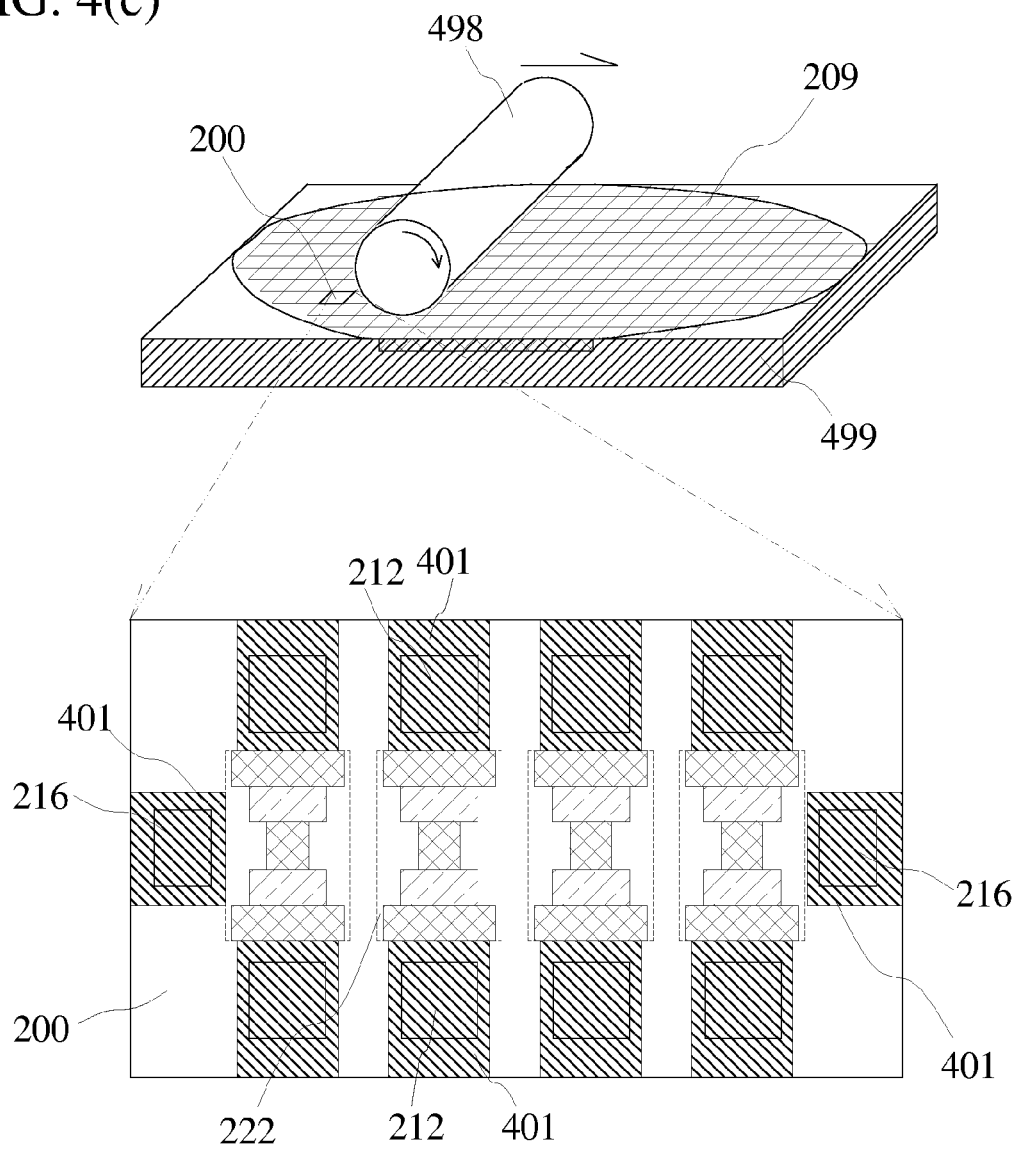
Figure 4D:
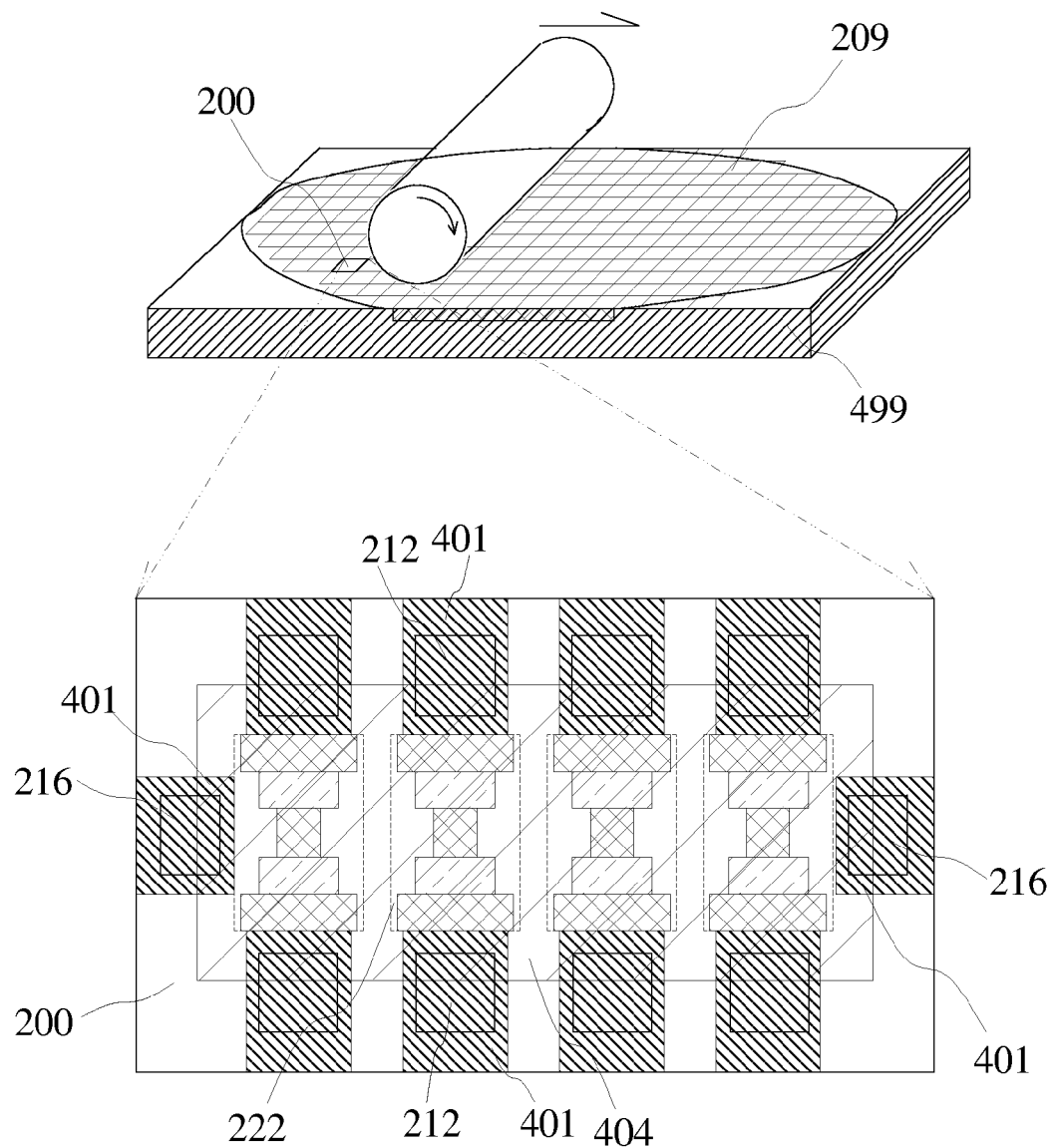
Figure 4E:
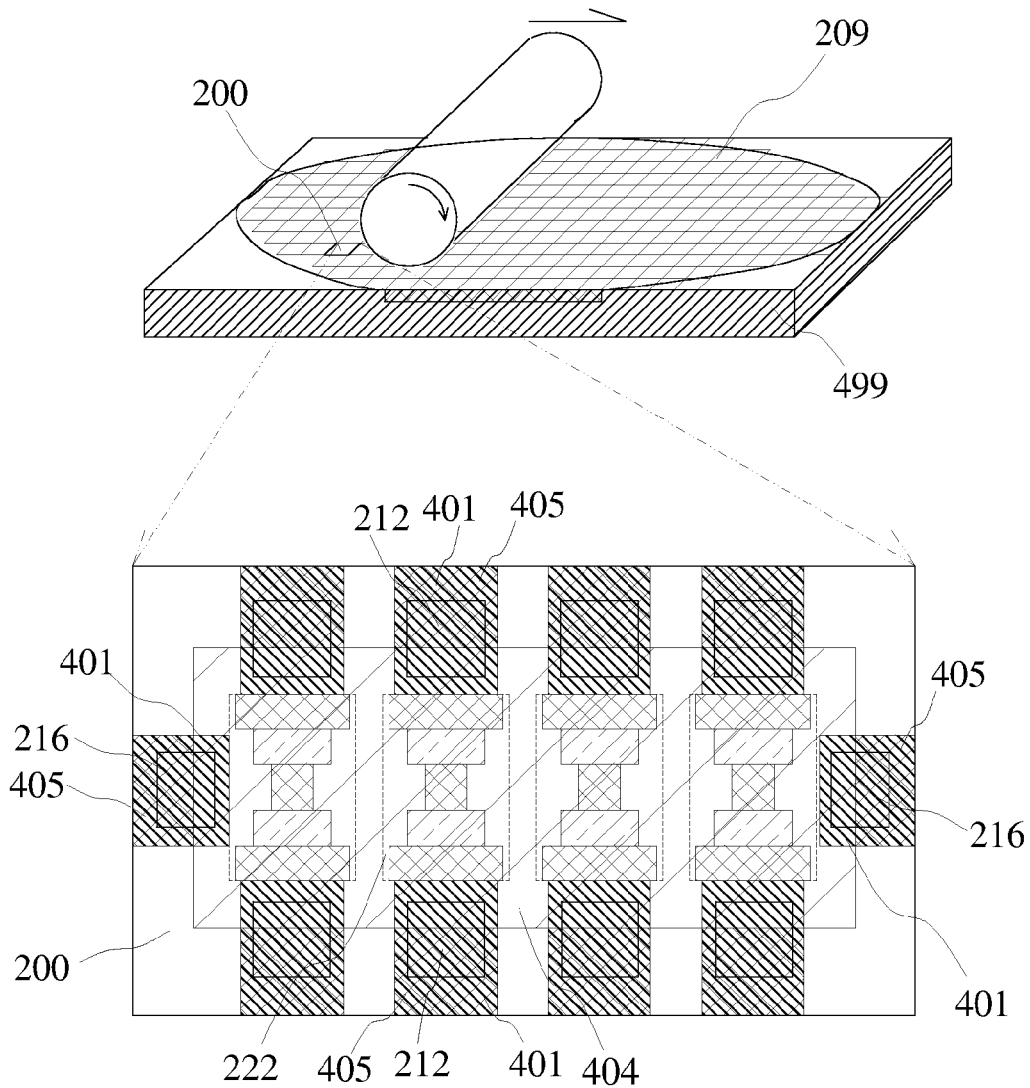
Figure 4F:
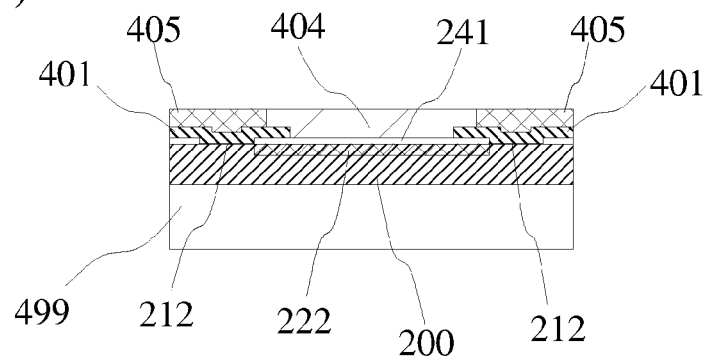

Prior art external ESD protection chips typically comprise single crystal semiconductor substrates placed in integrated circuit packages. As discussed in previous examples, packaging is typically the major source of area, cost, and performance problems for prior art external ESD protection chips, while area is typically the most important factor determining the value of ESD protection chips. FIGS. 4(a-i) show exemplary processes to reduce the area of ESD protection chips. In this example, a single crystal semiconductor wafer (209) has been manufactured in similar ways as the example shown in FIG. 2(a). Electrical components such as electrical diodes, resistors, capacitors, and pads have been manufactured on the wafer (209) in similar ways as the examples shown in FIGS. 2(a-c). The single crystal semiconductor wafer (209) is thinned down by back grinding, and molded into a rectangular substrate (499) as shown in FIG. 4(a). The materials of this molded substrate (499) can be epoxy, plastic, glass, metal, ceramic, photo-resist or other types of materials. This substrate (499) is made to provide the shape and the mechanical strength suitable for printing processes. FIG. 4(b) shows another view of the substrate (499) in FIG. 4(a) and magnified symbolic views of the structures in one die (200) on the substrate (499). In this example, this die (200) has the same structures as the die in FIG. 2(c). In the following steps, printing technologies are used to make electrical connections to the die (200) in similar ways as the resistor printing technologies illustrated in FIGS. 3(a-i). For simplicity, printed structures on one die instead of all the dice on the substrate (209) were shown in the following figures. Printing process is symbolized by a roller (498) pressing on substrate (499), while electrical printing technologies, such as screen printing, inkjet printing, stamping, flexography, gravure, dipping, offset printing, or others, are applicable for this application, so we will not specify a particular printing technology for our examples. Starting from the structures in FIG. 4(b), surface conductors (401) are patterned on the substrate to make electrical connections to the pads (212, 216), as illustrated in FIG. 4(c). These surface conductors (401) can be patterned by IC technology or printing technology. If IC technology is used, aluminum films patterned by lithography are commonly used. If printing technology is used, as illustrated in this example, silver dried-ink formed from silver pastes are common materials used for this application. It is typically desirable to introduce roughness on the semiconductor surface where the printed conductor is applied. Heat treatments at temperature and timing profiles specified by manufacturers are typically applied after each printing process to form dried-ink solid materials. It is certainly possible to use both types of technologies to form the surface conductors (401). After forming the surface conductors (401), a protective insulator layer (404) is printed to provide mechanical cover as illustrated in FIG. 4(d). Epoxy resin is a typical material used for the protective insulator layer (404). After forming the protective insulator layer (404), an electrode layer (405) is printed to cover the exposed conductor layer (401) as illustrated in FIG. 4(e). Dried-ink Nickel alloy is a common material for the electrode layer (405). The substrate (499) is then sliced into individual chips. FIG. 4(f) is a simplified symbolic cross-section view of the structures in FIG. 4(e). FIG. 4(g) shows a three dimensional external view of an ESD/EMI chip (400) using the sliced die in FIG. 4(e). In this example, a dried-ink side-wall conductor is deposited on the chip as part of the edge conductor leads (475). Such side-wall conductors are typically printed by stamping or formed by dipping. The surface conductors (401), as part of the edge conductor leads (475), provide external electrical connections from edge conductor leads (475) to internal circuits (222) in the chip. The ground and/or power connections are provided by the edge conductor leads (477, 476) at the left and right hand sides of the chip (400) in FIG. 4(g). Electroplating is commonly used to coat additional conductor layer(s) on the conductor leads for better electrical and mechanical properties. In this example, the chip (400) comprises 4 channels of ESD/EMI protection circuits. The external structures of this chip (499) are similar to the chip (370) in FIG. 3(i) except the edge conductor leads (486, 487) at the left hand and right hand sides. It is therefore possible to achieve chip areas about equal to or smaller than resistor chips of equivalent I/O counts. FIG. 4(h) shows one example of a chip (489) that comprises one channel of ESD/EMI protection circuits. This single channel chip (489) comprises edge conductor leads (485) for I/O connections and edge conductor leads (486, 487) for ground and/or power connections for circuits similar to that in FIG. 1(e). The external structures of this chip (489) are similar to the chip in FIG. 3(j) except the edge conductor leads (486, 487) at the left hand and right hand sides of the chip. Besides single channel or 4 channel chips, chips with 2, 6, 8, or other numbers of channels can be manufactured using similar methods.

Figure 2B:
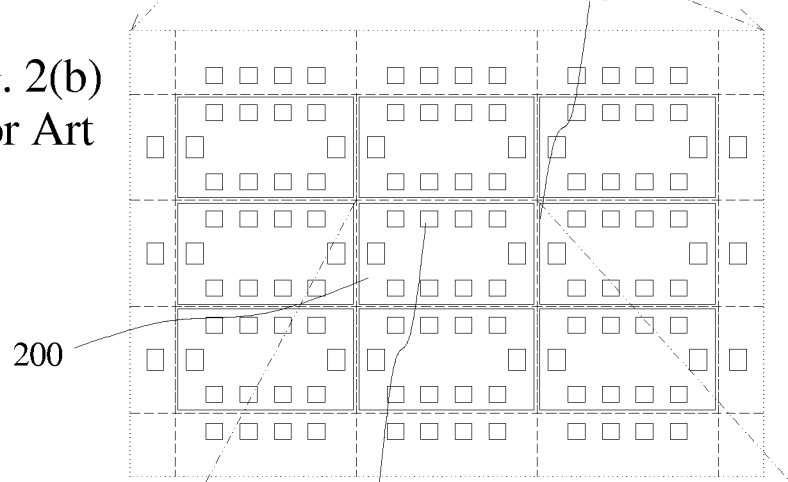
Figure 2C:
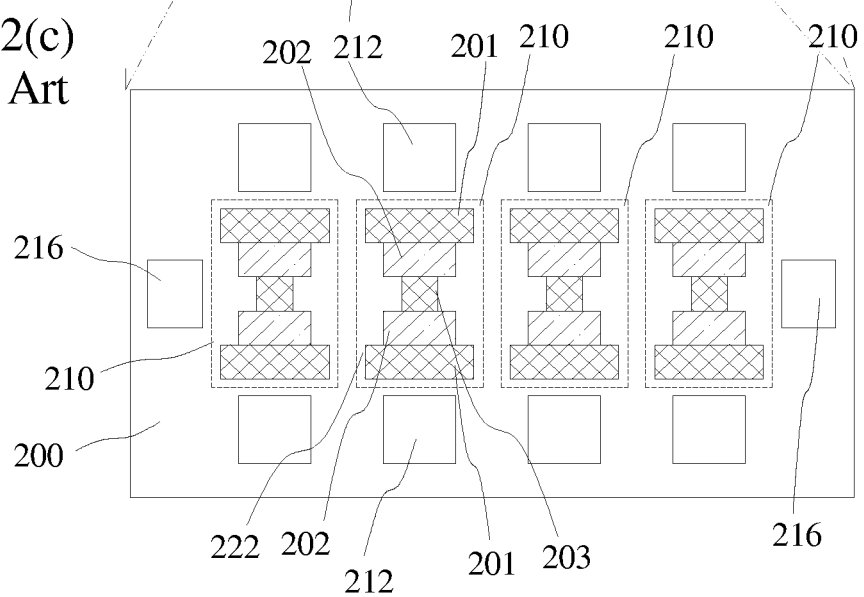

The ESD/EMI protection chip illustrated in FIGS. 4(e, f, g) can support the same functions as the prior art ESD/EMI protection chip shown in FIGS. 2(d, e). The difference is in packaging—integrated circuit packages are replaced by printed packages with edge conductor leads that comprise dried-ink conductors patterned by printing process(es). In this example, the shapes of the chips (489, 499) are designed to be similar to standard 0402 or 0201, 01005 or other SMRPC chips. Compared to the external structures of the resistor chip in FIG. 3(*i*), the only differences in external structure of this chip are the extra edge conductor leads (476, 477) at its sides. Other types of electrical diode circuits also can be manufactured in similar processes. For example, the ESD protection circuits in FIG. 1(*d*) also can be manufactured in similar processes. For the case of ESD protection circuits in FIG. 1(*d*), each I/O pin requires one conductor lead. Therefore, a chip similar to the chip (499) in FIG. 4(*g*) can protect 8 ESD I/O signals with two power/ground connections, and a chip similar to the chip (489) in FIG. 4(*i*) can protect 2 ESD I/O signals. General purpose electrical diodes or breakdown diodes shown in FIG. 1(*a, b*) also can be manufactured using similar printed conductor leads. For example, chips similar to the chips (368, 378) in FIGS. 3(*h, i*) can host one electrical diode, and chips similar to the chips (310, 370, 380) in FIGS. 3(*g, i, k*) can host 4 electrical diodes. The rectifier circuit in FIG. 1(*c*) also can be structured using similar edge conductor leads. The shape of rectifier chips can be similar to those in FIGS. 3(*g-k*) or FIG. 4(*g-h*). For example, two rectifiers can be placed in a chip similar to the chips (310, 370, 380) in FIGS. 3(*g, l, k*), and one rectifier can be placed in a chip similar to the chip (489) in FIG. 4(*h*).

The cost for a printed package is typically significantly lower than the cost for an IC package. However, the pitch between edge conductor leads is typically larger than the pitch between IC pads. In order to support edge conductor leads, the IC pad pitch may be larger than typical pad pitch, which may result in a larger IC area. Additional structures may be needed to adapt to the needs of printing technologies. The overall cost is determined by the competing factors of package cost and die cost. For ESD protection chips or electrical diode chips, using printed packaging technologies usually reduce overall cost.

As illustrated by the above examples, forming edge conductor leads using printed dried-ink conductors allows the possibility of making the areas of electrical diode chips (489, 499) to be substantially the same as or smaller than standard 0402 or 0201 or 01005 resistor chips of equivalent I/O counts. Areas smaller than the smallest resistor chips are also achievable because the dimensions of diodes can be smaller than the dimensions of resistors. It is desirable to make the dimensions of electrical diode chips (489, 499), such as the example in FIGS. 4(*g, h*), similar to the dimensions of 0402 or 0201, 01005, or other types of surface mount resistor chips. It is also desirable to make the footprints of the electrical diode chips (489, 499) compatible with the footprints of standard 0402, 0201, 01005, or other standard surface mount resistor chips. Making dimensions similar to standard resistor chips allow the flexibilities of using existing machines to assemble electrical diode chips of the present invention in similar ways as resistor chips, providing significant operational cost savings. By definition in this patent application, for a standard "0402" chip, the distance between opposite ends of edge conductor leads for I/O signals is 0.04 inches, and the pitch between nearby edge conductor leads for I/O signals is 0.02 inches. Therefore, "A chip with area substantially the same as or smaller than the area of standard 0402 surface mount resistor chips of equivalent I/O count" means the chip area is approximately equal to or smaller than [(0.04 inches times 0.02 inches) times ((number of I/O edge conductor leads on the chip) divided by 2)], that is, roughly 0.0004 inch$^2$ times the number of I/O edge conductor leads on the surface mount package chip. By definition, for a standard "0201" chip, the distance between opposite ends of edge conductor leads for I/O signals is 0.024 inches, and the pitch between nearby edge conductor leads for I/O signals is 0.016 inches. Therefore, "A chip with area substantially the same as or smaller than the area of standard 0201 surface mount resistor chips of equivalent I/O count" means the chip area is approximately equal to or smaller than [(0.024 inches times 0.016 inches) times ((number of I/O edge conductor leads on the chip) divided by 2)], that is, roughly 0.0002 inch$^2$ times the number of I/O edge conductor leads on the surface mount package chip. By definition, for a standard "01005" chip, the distance between opposite ends of edge conductor leads for I/O signals is 0.016 inches, and the pitch between nearby edge conductor leads for I/O signals is 0.012 inches. Therefore, "A chip with area substantially the same as or smaller than the area of standard 01005 surface mount resistor chips of equivalent I/O count" means the chip area is approximately equal to or smaller than [(0.016 inches times 0.012 inches) times ((number of I/O edge conductor leads on the chip) divided by 2)], that is, roughly 0.0001 inch$^2$ times the number of I/O edge conductor leads on the surface mount package chip. The "area" referred to in the above definitions is the area of the soldering surface on a surface mount chip. Ground and/or power conductor leads are not counted as I/O conductor leads. Because the edge conductor leads (475) are connected to the pads through wide conductors (403, 405, 401), the parasitic inductances of such packages are typically much lower than those of integrated circuit packages.

While specific embodiments of the invention have been illustrated and described herein, it is realized that other modifications and changes will become apparent to those skilled in the art. For example, side-wall conductors may or may not be used as part of the edge conductor leads after die slicing. The shape of the molding substrate in FIG. 4(*a*) does not have to be rectangle. It is also possible to print directly on the semiconductor wafer without using a molding substrate. Besides conductors, we also can print resistors, capacitors, or other electrical components on the substrate. Electrical components can be placed on both sides of the substrate instead of one side of the substrate. For the example in FIG. 4(*a*), the semiconductor wafer was molded before die slicing. FIG. 4(*i*) shows an example where dice (200) on the semiconductor wafer (209) have been sliced before being put into a substrate (469) for printing conductor leads. This substrate (496) can be processed in similar ways as the above example. These and other variations will be obvious upon disclosure of the present patent application. It is to be understood that there are many other possible modifications and implementations so that the scope of the invention is not limited by the specific embodiments discussed herein.

FIGS. 5(*a-c*) illustrate an example when conductor balls, instead of printed conductors are used to provide low impedance conductor leads. FIG. 5(*a*) shows the top view of a die (200) that is the same as the die in FIG. 2(*c*). After placing protection layers (503, 505) on the die (200), "under bump metallization" (UBM) layers (507) are placed on the pads (212, 216), and conductor balls (501) are placed on the UMB layers (507), as illustrated by the top view in FIG. 5(*b*) and the cross section view in FIG. 5(*c*). The technologies to place conductor balls have been developed for ball grid array (BGA) integrated circuit packages. The device illustrated in FIGS. 5(*b, c*) can support the same functions as the prior art device illustrated in FIGS. 2(*d, e*), but the costs of bumping technologies are typically significantly higher than printing technologies. The size of bumping chips is limited by the required ball-to-ball spacing (Dbb) and ball-to-edge spacing (Dbe). Present day bumping technologies typically require Dbb larger than 0.4 mm and Dbe larger than 0.08 mm. These requirements limit the capability to reduce the size of bumping chips. Using edge conductor leads instead of bumping removes those constraints. Therefore, chips of the present invention using edge conductor leads typically can achieve smaller sizes than prior art chips using bumping balls or bumping structures.

The costs of the electrical diode circuits discussed in the above examples are typically dominated by the costs of the single-crystal semiconductor devices. It is desirable to use electrical diodes manufactured on non-crystalline semiconductor for further cost reduction. Non-crystalline semiconductor materials, by definition, mean polycrystalline or amorphous semiconductor materials.

FIGS. 6(a-i) are cross-section diagrams illustrating exemplary manufacture steps for non-crystalline semiconductor electrical diodes. FIG. 6(a) shows the cross-section view of a substrate (601). This substrate can be ceramic, plastic, metal, semiconductor, or other types of materials. FIG. 6(b) shows the cross-section view when a conductor layer (602) is deposited on the substrate (601). FIG. 6(c) shows the cross-section view when two non-crystalline layers (603, 604) are deposited on top of the substrate to form electrical diodes. These two electrical diode layers (603, 604) can be a p-type non-crystalline semiconductor layer and an n-type non-crystalline semiconductor layer forming P-N junction electrical diodes. Another option is to deposit one non-crystalline semiconductor layer, then use surface doping methods to generate the second semiconductor layer of opposite doping type. Another option is to use one non-crystalline semiconductor layer (603) and one metal layer (604) to form Schottky diodes. Common examples of non-crystalline materials (603, 604) are polycrystalline silicon or amorphous silicon. FIG. 6(d) shows the cross-section view when a masking layer (605) is deposited on the electrical diode layers (602, 603). The pattern of this masking layer (605) can be defined by printing, photolithography, or other types of methods. The next step is to etch away electrical diode layers (603, 604) that are not under the masking layer (605), as illustrated in FIG. 6(e). After removing the masking layer (605), electrical diodes (610) are formed between the two electrical diode layers (603, 604) with patterns defined by the masking layer, as illustrated in FIG. 6(f). The next step is to print an insulator layer (611) with desired patterns, as illustrated in FIG. 6(g). Typical materials used as insulators for printed circuits are doped glasses. The next step is to print a conductor layer (612) to connect the electrical diode (610) and to form conductor leads, as illustrated in FIG. 6(h). A protective insulator layer (615) is printed to cover the electrical diode (610) as illustrated in FIG. 6(i). Epoxy resin is a typical material used for the protective insulator layer. An electrode layer can be printed to cover the exposed conductor layer as illustrated in previous examples. For simplicity, the above example only shows structures related to electrical diodes. Formation of other components such as resistors and capacitors are not shown in the above example. After electrical components have been printed, the substrate (601) can be sliced into individual chips in shapes similar to previous examples.

FIGS. 6(a-i) are simplified symbolic diagrams illustrating exemplary manufacture steps for non-crystalline electrical diodes. Device properties of non-crystalline electrical diodes, such as the breakdown voltage of breakdown diodes or reverse bias leakage current, are typically not as well-controlled as those of single-crystal electrical diodes. However, many applications such as ESD protection do not require accurate control on many electrical diode properties. Electrical diodes formed on non-crystalline semiconductors are often sufficient to support ESD protection circuits. The ESD protection chip made by methods similar to those in FIGS. 6(a-i) can support the same functions as prior art ESD protection chips.

While specific embodiments of the invention have been illustrated and described herein, it is realized that other modifications and changes will become apparent to those skilled in the art. For example, in the above example the electrical diodes are patterned by masked processes, while printing technologies are also applicable to pattern the electrical diodes. The electrical diode layers can be two layers deposited separately, or one deposited layer followed by surface doping processes to create the second layer. It is to be understood that there are many other possible modifications and implementations so that the scope of the invention is not limited by the specific embodiments discussed herein.

FIGS. 7(a-e) are cross-section diagrams illustrating another set of exemplary manufacture steps for making non-crystalline semiconductor electrical diodes using printing technologies. FIG. 7(a) shows the cross-section view of a substrate (701). FIG. 7(b) shows the cross-section view when a non-crystalline semiconductor layer (702) is printed on the substrate (701). FIG. 7(c) shows the cross-section view when another non-crystalline layer (703) of different doping type is printed on the substrate. The second layer (703) partially overlaps with the first layer (702) to form junction electrical diodes (710) between the overlapped areas. These two layers (702, 703) can be a p-type non-crystalline semiconductor layer and an n-type non-crystalline semiconductor layer forming P-N junction electrical diodes, or one non-crystalline semiconductor layer and one metal layer forming Schottky diodes. Common examples of non-crystalline semiconductor materials are polycrystalline silicon or amorphous silicon. The two layers also can be two different semiconductors. FIG. 7(d) shows the cross-section view when a protective insulator layer (711) is printed to cover the electrical diode (710). FIG. 7(e) shows the cross-section view when a conductor layer (712) is printed to form conductor leads and/or connections to the electrical diode (710). Using similar manufacture processes, we also can integrate resistors, capacitors, or other circuit components to work with the non-crystalline electrical diodes (710). For simplicity, the above example did not illustrate structures for other components. After electrical components have been printed, the substrate (701) is sliced into individual chips. The ESD protection chips or electrical diode chips made by processes similar to those in FIGS. 7(a-e) can support the same functions as prior art ESD protection chips or electrical diode chips except that integrated circuit packages are replaced by printed conductor leads directly connected to the electrical diode(s) and that single crystal electrical diode(s) are replaced by printed non-crystalline electrical diode(s). The ESD protection chips or electrical diode chips with printed conductor leads typically can be smaller than 0402 or 0201 or 01005 resistor chips with equivalent I/O counts. It is desirable to make the dimensions of the ESD protection chips or electrical diode chips similar to the dimensions of 0402, 0201, 01005, or other types of resistor chips. It is also desirable to make the footprint of the ESD protection chip or electrical diode chips compatible to the footprints of 0402, or 0201, or 01005, or other types of resistor chips.

While specific embodiments of the invention have been illustrated and described herein, it is realized that other modifications and changes will become apparent to those skilled in the art. It is to be understood that there are many other possible modifications and implementations so that the scope of the invention is not limited by the specific embodiments discussed herein.

Figure 9A:
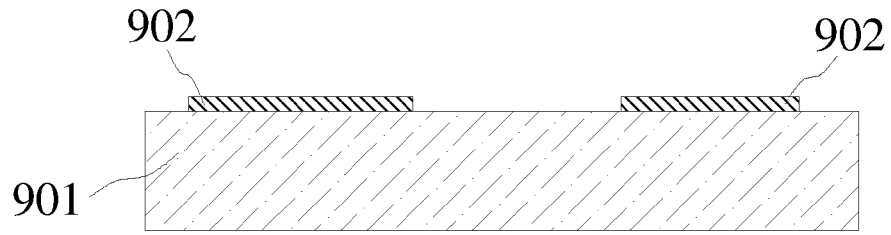
FIGS. 9(a-d) are cross-section views for non-crystalline electrical diodes printed on circuit boards.
Figure 9B:
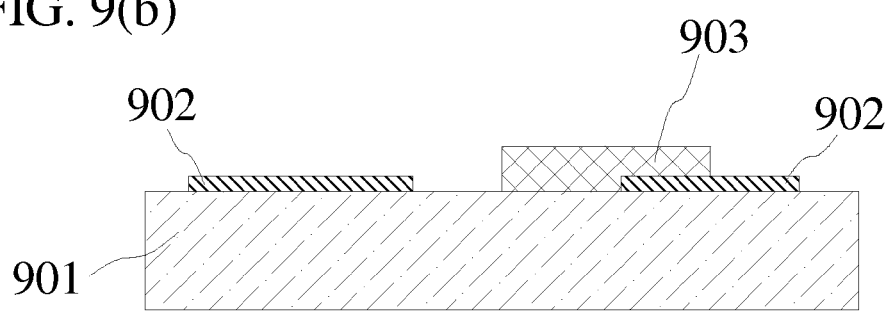
Figure 9C:
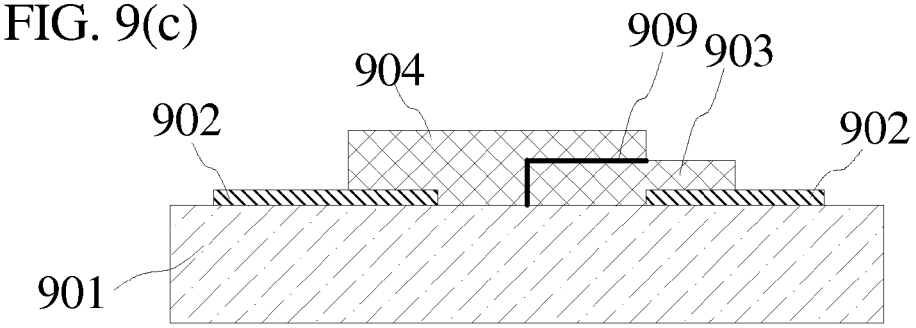
Figure 9D:
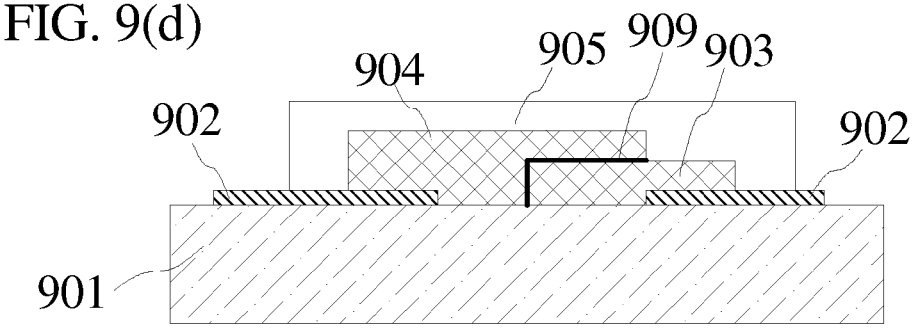

In the above examples, semiconductor electrical diodes are packaged into chips before they are placed on circuit boards. It is desirable to print semiconductor electrical diodes directly on printed circuit boards. FIG. 9(a) is a simplified symbolic cross-section diagram for a circuit board (901) that has surface conductor traces (902). Normally, electrical diode circuits are packaged into chips before they can be soldered on circuit boards. Printed non-crystalline electrical diodes can be printed directly onto circuit boards without packaging. FIG. 9(b) shows the cross-section view when a non-crystalline semiconductor layer (903) is printed on the circuit board (901). FIG. 9(c) shows the cross-section view when another non-crystalline layer (904) of different doping type is printed on the circuit board (901). The second layer (904) partially overlaps with the first layer (903) to form junction electrical diodes (909) between the overlapped areas. These two layers (903, 904) can be a p-type non-crystalline semiconductor layer and an n-type non-crystalline semiconductor layer forming P-N junction electrical diodes, or one non-crystalline semiconductor layer and one metal layer forming Schottky diodes. Common examples of non-crystalline semiconductor materials are polycrystalline silicon or amorphous silicon. The two layers also can be two different semiconductors. FIG. 9(d) shows the cross-section view when a protective insulator layer (905) is printed to cover the electrical diode (909). The circuit board (901) can be printed circuit boards (PCB), a flexible printed circuit board commonly used by mobile devices, glass circuit boards commonly used for optical display devices, the substrate of a BGA package, or other kinds of board level substrates.

While specific embodiments of the invention have been illustrated and described herein, it is realized that other modifications and changes will become apparent to those skilled in the art. It is to be understood that there are many other possible modifications and implementations so that the scope of the invention is not limited by the specific embodiments discussed herein. The above examples of preferred embodiments focused on electrical diode circuits. The same principles are applicable to other types of active circuits or integrated circuits especially for die-scale chips. A die-scale chip, by definition, is a chip that comprises at least one single-crystal semiconductor die, and that the area of the chip is no more than 20% larger than the area of the largest semiconductor die in the chip.

FIGS. 10(a-n) are simplified symbolic diagrams illustrating exemplary processes to build die-scale surface mount integrated circuit chips. FIG. 10(a) is a simplified view of a single-crystal silicon substrate (99) that comprises a plurality of dice. FIG. 10(b) shows a magnified picture of four dice (7-10) on the silicon substrate in FIG. 10(a). Nearby dice are separated by scribe lanes (98). Each die comprises integrated circuits that support the functions of an individual IC chip after die slicing and formation of conductor leads. The structures of actual integrated circuits are typically very complex so that symbolic schematic diagrams or block diagrams are used to represent integrated circuits in the following examples. In this example, as shown by the schematic diagram in FIG. 10(b), each die comprises a differential amplifier that has a pair of differential input (I+, I−), a pair of differential output (O+, O−), a power down control signal (PD), power supplies (VDD, AVDD) and ground (GND). All the input and/or output (I/O) signals, power suppliers (AVDD, VDD), and ground (GND) are connected to bonding pads (11) that provide openings on the semiconductor substrate for external connections to the IC. After IC manufacture processes have been done, protective insulator films (14) are printed to cover active components as illustrated by FIG. 10(c). Typical materials used for the protective insulator are plastics or epoxy. FIGS. 10(d-g) are simplified cross-section diagrams illustrating wafer thinning and dicing processes. FIG. 10(d) shows the cross-section views near one die (10) in FIGS. 10(a-c). In FIGS. 10(d-g), the silicon substrate is placed face down on a tape or a flat surface (31). Figures in our examples are not necessarily drawn to scale. Typically, the thickness of the silicon substrate (99) is reduced before die slicing, as shown in FIG. 10(e). In this example, an insulator layer (12) is deposited on the back of the silicon substrate, as illustrated in FIG. 10(f). Typical materials used for this insulator layer are epoxy, plastics, dielectrics, or photo-resist. After deposition of back side insulator, the silicon wafer (99) is sliced, typically using precision diamond blades, along scribe lanes (98) into individual die (7, 10), as illustrated in FIG. 10(g). FIG. 10(h) shows exemplary three dimensional structures of a sliced die (10) after the above processes. The sliced die (10) is dipped into a film of insulator ink (28) using dipping processes similar to the example illustrated in FIGS. 8(f-h). After heat treatment, a dried-ink side-wall insulator layer (21) is deposited on the bottom side-wall of the die (10), as illustrated in FIG. 10(i). Similar processes can be repeated to deposit another dried-ink side-wall insulator layer (22) on the top side-wall of the die (10), as illustrated in FIG. 10(j). The side-wall insulator layer also can be formed using other methods such as stamping, printing, sputtering, spin on, or brushing. Another preferred embodiment is to use photo-resist instead of dry-ink materials for the side-wall insulator(s) especially for low temperature applications. Preferably, the thickness of the side-wall insulator(s) is thinner than 100 micrometer. Using processes similar to those illustrated in FIGS. 8(f-h), the die (10) in FIG. 10(j) is dipped into printed conductor ink lines (29) using dipping processes, as illustrated in FIG. 10(k). After heat treatment, dried-ink conductor leads (23) are deposited on the bottom side-wall of the die (10), as illustrated in FIG. 10(l). Similar processes can be repeated to deposit side-wall conductor leads (24) on the top side-wall surface of the die (10) in FIG. 10(l), as illustrated in FIG. 10(m). Other methods such as stamping, printing, or sputtering also can be applied to form the side-wall conductor leads. Electroplating is typically applied to deposit additional conductor materials on the side-wall conductor leads (23, 24). The die (10) in FIG. 10(m) is now a packaged chip (28) because it has conductor leads (23, 24) ready for board level assembly. FIG. 10(n) shows cross-section views of the chip (28) in FIG. 10(m). The area of the chip (28) in FIG. 10(m) is about the same as the area of the silicon die (10); the chip (28) in FIG. 10(m) is therefore a die-scale package chip.

Figure 10A:
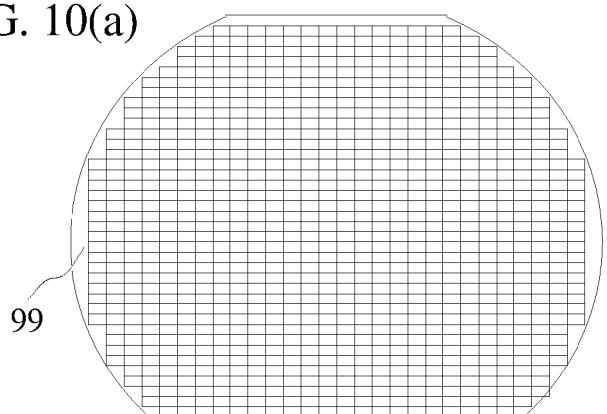
FIGS. 10(a-s) are simplified symbolic diagrams illustrating manufacture processes for side-wall conductor leads on die-scale surface mount package chips.
Figure 10B:
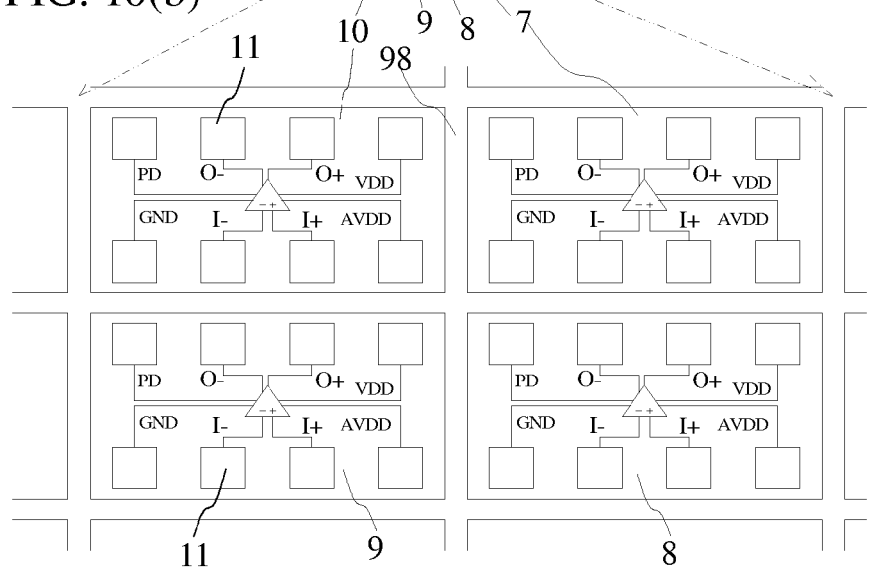
Figure 10C:
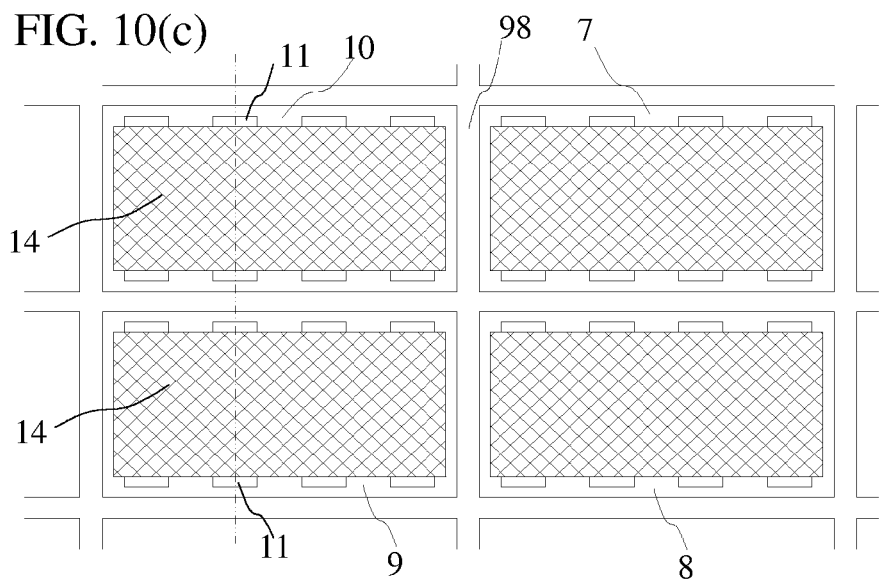
Figure 10D:
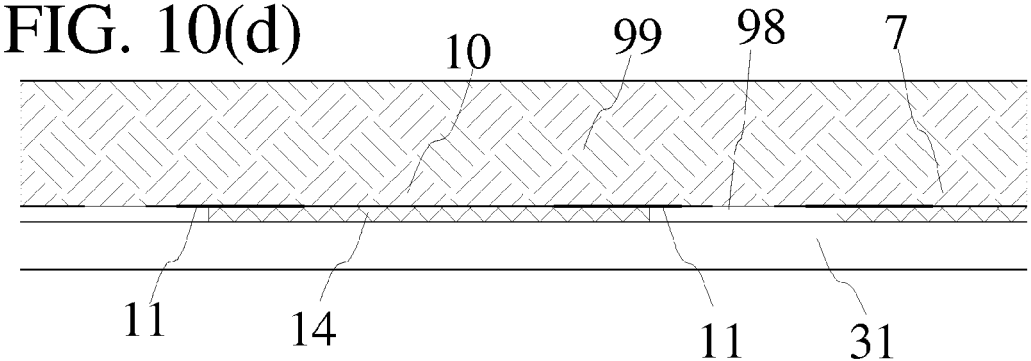
Figure 10E:
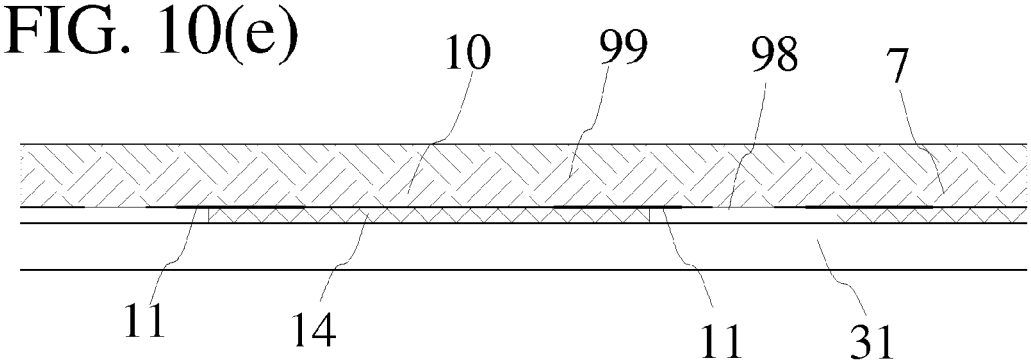
Figure 10F:
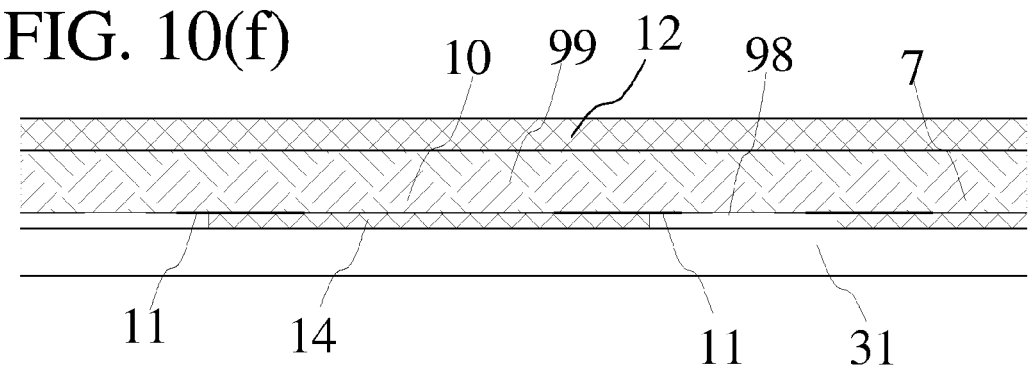
Figure 10G:
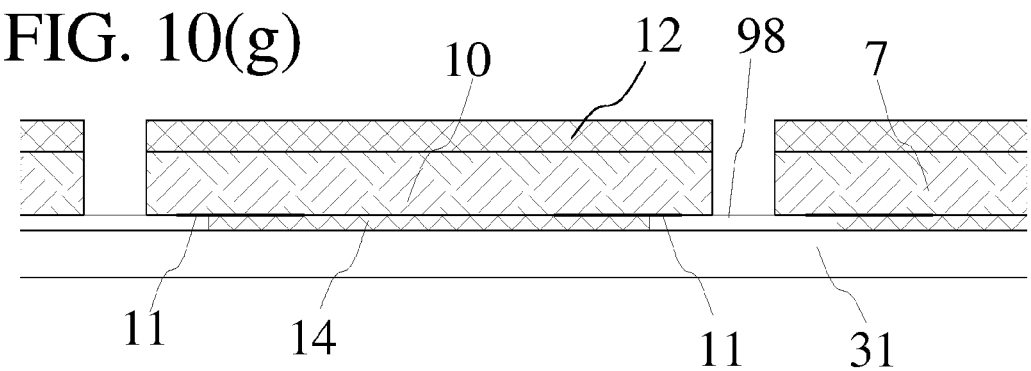
Figure 10H:
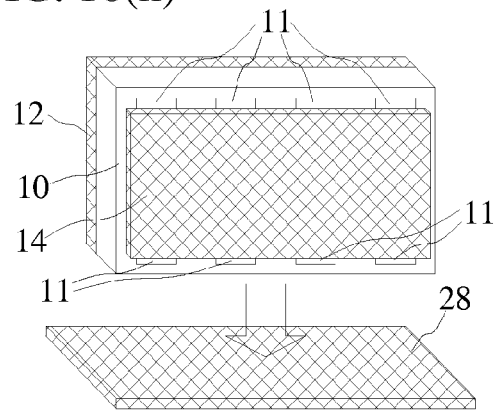
Figure 10I:
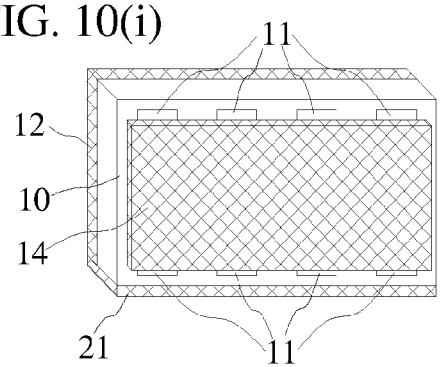
Figure 10J:
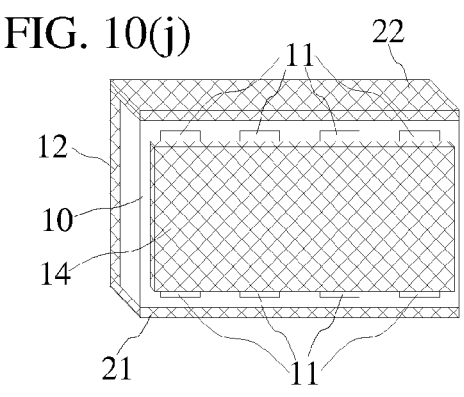
Figure 10K:
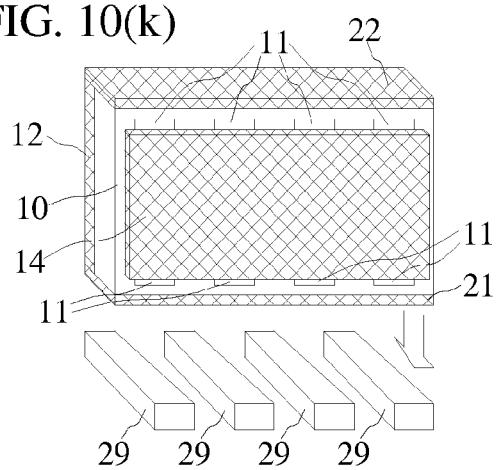
Figure 10L:
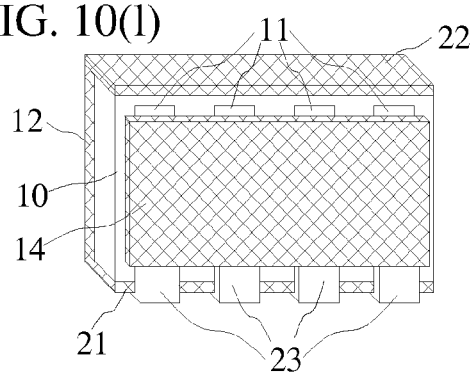
Figure 10M:
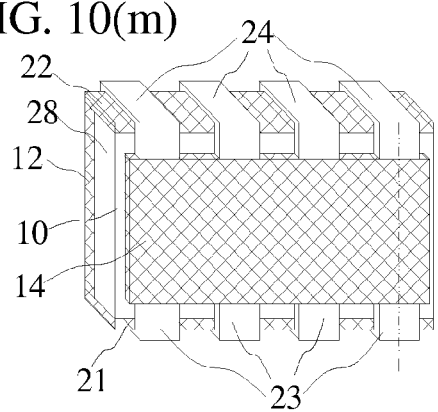
Figure 10N:
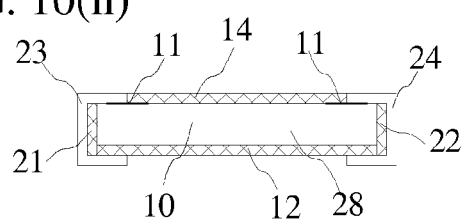
Figure 10O:
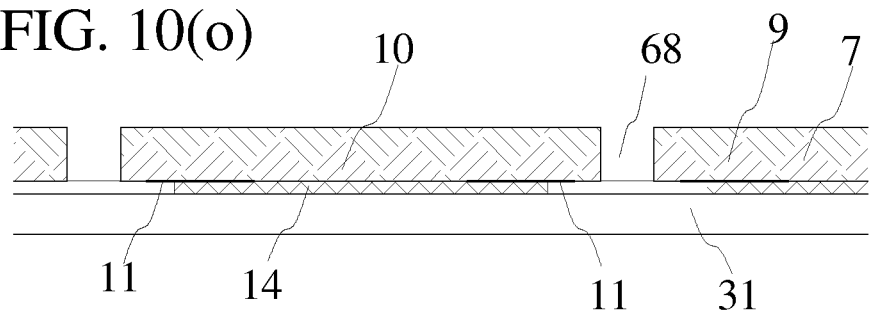
Figure 10P:
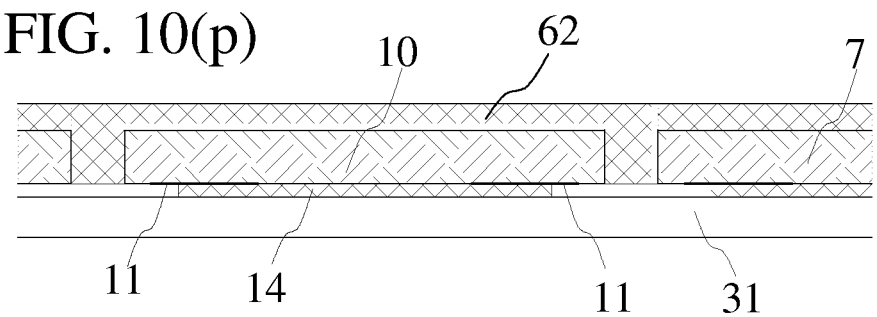
Figure 10Q:
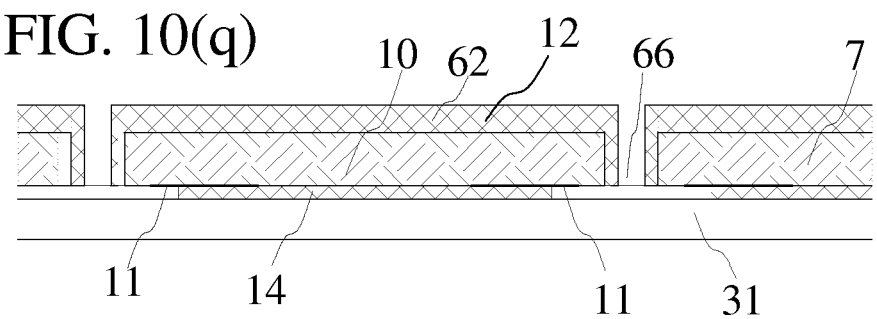

While specific embodiments of the invention have been illustrated and described herein, it is realized that other modifications and changes will become apparent to those skilled in the art. It is to be understood that there are many other possible modifications and implementations so that the scope of the invention is not limited by the specific embodiments discussed herein. For example, the side-wall conductor leads (23, 24) in the above preferred embodiment are dried-ink conductor films patterned by dipping. Other manufacture methods such as stamping, electroplating, sputtering, chemical deposition or other methods also can be used to form the side-wall conductor leads. The materials used for side-wall conductor leads are also not necessary dried-ink materials. In FIGS. 10(h-j), dipping is used to deposit dried-ink insulator materials at the side-walls before formation of side-wall conductor leads. Stamping, electroplating, spin-on insulator, deposition of photo-resist, or other methods certainly can be used to deposit side-wall insulators. The materials used for side-wall insulators are also not necessary dried-ink materials. For example, photo-resist materials are also suitable for side-wall insulators. FIGS. 10(o-s) are cross-section diagrams illustrating examples of other processes that can be used to form side-wall insulators. FIG. 10(o) illustrate exemplary process that, after finishing back side thinning of the silicon substrate (99) as illustrated in FIG. 10(e), the silicon substrate (99) is sliced along scribe lanes (98). After the first dicing shown in FIG. 10(e), an insulator layer (62) is deposited to fill the sliced spaces as shown in FIG. 10(p). Epoxy is a typical material that can be used for this application. A thin dicing blade is used to dice the structures in FIG. 10(p) along the scribe lanes (98) for a second time. This second dicing removes part of the insulator materials filled in the scribe lane (98) while leaving insulator materials (62) at the side-walls of the dice (7, 10), as illustrated by FIG. 10(q). The sliced dice in FIG. 10(q) are ready for die-scale packaging either by bumping or by adding side-wall conductor leads using processes like those illustrated in FIGS. 10(k-m).

Figure 10R:
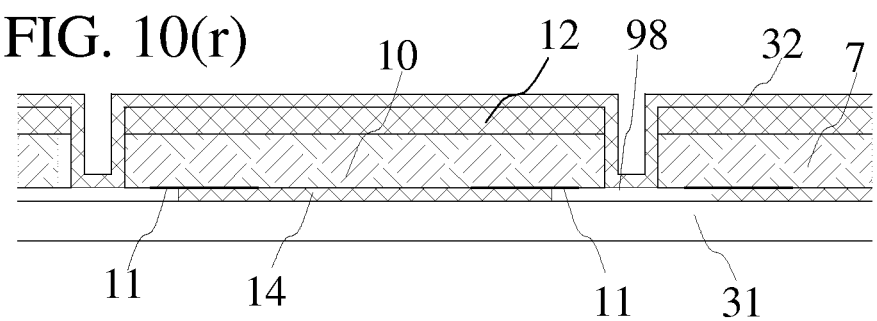
Figure 10S:
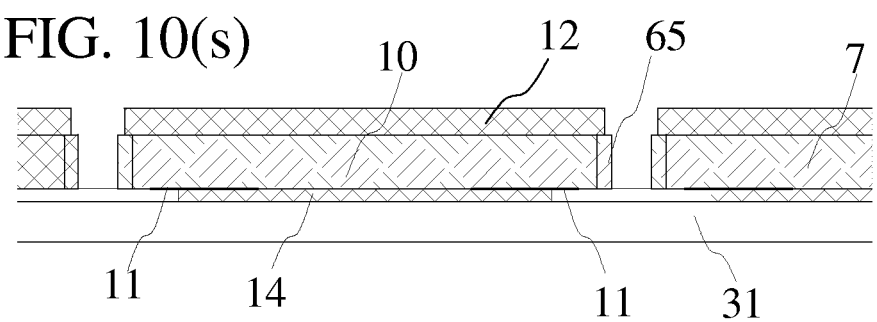

While specific embodiments of the invention have been illustrated and described herein, it is realized that other modifications and changes will become apparent to those skilled in the art. It is to be understood that there are many other possible modifications and implementations so that the scope of the invention is not limited by the specific embodiments discussed herein. For example, in the above example, the dice (7, 10) remains on the tape (31) after the first dicing shown in FIG. 10(o). In this way, the space between dicing is limited by the first dicing process. An alternative is to re-arrange the dice after the first dicing; in this way the space between dicing is no longer limited by the first dicing process. FIG. 10(r) illustrates another exemplary process for depositing side-wall insulators. After slicing, starting from the structures in FIG. 10(g) or 10(o), an insulator layer (32) can be deposited by sputtering or other thin-film processing methods on the back side as well as between the dice (7, 10) to generate side-wall insulators, as illustrated in FIG. 10(r). If this insulator layer (32) can be broken along the scribe lanes (98), there would be no need for a second dicing to separate the dice (7, 10). FIG. 10(s) illustrates another example. Starting from the structures shown in FIG. 10(g), insulator films (65) are grown on the exposed silicon at the side-walls using insulator growing processes to form silicon oxide and/or silicon nitride films. This method allows selective growth of insulator films on exposed silicon. Sliced dice in FIG. 10(r) or FIG. 10(s) are ready for processes like those illustrated in FIGS. 10(k-m) to make die-scale package chips using side-wall conductor leads. In the above example, the silicon substrate is face down. Similar methods are certainly applicable when the silicon substrate is placed face up.

Figure 5A:
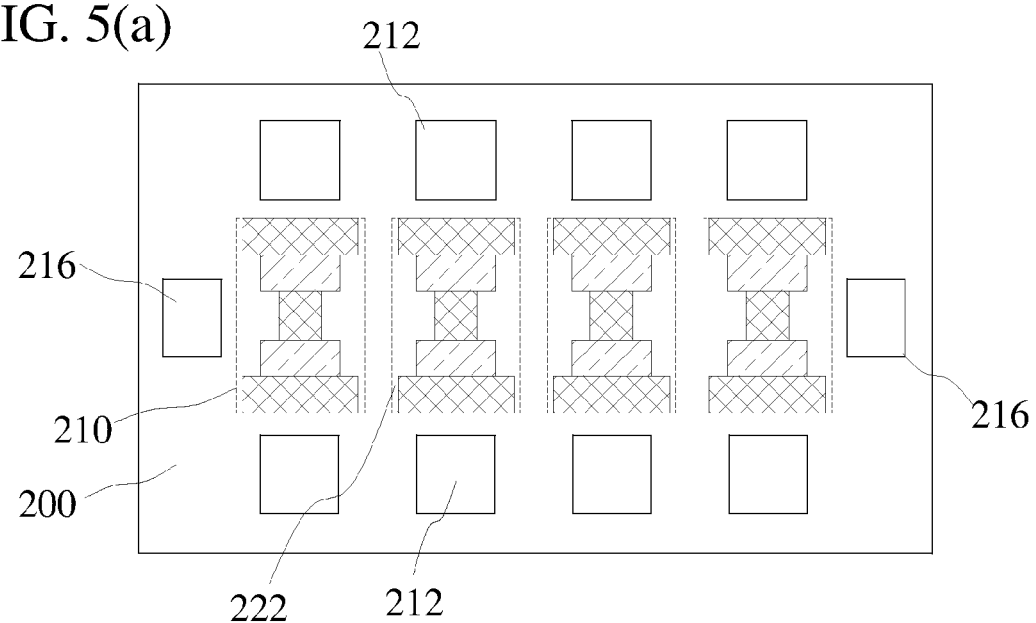
FIGS. 5(a-c) are simplified symbolic diagrams illustrating another exemplary ESD protection chip using solder balls as conductor leads.
FIG. 5(d) is a simplified cross-section diagram illustrating the structures when the chip in FIG. 5(c) is mounted on a printed circuit board (530)
FIG. 5(e) shows the cross-section structures for a chip mounted on PCB using side-wall conductor leads.
Figure 5B:
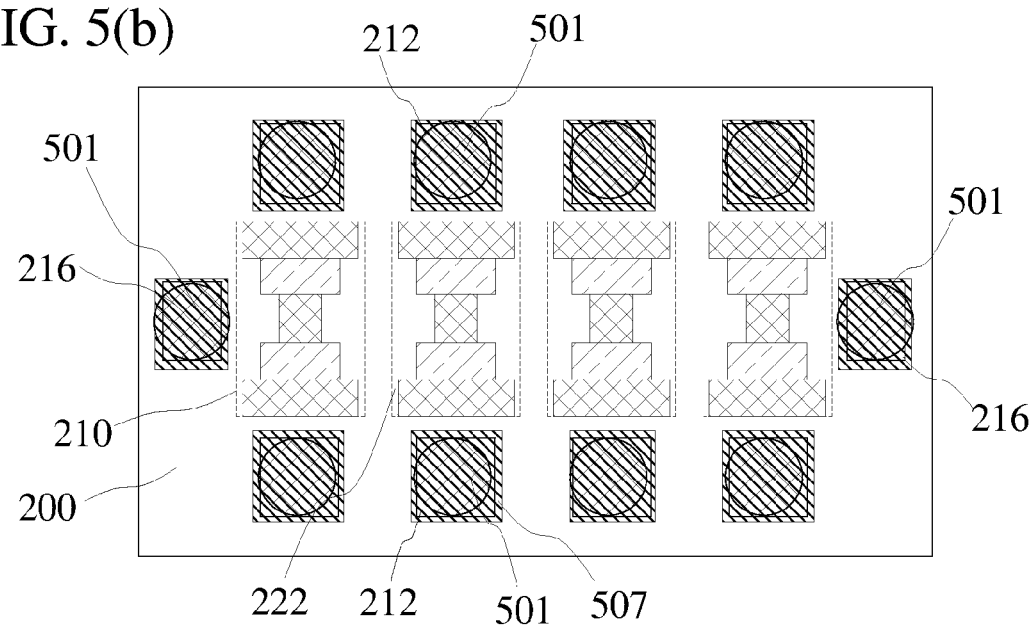
Figure 5C:
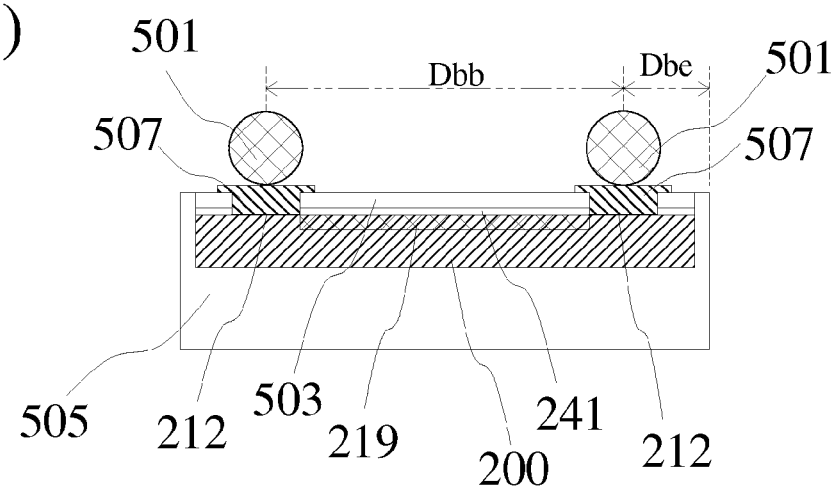
Figure 5D:
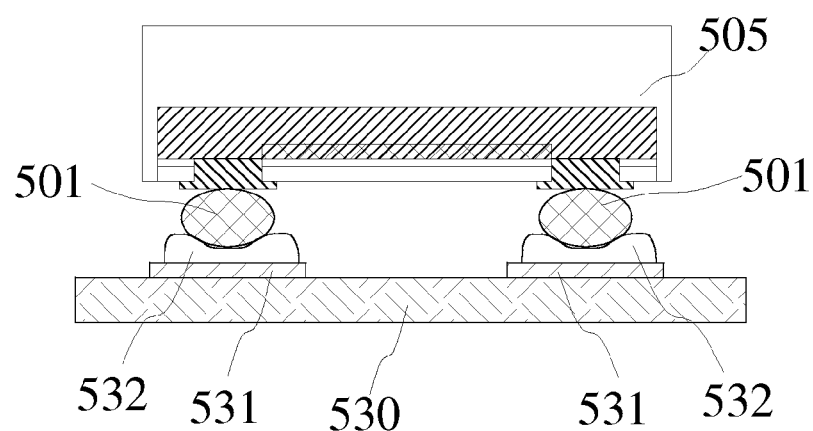
Figure 15A:
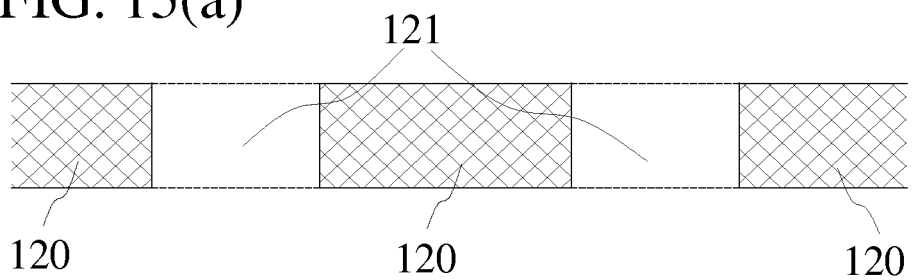
FIGS. 15(a-h) are simplified illustrations for exemplary through-hole manufacture procedures of the present invention when developed photo-resist materials are used to define through-holes.
Figure 15B:
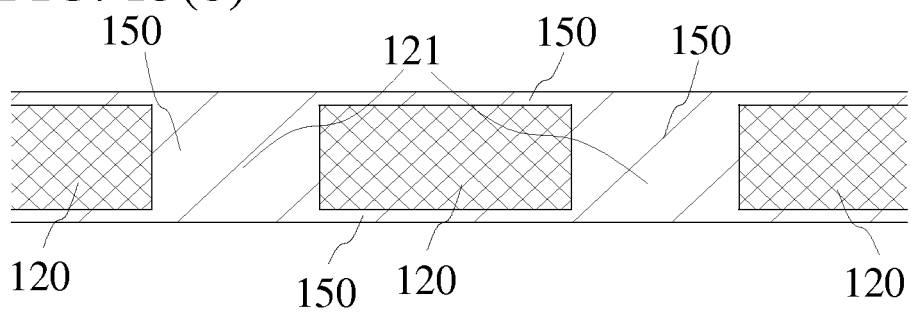
Figure 15C:
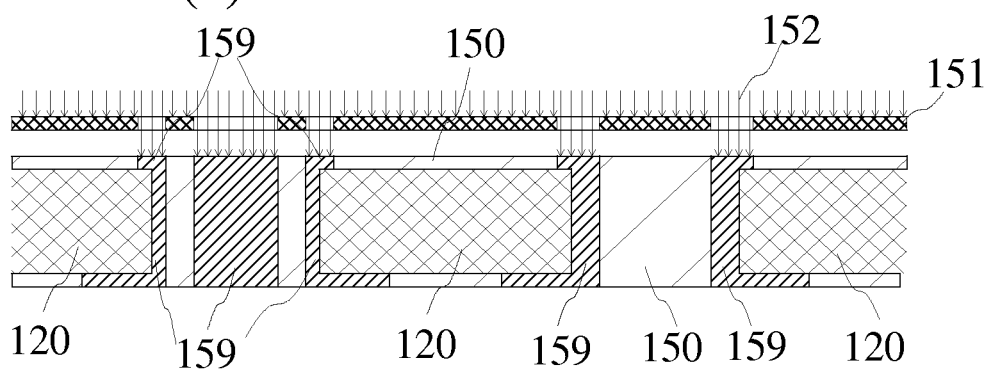
Figure 15D:
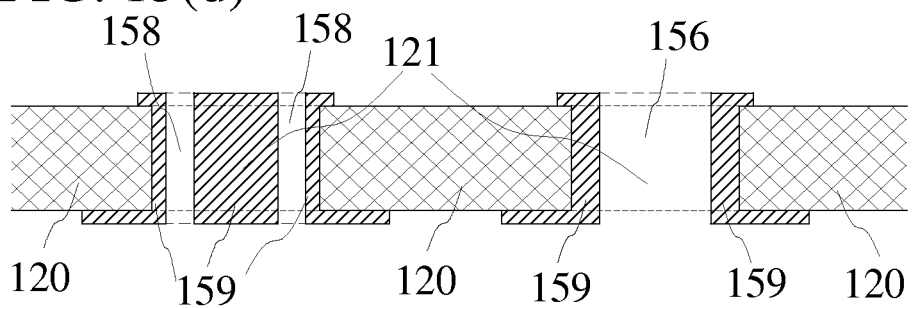
Figure 15E:
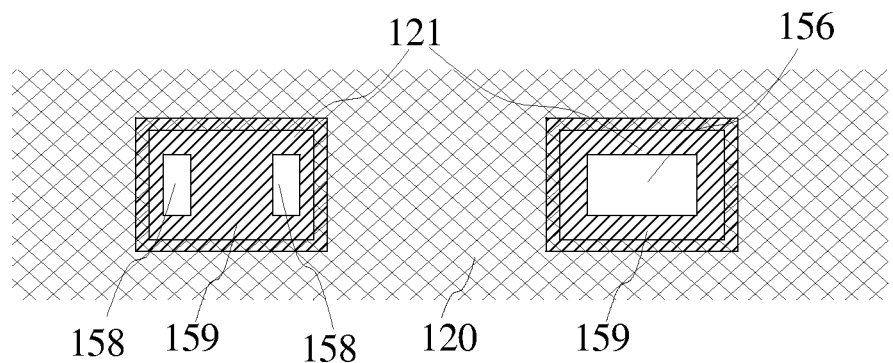
Figure 15F:
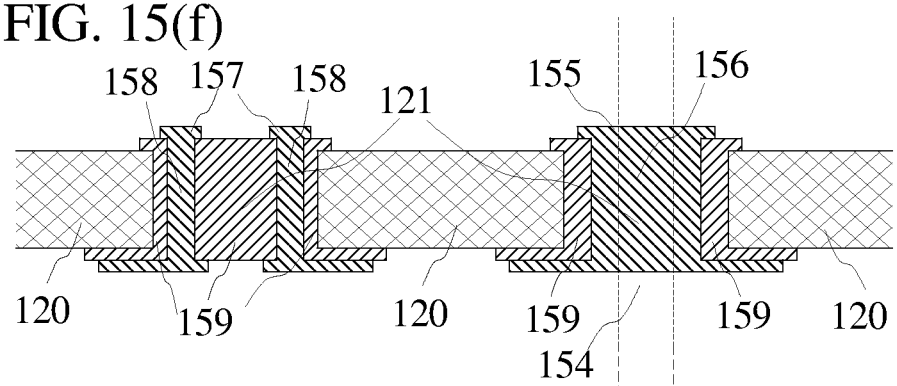
Figure 15G:
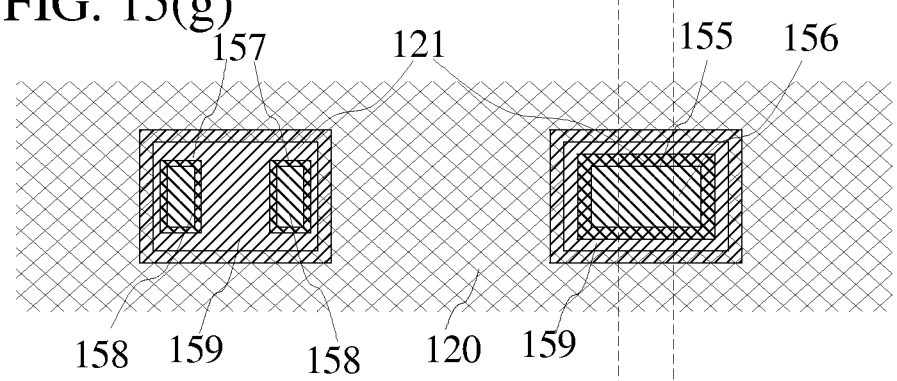
Figure 15H:
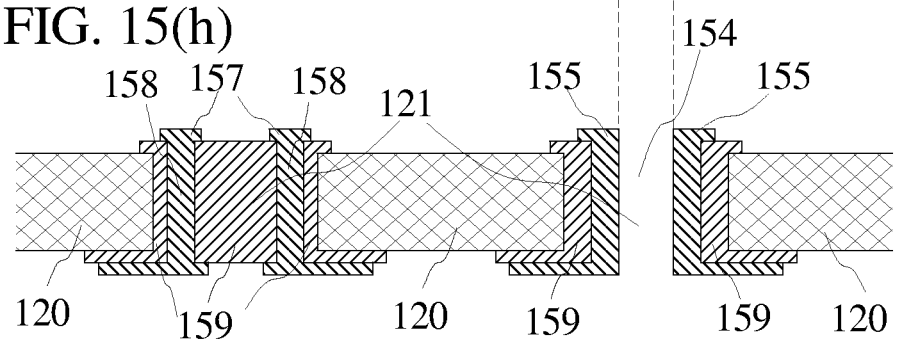
Figure 16A:
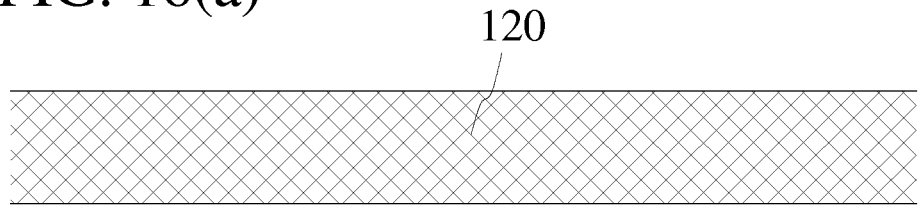
FIGS. 16(a-p) are simplified illustrations for exemplary through-hole manufacture procedures of the present invention when holes opened from both sides of a semiconductor substrate are used to form through-holes.
Figure 16B:
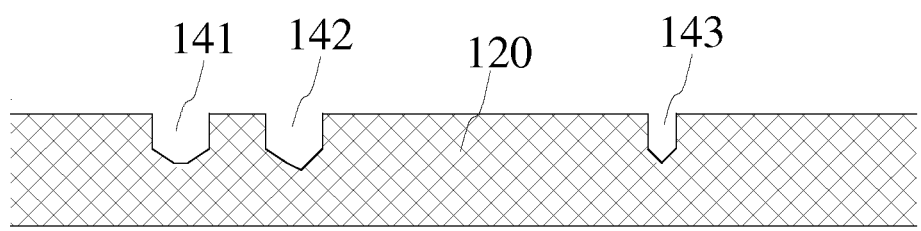
Figure 16C:
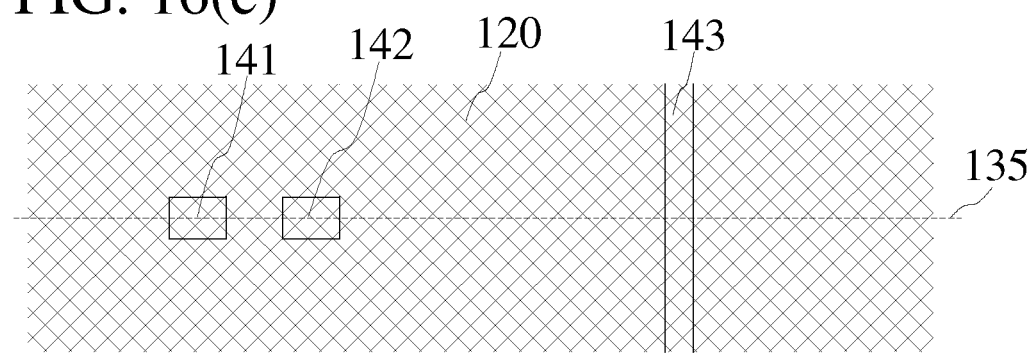
Figure 16D:
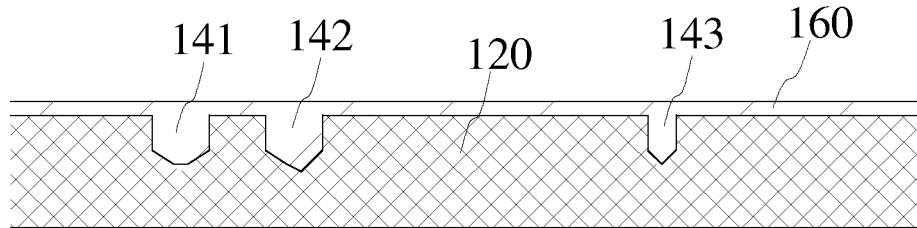
Figure 16E:
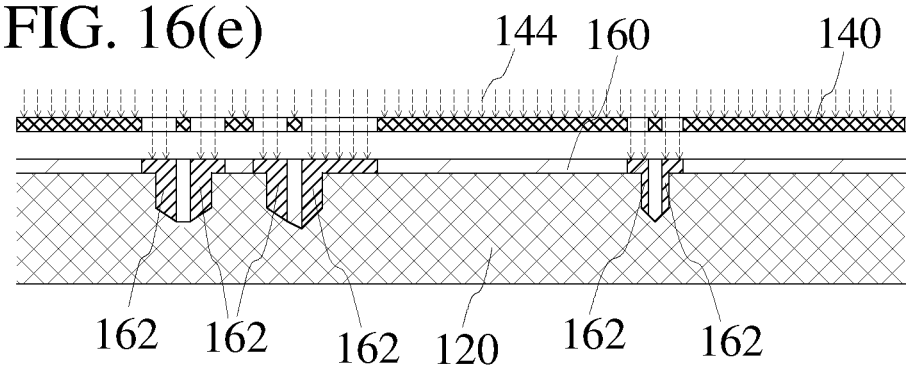
Figure 16F:
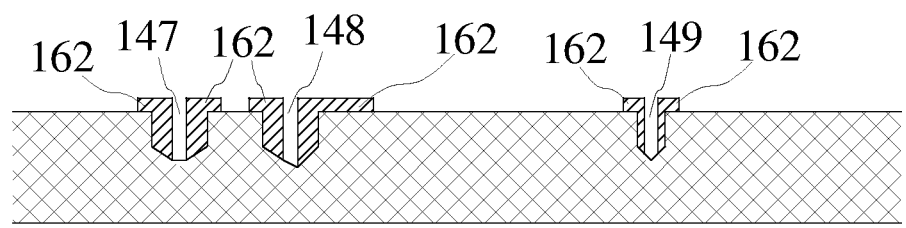
Figure 16G:
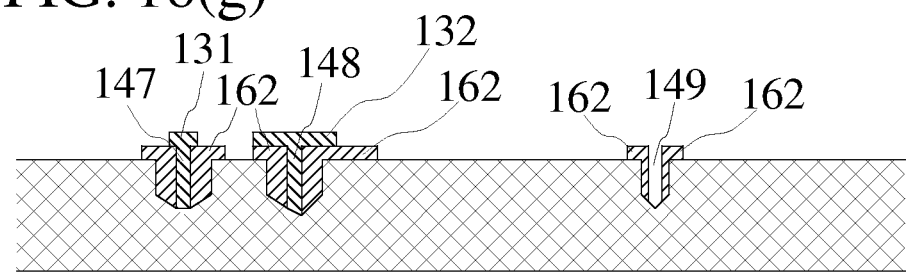
Figure 16H:
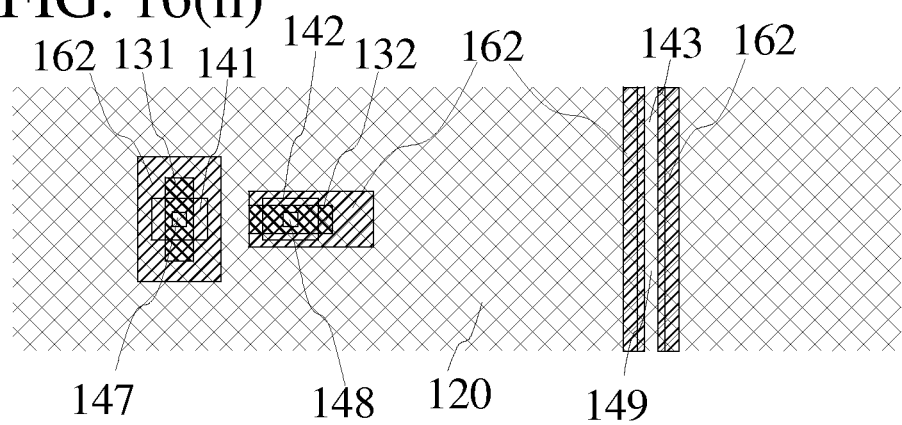
Figure 16I:
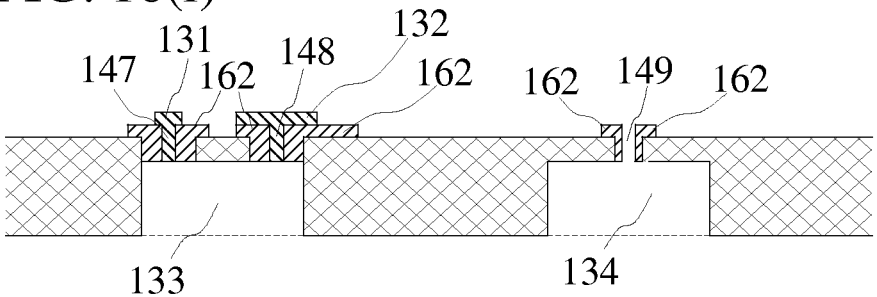
Figure 16J:
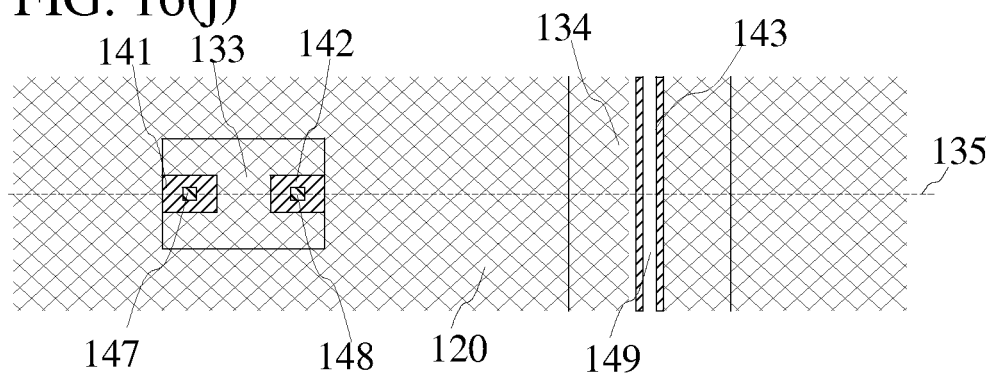
Figure 16K:
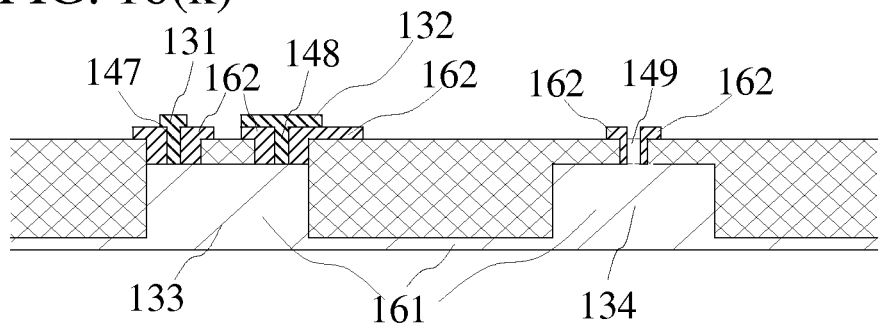
Figure 16L:
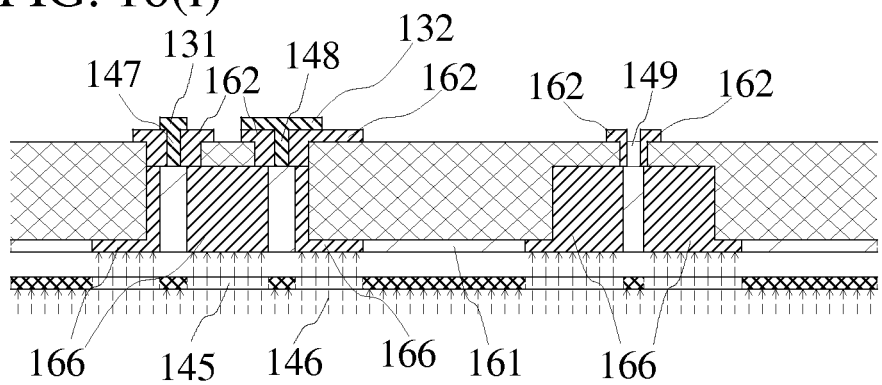
Figure 16M:
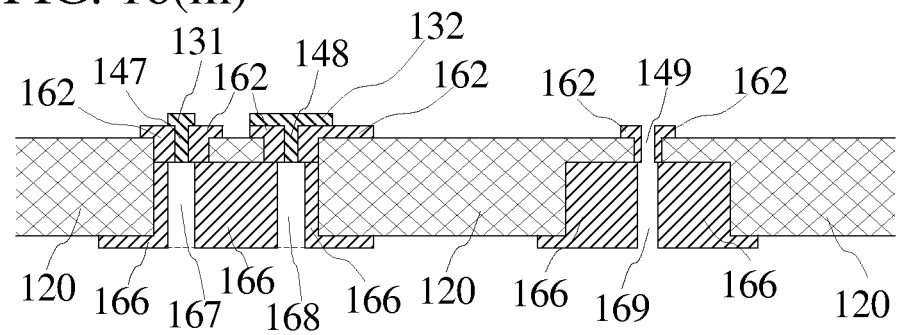
Figure 16N:
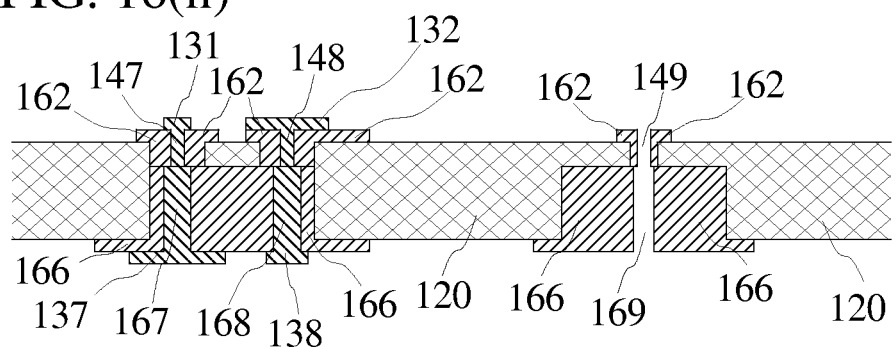
Figure 16O:
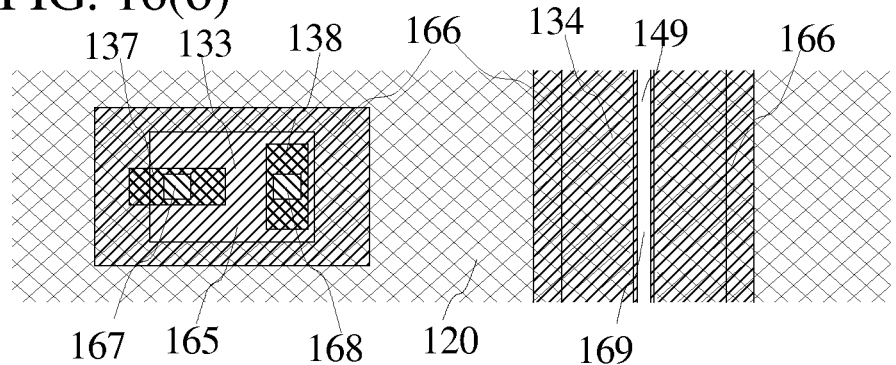
Figure 16P:
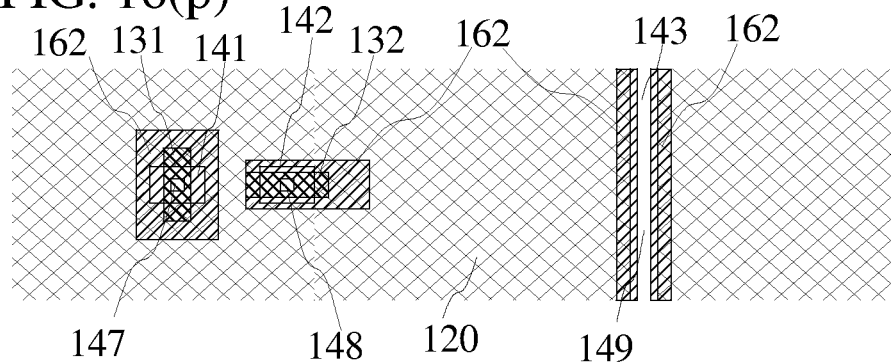
Figure 17A:
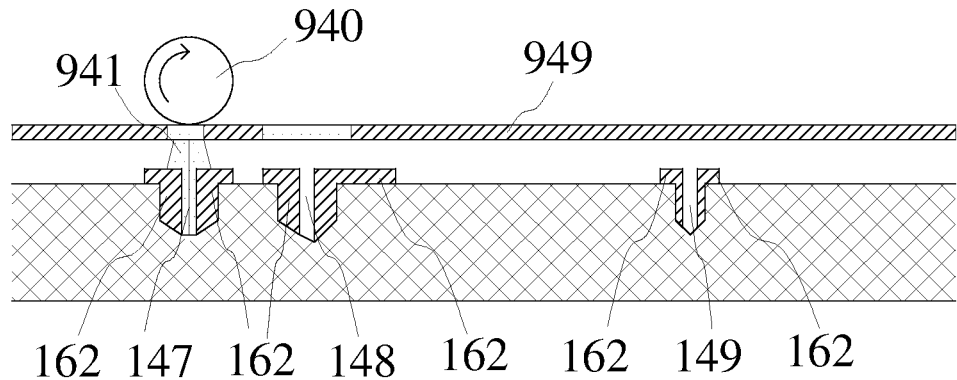
FIGS. 17(a-f) show examples of filling conductor materials into holes on silicon substrate using printing technologies.
Figure 17B:
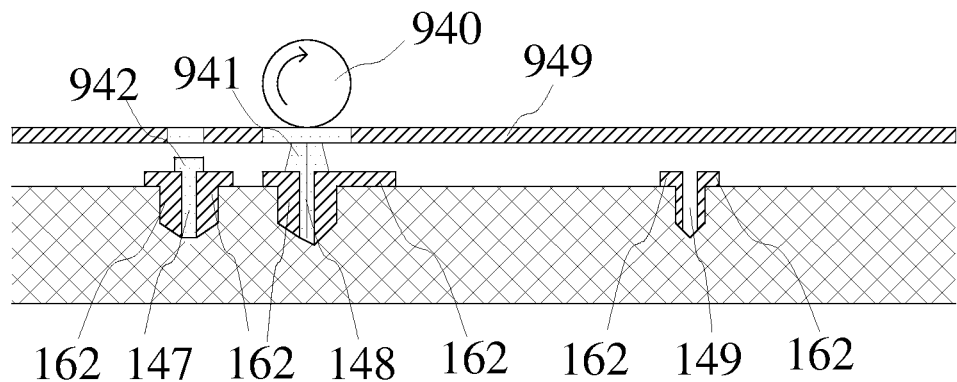
Figure 17C:
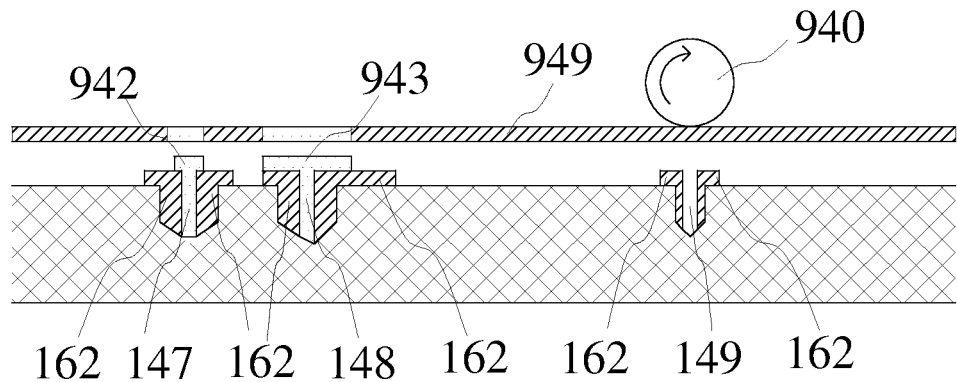
Figure 17D:
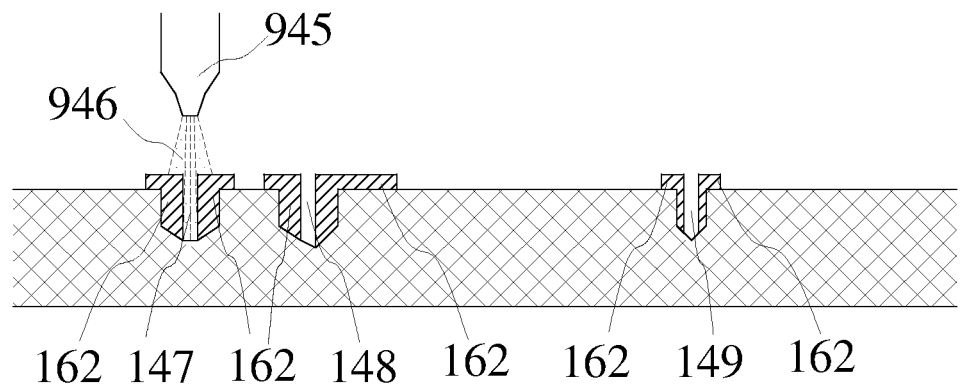
Figure 17E:
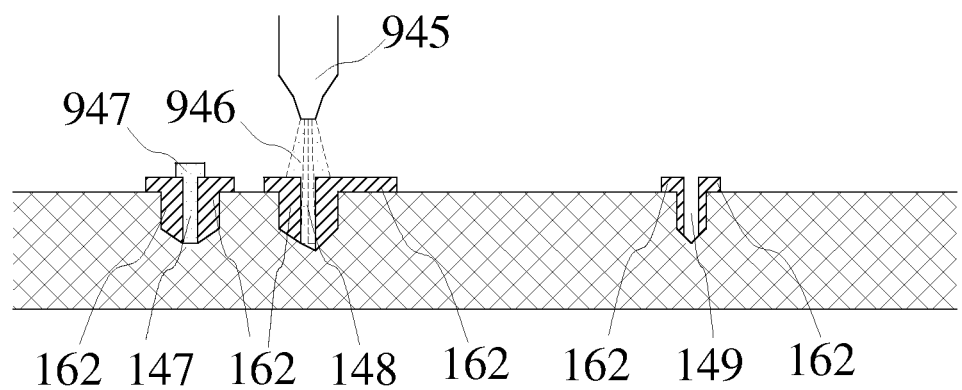
Figure 17F:
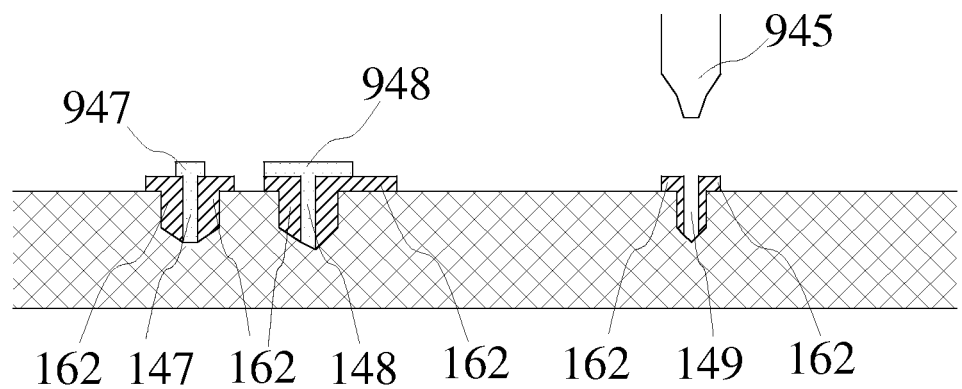
Figure 18A:
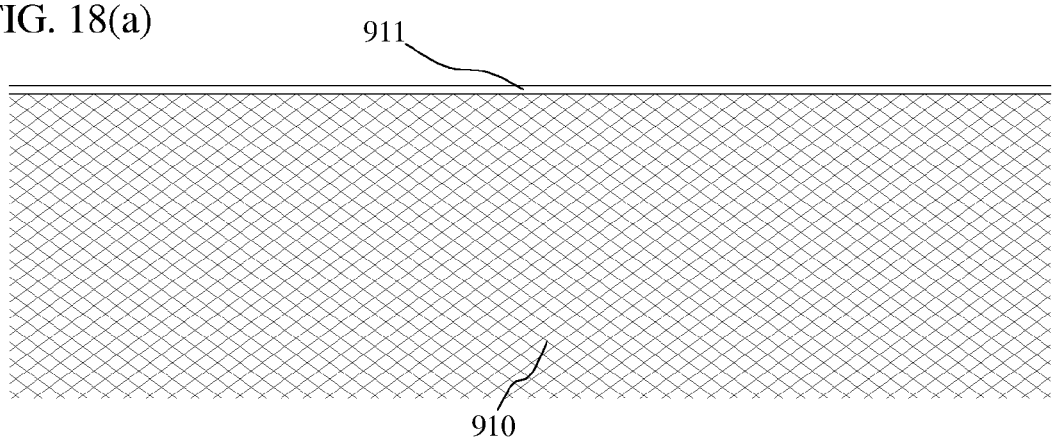
FIGS. 18(a-l) show examples of filling conductor materials into holes on silicon substrate by electroplating while using silicon substrate as the cathode.
Figure 18B:
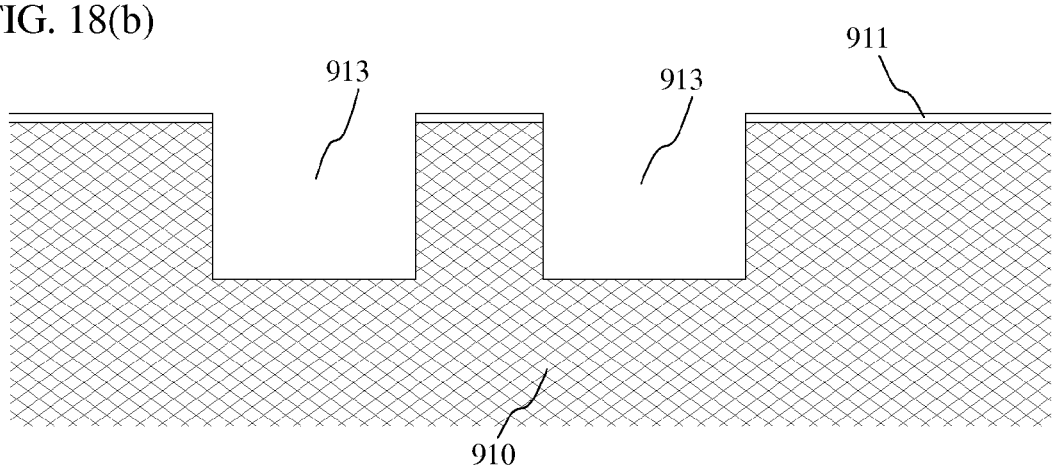
Figure 18C:
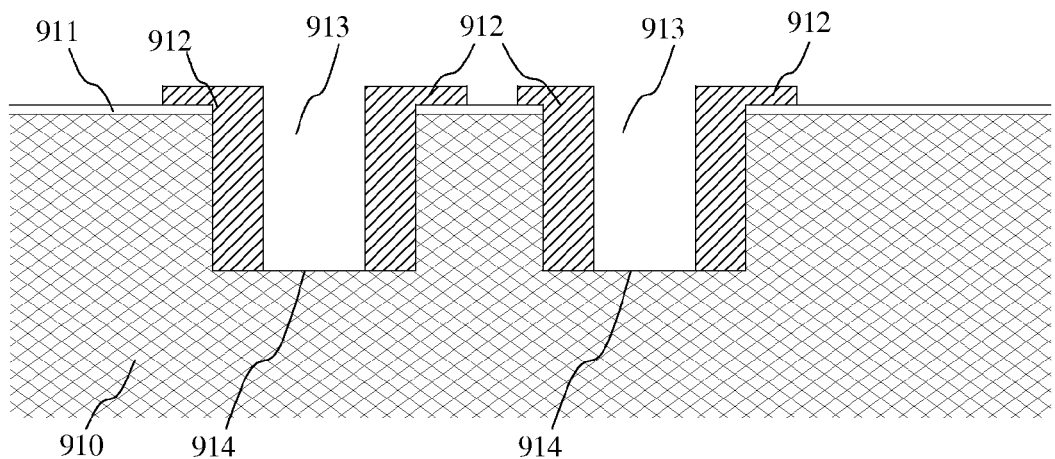
Figure 18D:
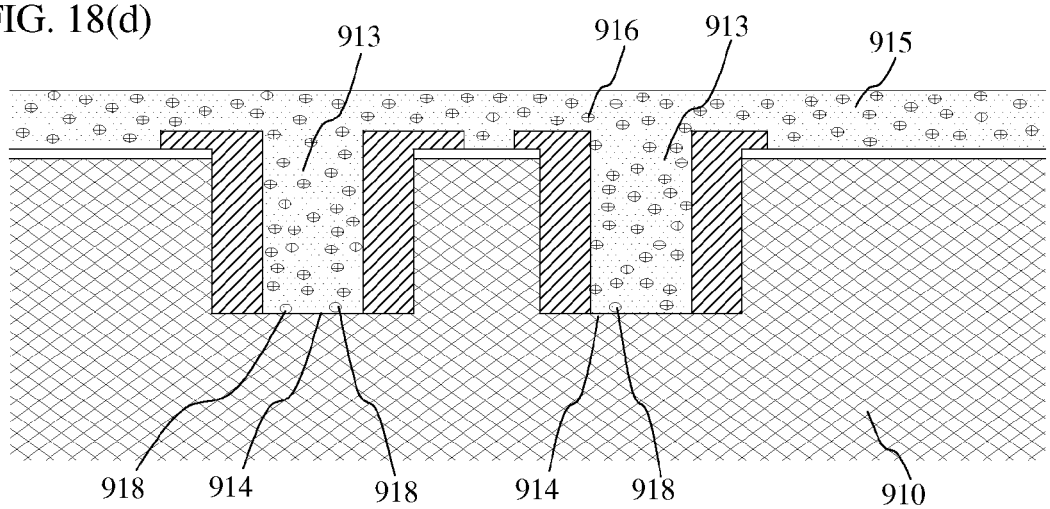
Figure 18E:
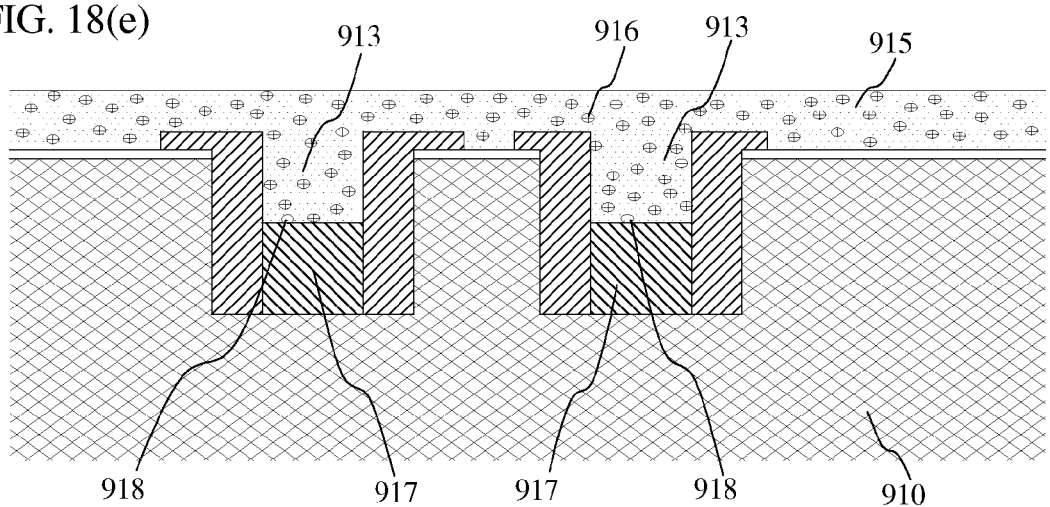
Figure 18F:
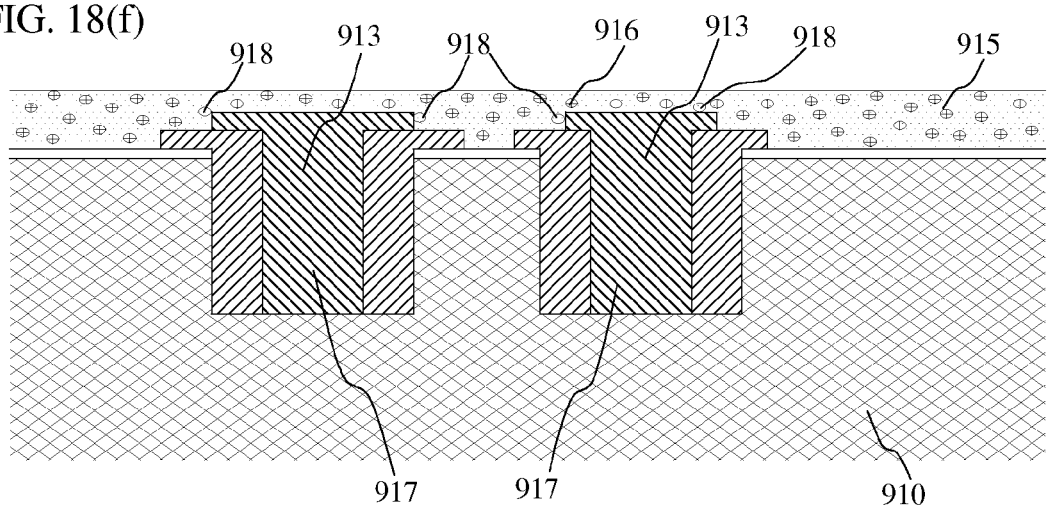
Figure 18G:
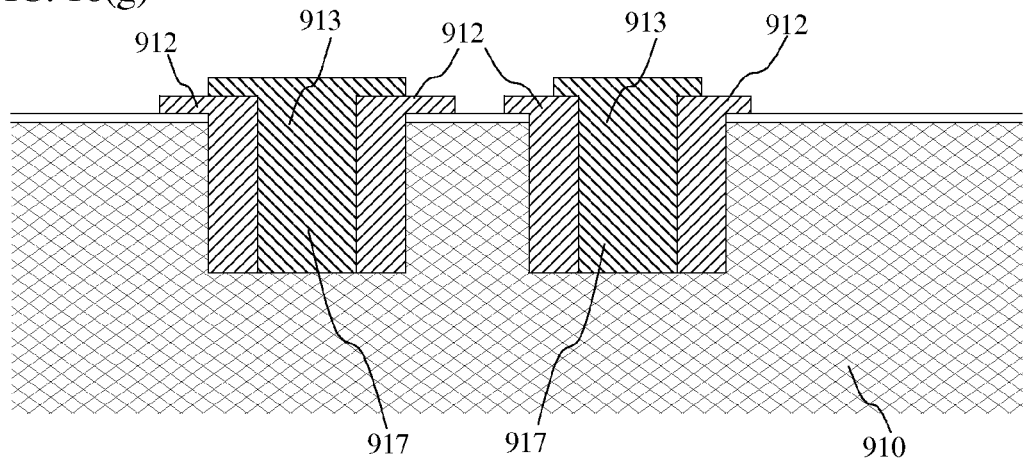
Figure 18H:
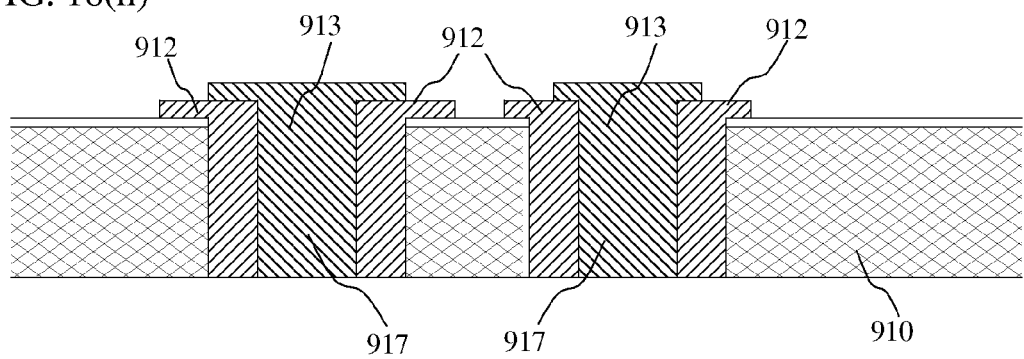
Figure 18I:
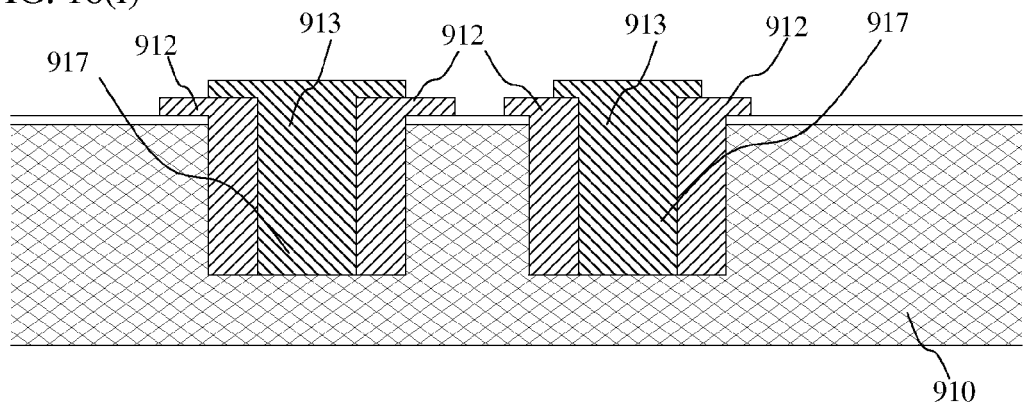
Figure 18J:
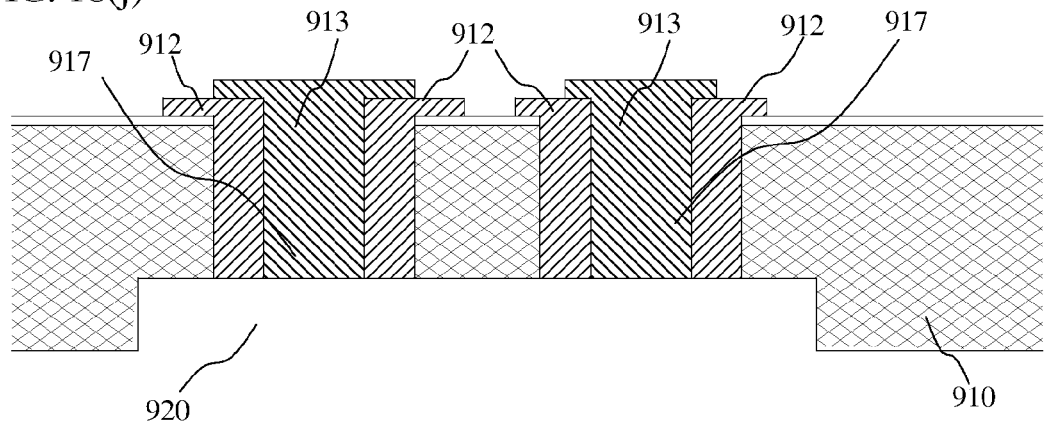
Figure 18K:
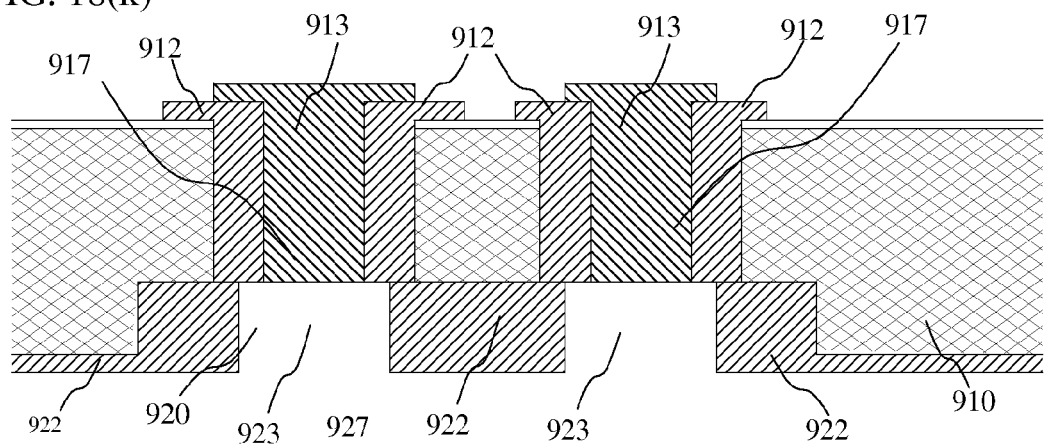
Figure 18L:
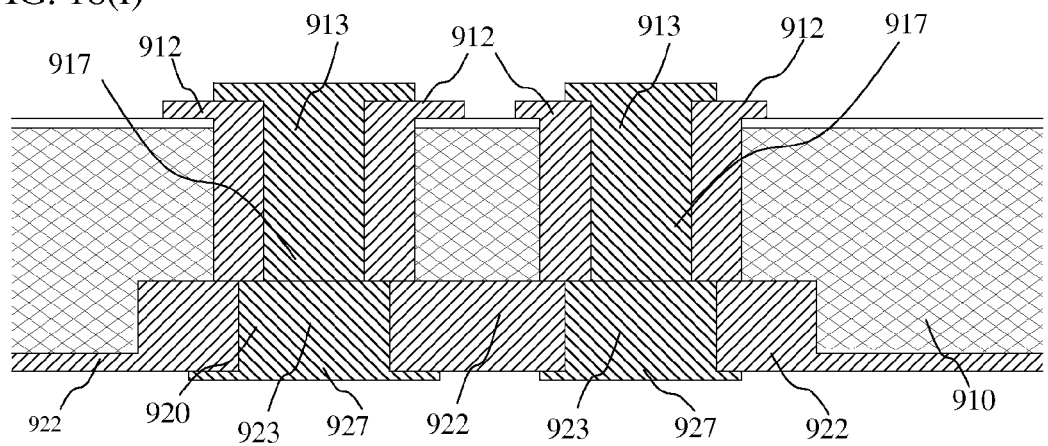

The above examples in FIGS. 10(a-s) illustrate exemplary manufacture processes to form side-wall insulators and side-wall conductor leads for die-scale surface mount chips. A "side-wall", by definition, is (a) a surface that shares at least one edge to the soldering surface of a surface mount chip, and (b) a surface that is at a different angle from the soldering surface. Side-walls are typically nearly vertical to the soldering surface of a surface mount chip, but there can be exceptions. The soldering surface is a flat surface that is designed to face the circuit board after board level assembly. For die-scale surface mount package chips, the soldering surface is typically the same surface or the opposite surface of the surface mounted with silicon substrate, but there can be exceptions. "Side-wall insulator" is insulator material deposited on the side-wall of a surface mount package chip used to provide electrical insulating between the silicon substrate and the side-wall conductor leads. Examples of the materials used for side-wall insulator(s) include dried-ink insulator(s), photo-resist materials, or insulator(s) with surface particles. For die-scale packaging, it is preferable to have side-wall insulator thinner than 100 micrometers. A "side-wall conductor lead" is a conductor lead that comprises conductors deposited on the surface(s) of a surface mount package chip, and that the conductor lead extends from the soldering surface into the side-wall(s) of a surface mount chip. Typical side-wall conductor leads extend from the soldering surface across one or more side-wall(s) all the way to the opposite surface of the soldering surface. Sometimes a side-wall conductor lead may not extend all the way to the opposite surface, but side-wall conductor leads defined in this patent always extend into at least 60% of the depth of at least one side-wall. For examples, the conductor leads shown in FIGS. 3(i-k), FIGS. 4(g,h), FIG. 10(m), FIG. 11(f), FIGS. 12(a-k), and FIG. 15(h) are "side-wall conductor leads", while the conductor leads shown in FIGS. 2(e, f), FIGS. 3(g, h), and FIG. 5(c), are not "side-wall conductor leads". The conductor leads shown in FIGS. 3(g, h) are "edge conductor leads" but not "side-wall conductor leads" because the conductor leads did not extend to the side-walls of the chips. If a conductor lead comprises conductor(s) that extend into more than 60% of the thickness (RH, RH1) of the side-wall(s) of a surface mount package chip, then the conductor lead is a "side-wall conductor lead". In order to achieve the advantages in smaller sizes and in better mechanical properties, a side-wall conductor lead always comprises conductor(s) deposited on the surface of side-wall(s) of a surface mount package. Pins, bumps, balls, or other structures that are attached to the side-wall but not deposited on the side-wall are not "side-wall conductor leads". For example, FIG. 2(e) shows a package with pins attached to the side-wall of a packaged chip; such structures are not "side-wall conductor leads" and they do not have the advantages of side-wall conductor leads. Conductor leads are chip level electrical connections; therefore, connections added during board level assembly are not considered as conductor leads.

Present day die-scale package chips are typically made by bumping processes that place conductor balls (501) or bumps on the surface of silicon substrate, as illustrated by the example in FIGS. 5(a-c). FIG. 5(d) is a simplified cross-section diagram illustrating the structures when the chip in FIG. 5(c) is mounted on a printed circuit board (530). Typically, the chip is flipped upside down, and the conductor balls (501) are aligned to contact with bonding pads (531) on the printed circuit board (530), as illustrated in FIG. 5(d). Soldering pastes (532) are typically applied to form the bonding between the conductor balls (501) and the bonding pads (531). The mechanical stresses induced by the mounting processes typically deform the shapes of the conductor balls (501), as illustrated in FIG. 5(d). The ball-to-ball spacing (Dbb) is typically limited by printed circuit board technology. Present day technologies typically require Dbb to be at or larger than 0.4 mm. For many IC, this ball-to-ball spacing (Dbb) often increases the area of the die. Therefore, the cost of the chip is often increased due to the limitations on ball-to-ball spacing (Dbb). FIG. 5(e) shows the cross-section structures for a chip (540) that has equivalent functions as the chip in FIG. 5(d) except that this chip uses side-wall conductor leads (542) instead of bumping balls. In this example, the chip (540) with side-wall conductor leads is also mounted on the same bonding pads (531) of the same printed circuit board (530) as those in FIG. 5(d). The side-wall conductor leads (542) typically comprise soldering pastes, so that no additional soldering paste is required. The soldering pastes (543) on the side-wall conductor leads (542) typically flow onto the bonding pads (531) on the printed circuit board (530) after board assembly, as illustrated in FIG. 5(e). Advantages of side-wall conductor leads can be viewed by comparing FIG. 5(d) and FIG. 5(c). Due to removal of ball-to-ball spacing limitations, the silicon die (541) in the chip (540) with side-wall conductor leads (542) typically can be smaller in area than the die (200) in a bumping package; the chip area is also smaller for the same reasons. The mechanical structures in FIG. 5(d) are complex. The mechanical structures in FIG. 5(e) are compact and solid—resulting in better mechanical strength, better thermal properties, and better reliability. The parasitic impedances of side-wall conductor leads are also typically lower than those of bumping chips. Therefore, die-scale chips with side-wall conductor leads typically can be better than equivalent bumping chips in cost, size, mechanical strength, reliability, and thermal properties.

Figure 5E:
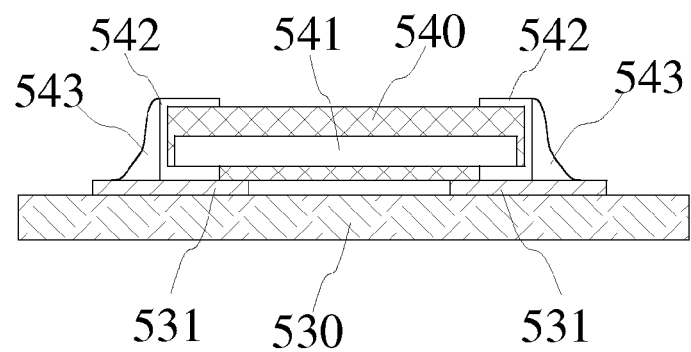
Figure 6A:
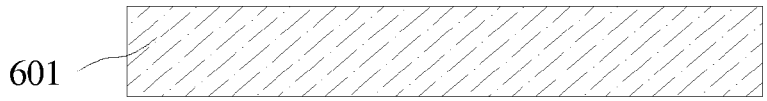
FIGS. 6(a-i) are simplified symbolic diagrams illustrating manufacture processes for none-crystalline semiconductor electrical diodes.
Figure 6B:
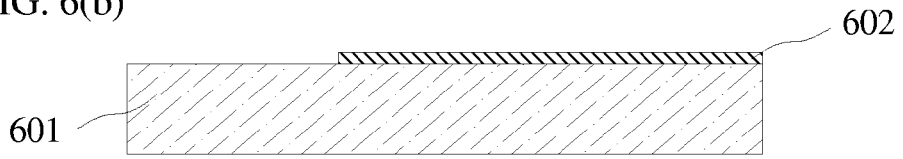
Figure 6C:
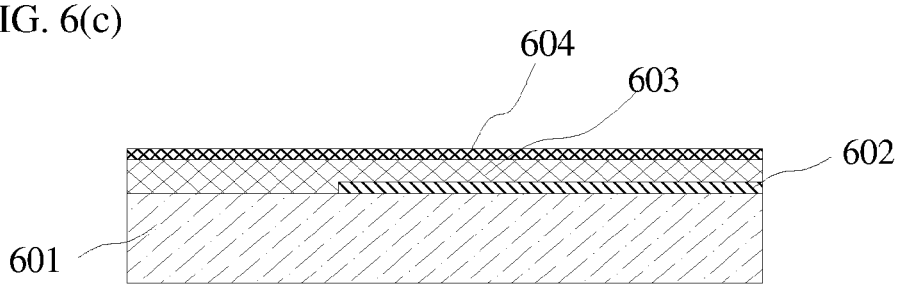
Figure 6D:
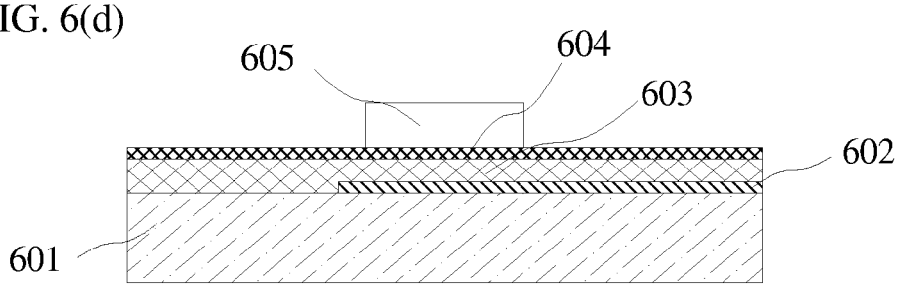
Figure 6E:
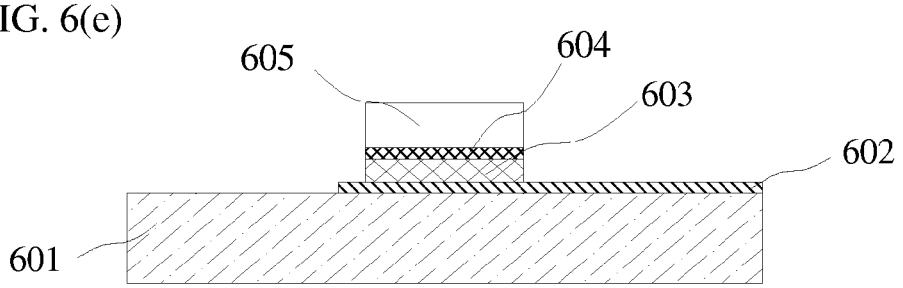
Figure 6F:
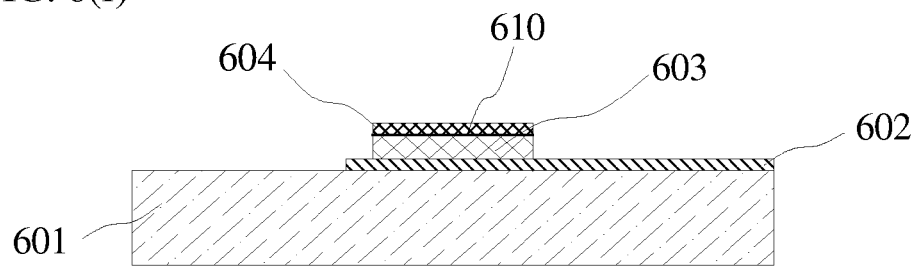
Figure 6G:
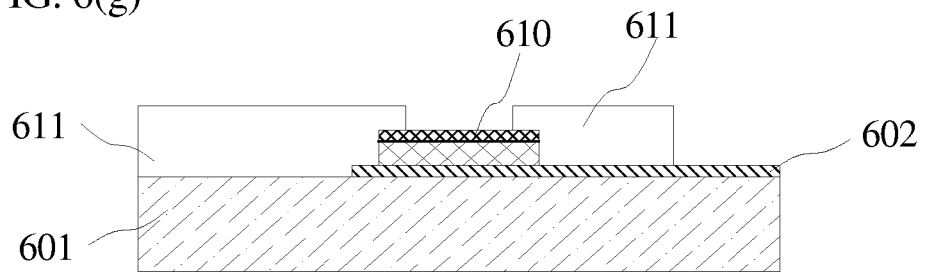
Figure 6H:
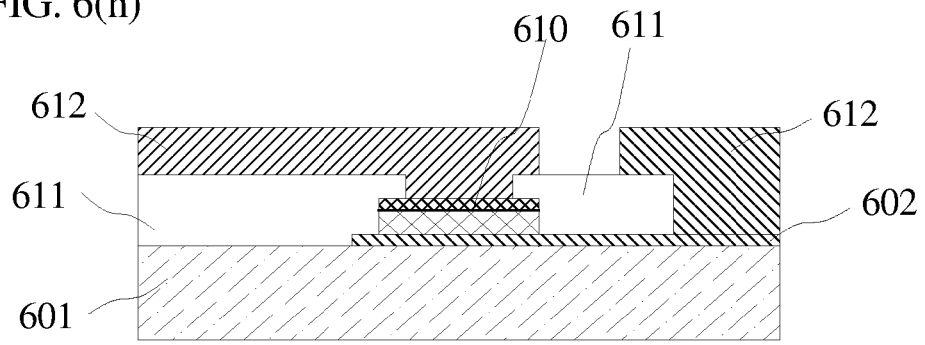
Figure 6I:
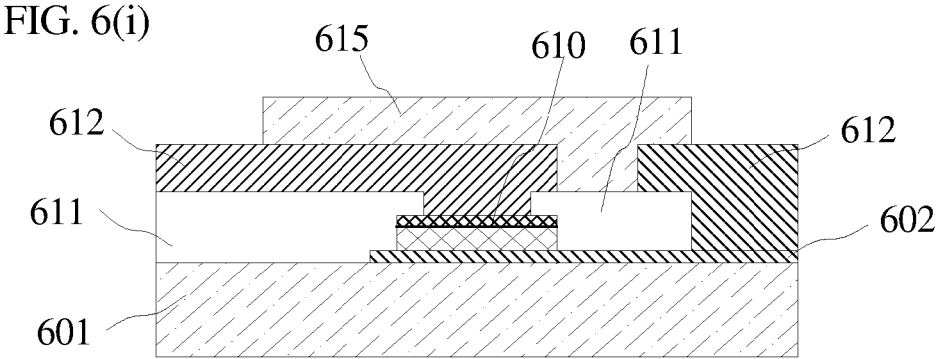
Figure 7A:
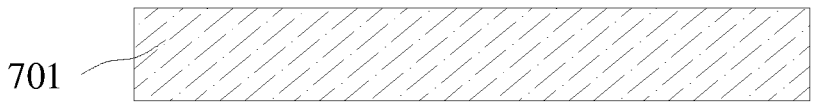
FIGS. 7(a-e) are simplified symbolic diagrams illustrating manufacture processes for another type of none-crystalline semiconductor electrical diodes.
Figure 7B:
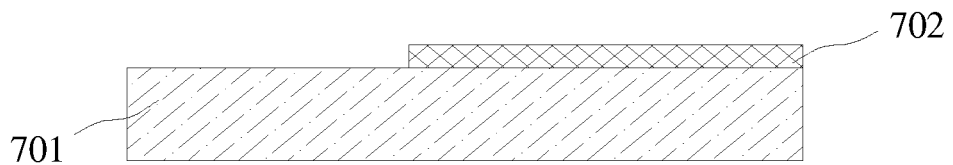
Figure 7C:
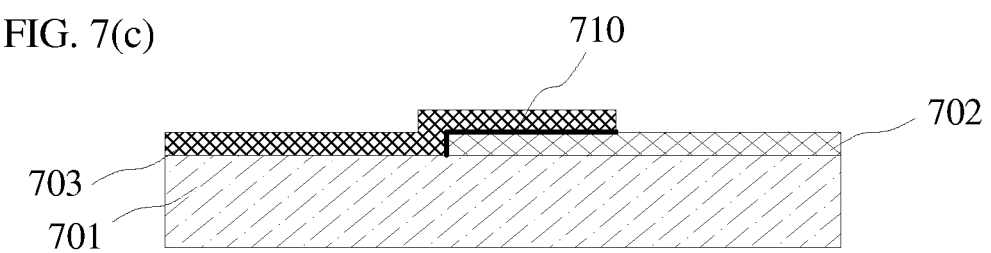
Figure 7D:
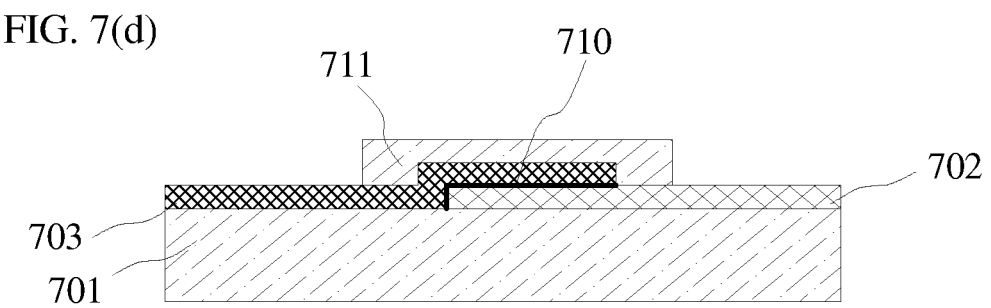
Figure 7E:
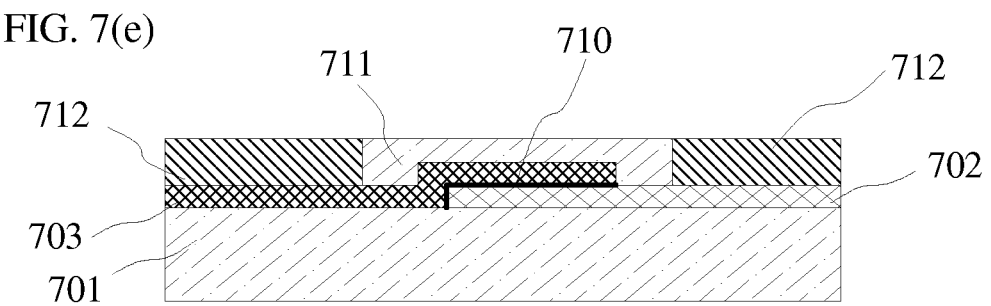
Figure 8A:
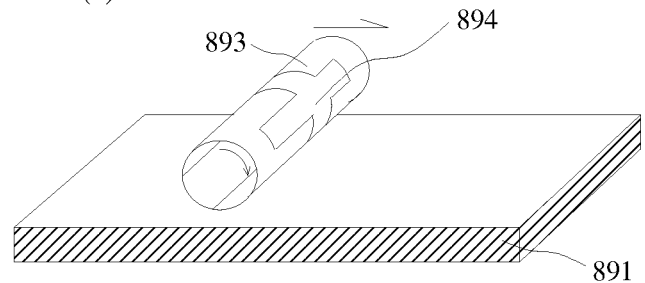
FIGS. 8(a-h) are simplified illustrations of examples of electrical printing technologies.
Figure 8B:
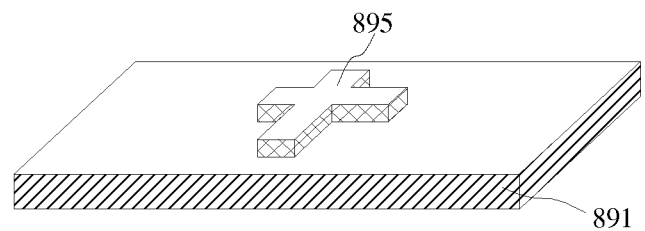
Figure 8C:
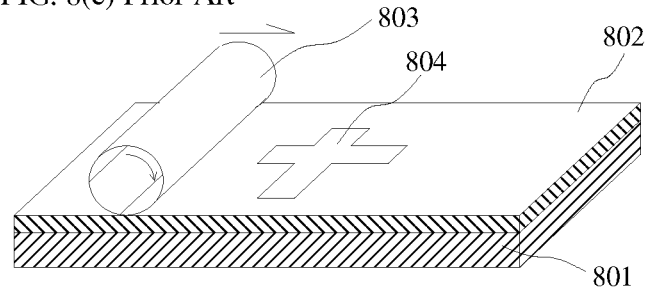
Figure 8D:
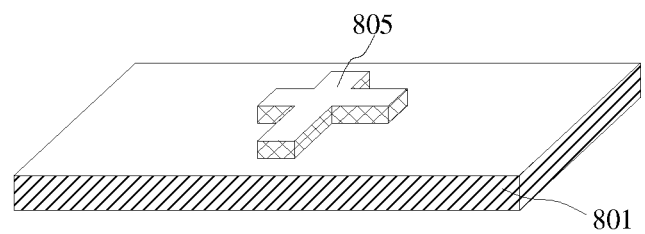
Figure 8E:
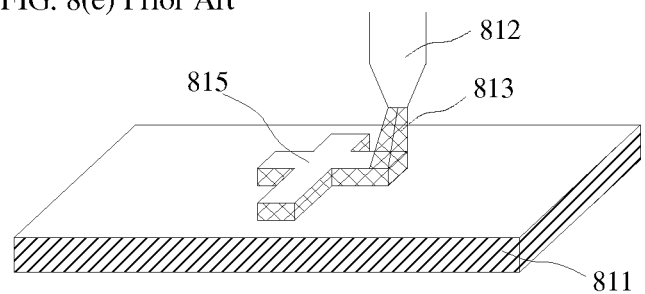
Figure 8F:
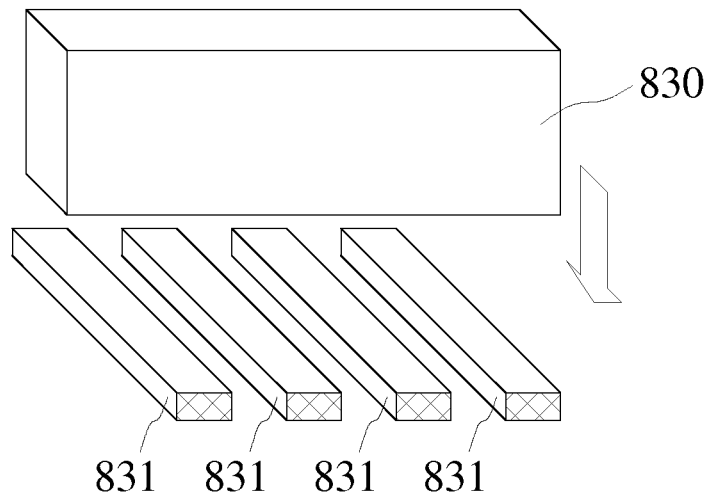
Figure 8G:
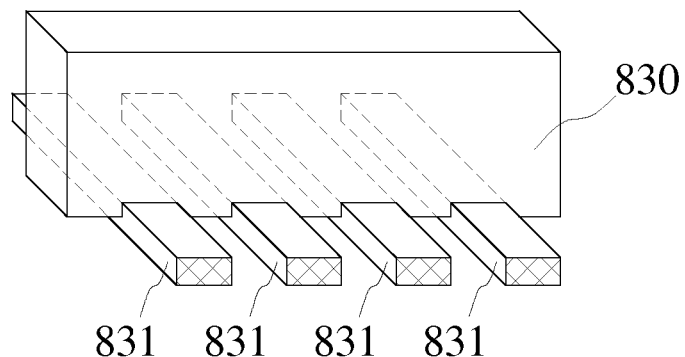
Figure 8H:
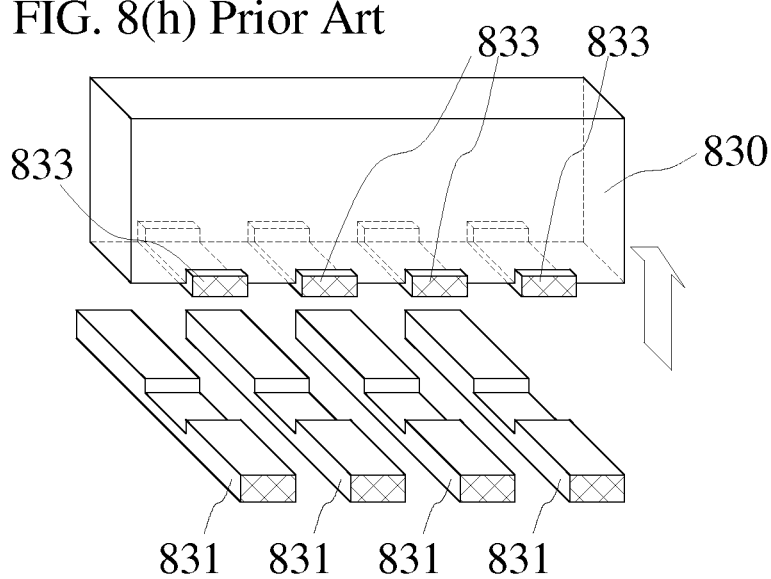

While specific embodiments of the invention have been illustrated and described herein, it is realized that other modifications and changes will become apparent to those skilled in the art. It is to be understood that there are many other possible modifications and implementations so that the scope of the invention is not limited by the specific embodiments discussed herein. For example, the soldering surface of the chip in FIG. 5(e) is the die surface while the opposite surface also can be the soldering surface. The examples in FIGS. 10(a-n) illustrate manufacturing processes to form a die-scale surface mount package chip that comprises one silicon die, while similar manufacture processes are applicable to package multiple dice into one chip with side-wall conductor leads, as illustrated by the simplified symbolic diagrams in FIGS. 11(a-f).

Figure 11A:
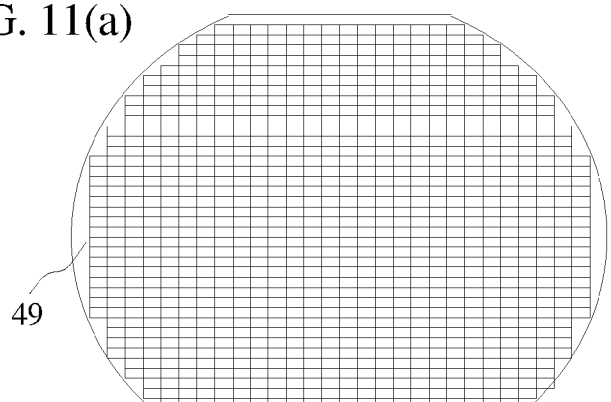
FIGS. 11(a-f) are simplified illustrations of stacking multiple dice into a die-scale surface mount package chip using side-wall conductor leads.
Figure 11B:
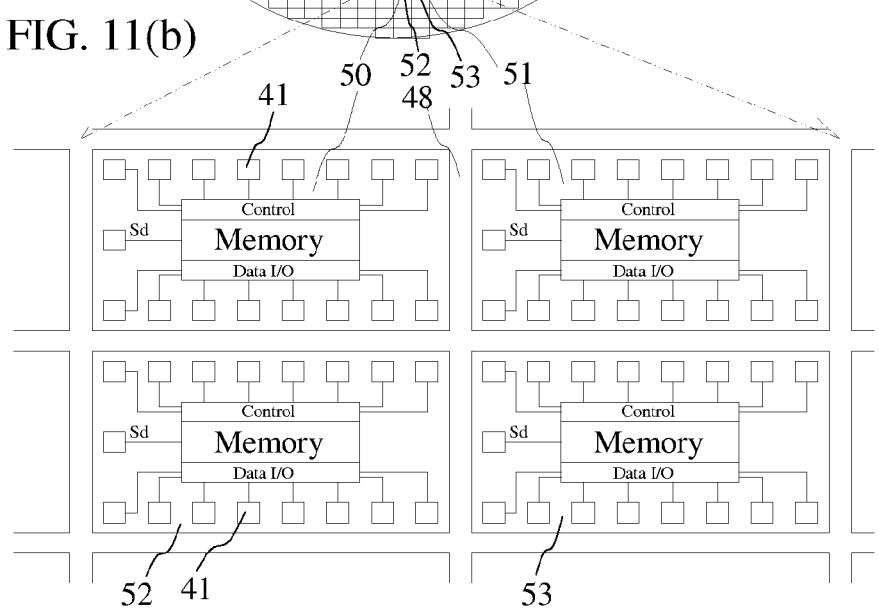
Figure 11C:
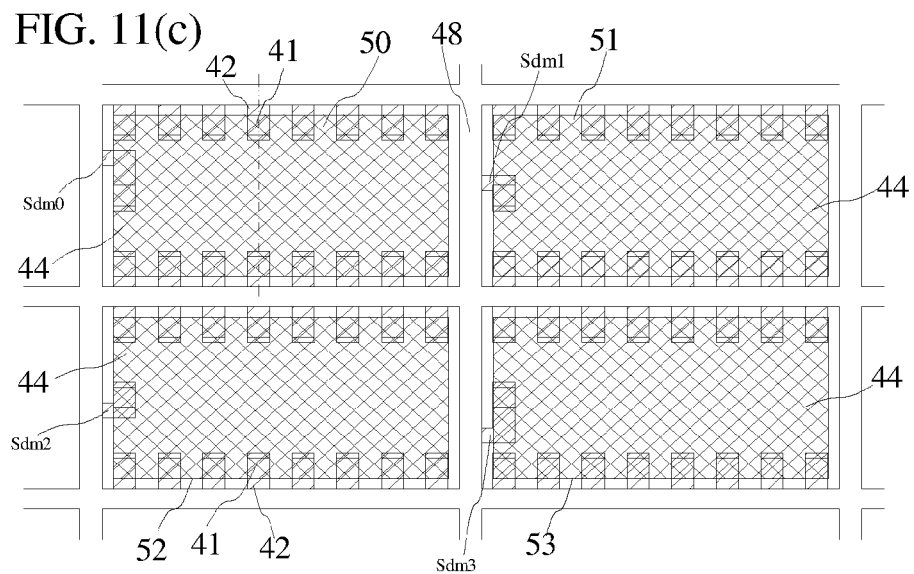
Figure 11D:
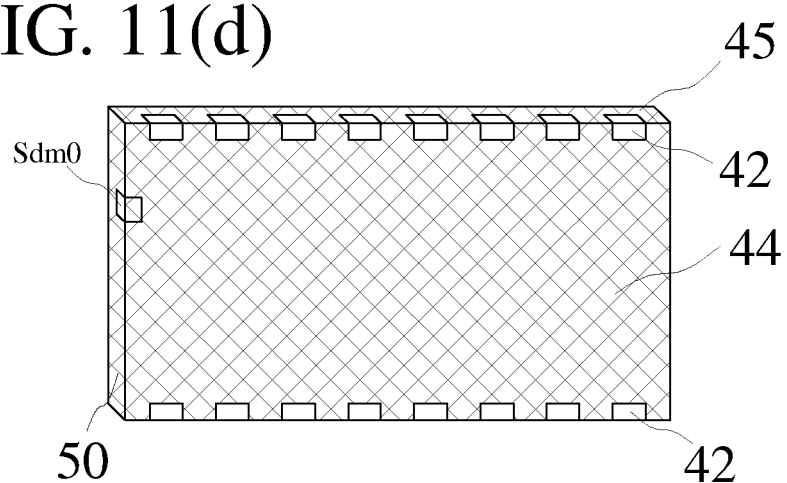
Figure 11E:
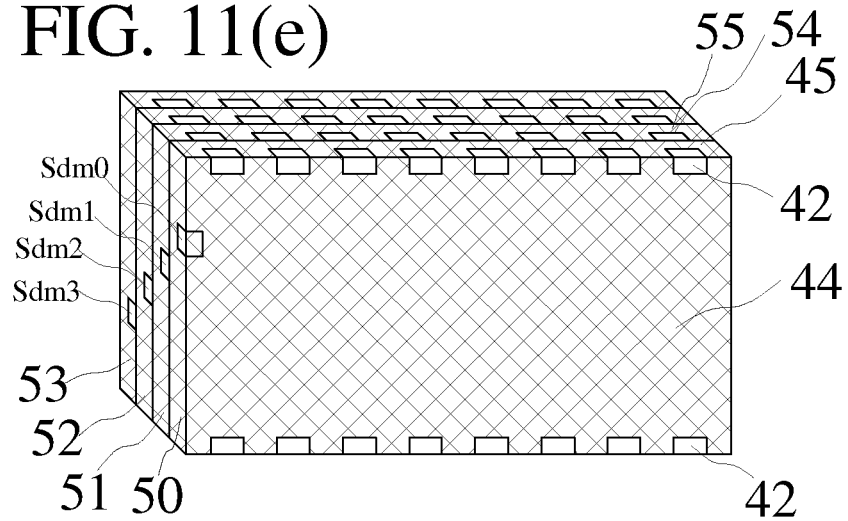
Figure 11F:
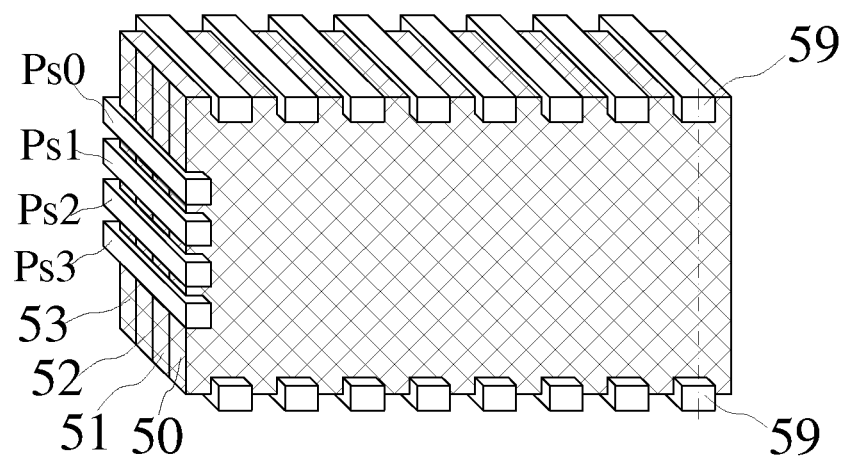

FIG. 11(a) is a simplified view of a single-crystal silicon substrate (49) that comprises a plurality of dice. FIG. 11(b) shows a magnified picture of four dice (50-53) on the silicon substrate in FIG. 11(a). Nearby dice are separated by scribe lanes (48). In this example, each die comprises an integrated circuit memory device. The structures of the memory device are very complex so that symbolic block diagrams are used to represent the memory devices. Typical examples of memory devices are FLASH memories, read-only memories (ROM), dynamic random access memories (DRAM), and static random access memories (SRAM). As shown by the block diagram in FIG. 11(b), a typical memory device has one or more memory array(s), control circuits, and data input and/or output (I/O) circuits. In this example, each memory device also has a die select signal (Sd) that allows external circuits to selectively control the memory device in a die. All the I/O, control, die select, and power supplies of the memory device are connected to bonding pads (41) that provide openings on the semiconductor substrate for external connections to the IC. After IC manufacture processes have been done, edge conductor leads (41) are printed or deposited on the surface to connect pads (41) to the edges of the dice (50-51). The die select signal (Sd) is connected to different locations at the edges of different dice with edge conductor leads (Sdm0-Sdm3), as illustrated in FIG. 11(c). After formation of edge conductor leads (41, Sdm0-Sdm3), protective insulator films (44) are printed to cover active components as illustrated by FIG. 11(c). Typical materials used for the protective insulator are plastics or epoxy. Using the processes illustrated in FIGS. 10(d-g, s), we can wrap a die (50) with insulators (44, 45) except locations with edge conductor leads (42, Sdm0) exposed to the surfaces of the die (50), as illustrated by the three-dimensional symbolic diagram in FIG. 11(d). Other dice (51-53) can be prepared in similar ways. FIG. 11(e) shows an example when 4 dice (50-53) are stacked together. The edge conductor leads (42, 54) of the same signal in different dice (50, 51) are aligned along the same line, except that the die selected signals (Sdm0-Adm3) of different dice are not aligned in the same line, as illustrated in FIG. 11(e). Using processes similar to examples in FIGS. 10(k-m), side-wall conductor leads (59, Ps0-Ps3) are be deposited to form a chip that comprises multiple stacked memory die, as illustrated in FIG. 11(f). Electroplating is typically applied to deposit additional conductor materials on the side-wall conductor leads. The side-wall conductor leads (Ps0-Ps3) on the left side-wall are used to selectively control memory devices in different dice (50-53). The area of the memory chip in FIG. 11(f) is about the same as the area of one memory die, while it can operate as a memory device the capacity or multiple memory dice. It is also possible to stack multiple chips in FIG. 11(f) on top of one another to form a high capacity memory chip stack while occupying small board areas. Side-wall conductor leads are therefore very effective in producing high capacity memory chips or memory systems.

While specific embodiments of the invention have been illustrated and described herein, it is realized that other modifications and changes will become apparent to those skilled in the art. It is to be understood that there are many other possible modifications and implementations so that the scope of the invention is not limited by the specific embodiments discussed herein. Besides differential amplifiers or memory devices, side-wall conductor leads are applicable for wide varieties of integrated circuit chips as illustrated by the examples shown in FIGS. 12(a-k). For clarity, symbolic schematic diagrams or block diagrams are used to represent integrated circuits or electrical components in FIGS. 12(a-k).

Figure 12A:
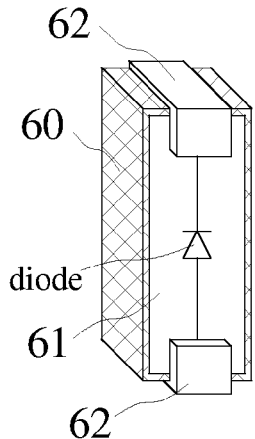
FIGS. 12(a-k) show examples of different types of active devices and integrated circuits using side-wall conductor leads.
Figure 12B:
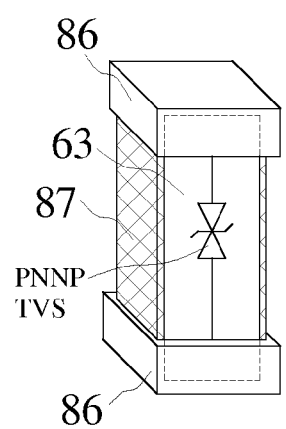
Figure 12C:
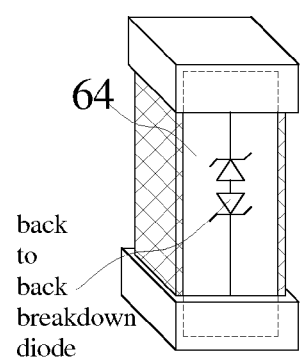
Figure 12D:
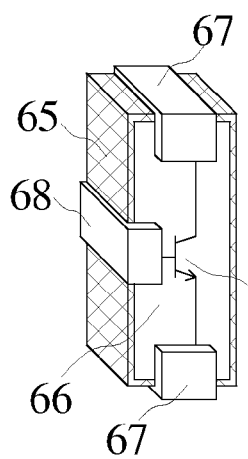
Figure 12E:
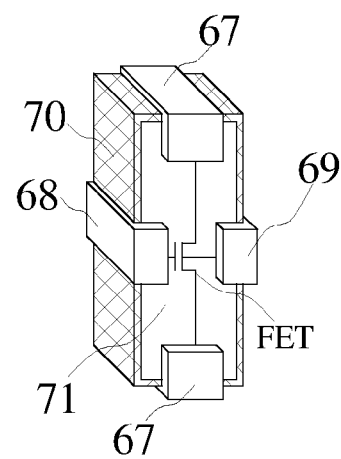
Figure 12F:
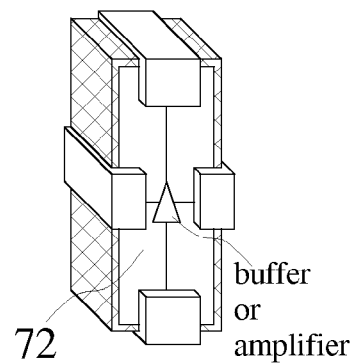
Figure 12F:
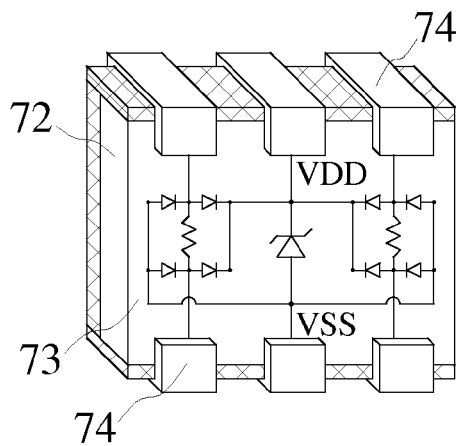
Figure 12F:
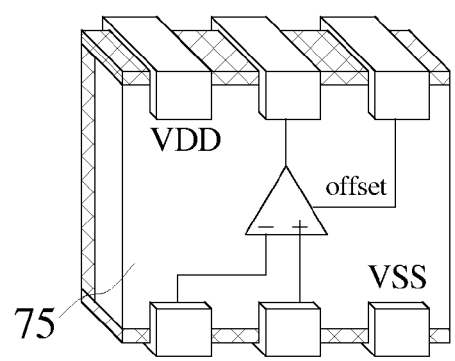

FIG. 12(a) shows a surface mount package chip (60) that comprises a silicon die (61) that comprises a diode. Side-wall conductor leads (62) at top and bottom side-walls provide external electrical connections to the diode. FIG. 12(b) shows another surface mount package chip (87) that comprises a silicon die (63) that comprises a dual direction transient voltage suppression diode (PNNP TVS). In this example, the side-wall conductor leads (86) for this chip (87) covers three side-walls instead on one side-wall, as illustrated in FIG. 12(b). FIG. 12(c) shows an example when a chip with similar external structures as that in FIG. 12(b) comprise a silicon die (64) that comprises back-to-back breakdown diodes to support similar functions as the TVS diode in FIG. 12(b). FIG. 12(d) shows a surface mount package chip (65) that comprises a silicon die (66) that comprises a bipolar transistor (NPN). Side-wall conductor leads (67, 68) provide external electrical connections to the three terminals of the transistor. FIG. 12(e) shows a surface mount package chip (70) that comprises a silicon die (71) that comprises a field effect transistor (FET). Side-wall conductor leads (67-69) provide external electrical connections to the three terminals and the substrate of the transistor (FET). FIG. 12(f) shows an example when a chip with similar external structures as that in FIG. 12(e) comprise a silicon die (72) that comprises a integrated circuit buffer or amplifier; side-wall conductor leads provide external connections to the input, output, power, and ground of the buffer or amplifier. FIG. 12(g) shows a surface mount package chip (72) that comprises a silicon die (73) that comprises an ESD/EMI protection chip. Side-wall conductor leads (74) provide external electrical connections to the ESD/EMI circuit. FIG. 12(h) shows an example when a chip with similar external structures as those in FIG. 12(g) comprise a silicon die (75) that comprises an operational amplifier; side-wall conductor leads provide external connections to the operational amplifier. FIG. 12(i) shows a surface mount package chip (76) that comprises a silicon die (77) that comprises a radio frequency (RF) integrated circuit. Side-wall conductor leads (78-79) provide external electrical connections to the RF circuit. FIG. 12(j) shows an example when a chip with similar external structures as those in FIG. 12(i) comprise a silicon die (85) that comprises a clock circuit. FIG. 12(k) shows a surface mount package chip (80) that comprises a silicon die (81) that comprises a 74 series integrated circuit. In this example it is a 7400 4-NAND gate logic circuit chips. Side-wall conductor leads (82) provide external electrical connections to the circuit. All the chips in FIGS. 12(a-k) have areas close to the areas of the silicon die in the package. Therefore, side-wall conductor leads enable them to be die-scale surface mount package chips.

The above examples show practical applications of side-wall conductor leads for external electrical connections to circuits comprise active electrical device(s) manufactured on silicon substrate(s). Active electrical devices, by definition, are electrical diodes or transistors. Surface mount package chips comprise active devices on silicon substrates can use side-wall conductor leads to achieve area substantially the same as or smaller than standard 0402 or 0201 or 01005 resistor chips of equivalent I/O counts. Areas smaller than the smallest resistor chips are also achievable. It is desirable to place the side-wall conductor leads of the chips that comprise active devices on silicon substrates so that the footprints of the surface mount chips (28) are compatible with the footprints of standard 0402, 0201, 01005, or other standard surface mount resistor chips. Making dimensions similar to the dimensions of standard resistor chips allow the flexibilities of using existing machines to assembly chips of the present invention in similar ways as resistor chips, providing significant operational cost savings.

While specific embodiments of the invention have been illustrated and described herein, it is realized that other modifications and changes will become apparent to those skilled in the art. It is to be understood that there are many other possible modifications and implementations so that the scope of the invention is not limited by the specific embodiments discussed herein. For example, printing technologies are commonly used in the above examples while other technologies are also applicable in building surface mount chips of the present invention.

Figure 13A:
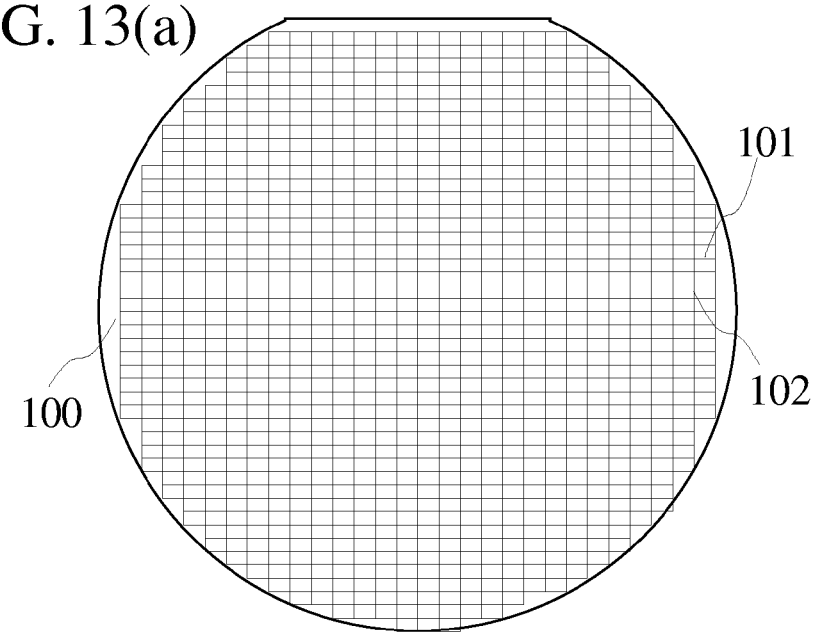
FIGS. 13(a-c) show examples of using photo-resist as insulator materials.
Figure 13B:
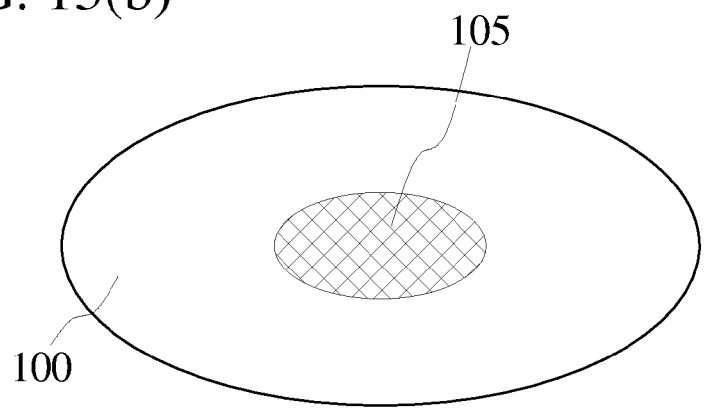
Figure 13C:
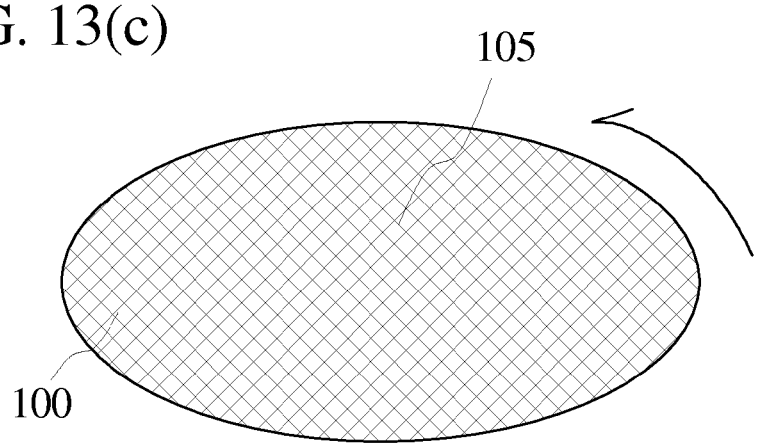

FIGS. 13(a-c) illustrate examples for using photo-resist materials as electrical component. FIG. 13(a) shows a wafer (100) that has horizontal scribe lanes (101) and vertical scribe lanes (102). Typically, photo-resist materials (105) are first dropped on the back side of the wafer (100), as illustrated in FIG. 13(b). Typical method to spread the photo-resist (105) across the wafer (100) is by spinning the wafer, as illustrated in FIG. 13(c). Thickness of the photo-resist (105) typically can be controlled by the spinning speed. One example of photo-resist material is SU-8 photo-resist developed by IBM. SU-8 can be hardened by shining ultra-violet light on the photo-resist. Other materials such as ink, paste, epoxy, plastics, dielectric, or ceramic materials also can be used as the base layer. Besides spinning, photo-resist also can be applied by brushing, printing, dipping, or other methods. Side-wall insulator(s) can be manufactured by dipping into photo-resist using such methods.

Figure 14A:
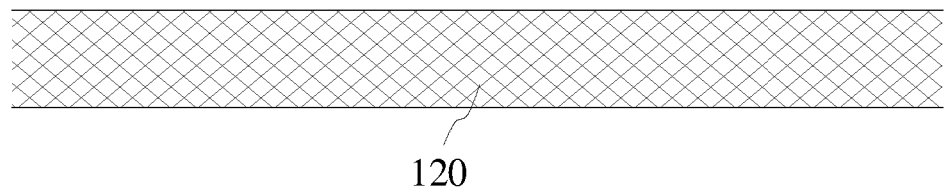
FIGS. 14(a-l) illustrate prior art through-hole manufacture procedures.
Figure 14B:
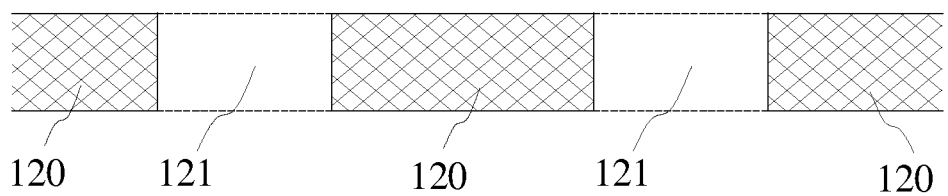
Figure 14C:
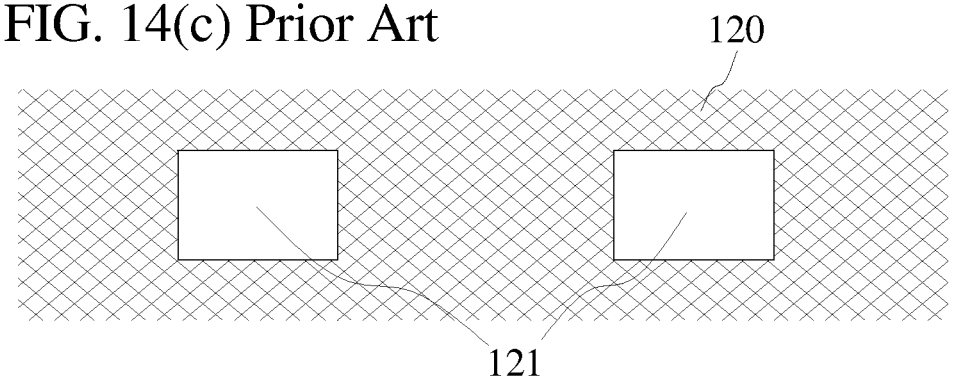
Figure 14D:
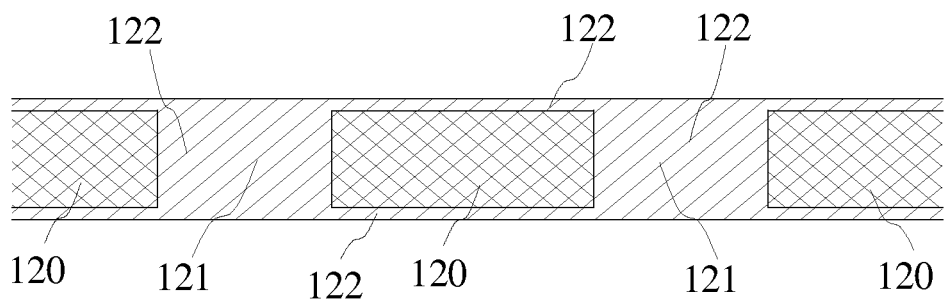
Figure 14E:
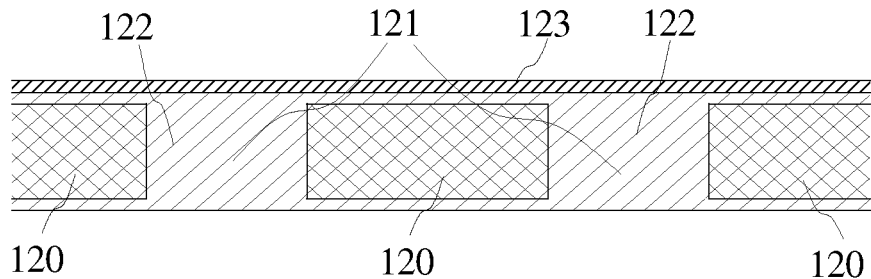
Figure 14F:
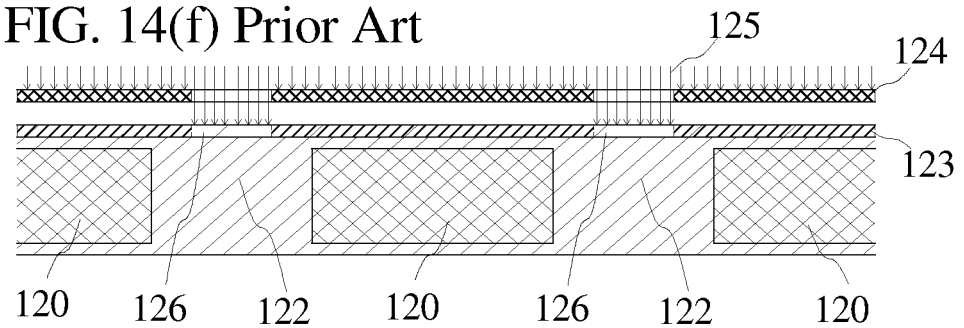
Figure 14G:
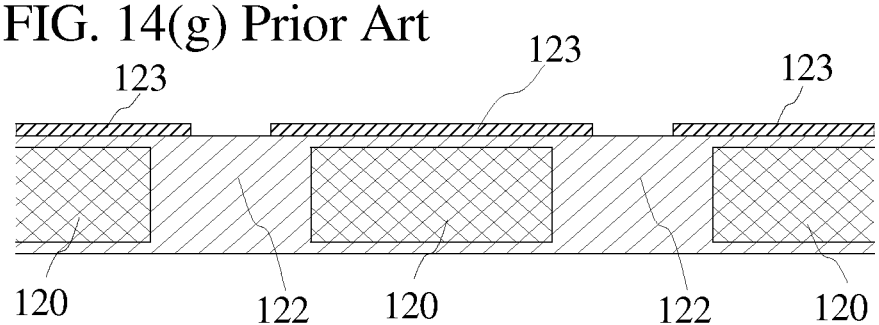
Figure 14H:
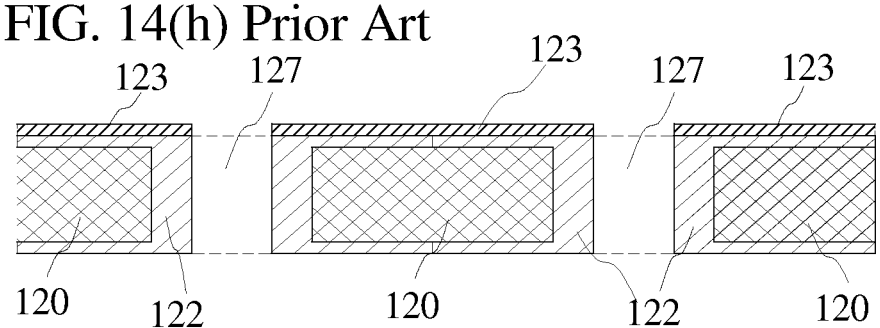
Figure 14I:
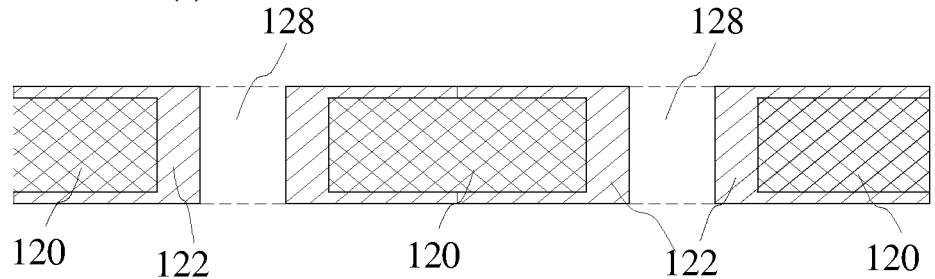
Figure 14J:
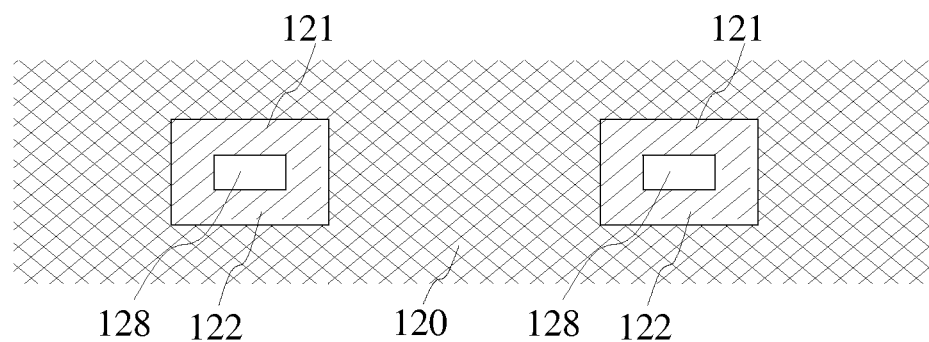
Figure 14K:
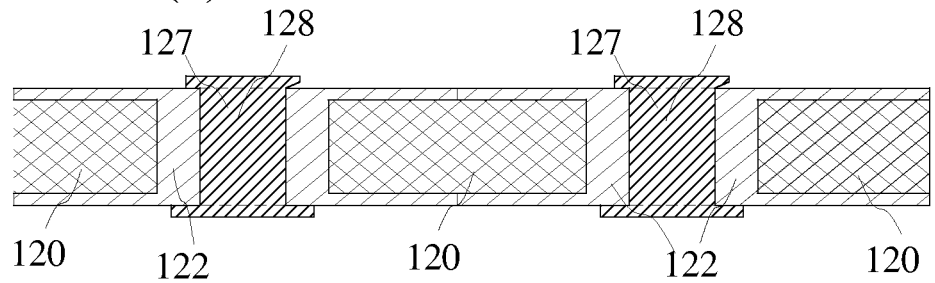
Figure 14L:
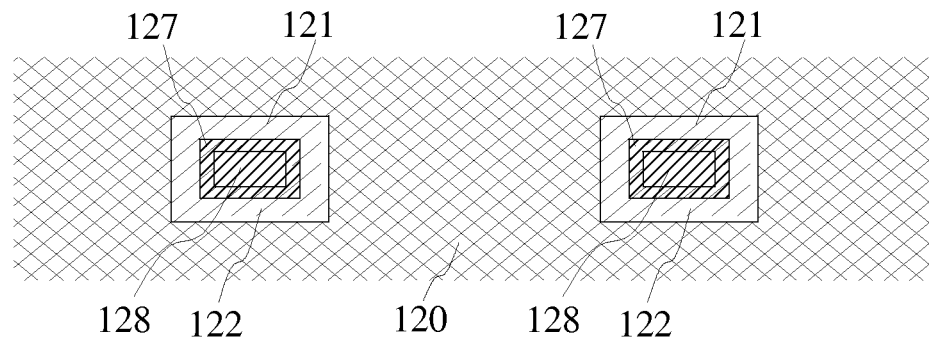

While implementing the above inventions, derivative inventions for building through-hole connections were developed. FIGS. 15(a-l) are simplified illustrations of exemplary procedures for building through-hole connections. FIG. 15(a) shows the cross-section view when through-holes (121) in a silicon substrate (120) has been opened with methods similar to the prior art method shown in FIGS. 14(a-c). FIG. 15(b) shows symbolic cross-section view when photo-resist materials (150) are applied on the substrate (120) to fill the through-holes (121) and cover both surfaces. The photo-resist materials (150) are exposed to radiation (152) selectively with patterns defined by a photo mask (151), as illustrated in FIG. 15(c). For this example, the photo-resist is a negative photo-resist so that the photo-resist materials exposed to radiation (159) become insoluble to the photo-resist developer; positive photo-resist also can be used if the tune of the mask (151) is reversed. After the developing processes, developed photo-resist materials (159) remain on the substate (120) as electrical insulator. In addition, through holes (156, 158) are opened inside the developed photo-resist materials (159) as illustrated by the cross-section diagram in FIG. 15(d) and the top view in FIG. 15(e). Comparing to the processes illustrated by FIGS. 14(e-j), the conventional method uses developed photo-resist materials (123) as the mask to define the pattern of through-holes (127) using lithograph technology, and the developed photo-resist materials (123) are washed away after the etching process, as illustrated in FIG. 14(i). For the exemplary embodiment of the present invention illustrated in FIG. 15(b-e), the developed photo-resist materials (159) remain as part of the device, and they are directly used to form the through holes (156, 158). Developed photo-resist materials can be patterned into complex shapes with accuracy. Direct use of developed photo-resist achieves optimum accuracy at better cost efficiency. In the above example, more than one hole (158) can be opened inside of one through hole (121) in the substrate (120) due to the patterning accuracy of developed photo-resist materials. Using methods such as sputtering, printing, chemical vapor deposition, plating, and/or other methods, conductor materials (155, 157) can be deposited to form through-hole connections through the holes (156, 158) defined by the developed photo-resist materials (159), as illustrated by the cross-section view in FIG. 15(f) and the top view shown in FIG. 15(g). Side wall conductor leads also can be manufactured in similar methods. For example, we can slice the through-hole conductor materials (155) in the through-hole (156) at the right hand side of FIG. 15(f) along a scribe lane (154) marked by the dashed lines in FIGS. 15(f-h), and form side wall conductor leads (155) at the side wall of the substrate (120), as illustrated in FIG. 15(h). For clarity, all the figures use simplified symbols to represent structures that can be very complex, and structures in the figures are often not drawn to scale.

While specific embodiments of the invention have been illustrated and described herein, it is realized that other modifications and changes will become apparent to those skilled in the art. It is to be understood that there are many other possible modifications and implementations so that the scope of the invention is not limited by the specific embodiments discussed herein. For example, the shape of the through-holes in the substrate or the holes in the developed photo-resist materials can be a round hole, a trench, a long slit, or other shapes. The side walls of a through-hole can have rounded edges, none-vertical angle to the surface, steps, or many other shapes. The developed photo-resist is the major material used for electrical insulation between the through-hole conductor and the substrate, but other materials also can be used in combination with developed photo-resist material for the purpose. For example, not all walls around a through hole need to be developed photo-resist materials; developed photo-resist materials also do not need to cover complete depth of a through-hole. However, a through-hole structure of the present invention should have more than half of the depth of a through-hole patterned by developed photo-resist materials. The conductor materials do not always fill the through-holes.

Sometimes the conductor materials can be a thin film attach to the side walls of the through-holes. A through-hole does not have to be built in a single process step, as illustrated by the exemplary procedures in FIGS. 16(*a-p*).

FIG. 16 is a cross-section view of a silicon substrate (120). For the examples in FIGS. 15(*a-h*) and FIGS. 16(*a-p*), electrical components such as integrated circuits, transistors, diodes, capacitors, resistors, and/or other devices may have been built on the silicon substrate (120); those components are not drawn in the figures. In this example, shallow holes (141-143) of various shapes are opened from the front surface of the substrate as shown by the cross-section diagram in FIG. 16(*b*) and the top view in FIG. 16(*c*). In our terminology, a shallow hole, by definition, is a hole that does not penetrate all the way through the substrate, as opposite to a through-hole. Shallow holes can be opened by technologies such as etching, dicing, LASER cutting, and/or ion beam milling. Shallow holes typically can be opened with better accuracy than through-holes. To cover shallow holes with insulator materials, a layer of photo-resist (160) is deposited on the surface of the substrate covering those shallow holes (141-143) as shown in FIG. 16(*d*). The photo-resist materials (160) are exposed to radiation (144) selectively with patterns defined by a photo mask (140), as illustrated in FIG. 16(*e*). For this example, the photo-resist is a negative photo-resist so that the areas (162) exposed to radiation become insoluble to the photo-resist developer; positive photo-resist also can be used if the tune of the mask is reversed. After the developing processes, developed photo-resist materials (162) remain in the substate (120) while the rest of photo-resist materials are washed away, as shown in FIG. 16(*f*). Holes (147-149) of various shapes are opened inside the developed photo-resist materials (162) during this process. Other types of methods, such as oxidation, also can be used to manufacture the insulator layer (162). After forming the insulator layer, front side conductor films (131,132) are patterned on the surface as illustrate by the cross-section view in FIG. 16(*g*) and the top view in FIG. 16(*h*). In this example, two conductor films (131, 132) are patterned as rectangles with long sides pointing to different directions. No conductor film is patterned in the slit shaped hole (149), as shown in FIGS. 16(*g, h*).

After finishing the above front side processes, shallow holes (133, 134) are opened from the back side of the substrate, as illustrated by the cross-section view in FIG. 16(*i*), and the bottom view in FIG. 16(*j*). Processing technologies such as dicing, etching, LASER cutting, ion milling, and/or other methods can be used for the purpose. These holes (133, 134) are opened deep enough to reach the shallow holes (141-143), insulators (162), and conductor films (131, 132) on the front surface, as illustrated in FIG. 16(*i*). Photo-resist materials (161) are deposited from the back side, as illustrated in FIG. 16(*k*), and radiations (146) patterned by a mask (145) are shined from the back side to pattern the photo-resist materials (161), as illustrated in FIG. 16(*l*). For this example, the photo-resist is a negative photo-resist so that the photo-resist materials exposed to radiation (166) become insoluble to the photo-resist developer; positive photo-resist also can be used if the tune of the mask is reversed. After the developing processes, developed photo-resist materials (166) remain on the back side of the substate while the rest of photo-resist materials are washed away, as shown in FIG. 16(*m*). Holes (167-169) of various shapes are opened inside the developed photo-resist materials (166) during this process. Through-holes are opened inside the insulator materials (166, 162) by combining the shallow holes (147-149) opened from the front side and the shallow holes (167-169) opened from the back side. Such structure allows more area at the front surface available to build electrical components; it also can achieve better accuracy. Cost efficiency is another advantage. Back side conductor films (137, 138) can be deposited into those holes (167-168) from back side, combining with front side conductor films (131, 132) to form through-hole connections, as illustrate by the cross-section view in FIG. 16(*n*), the bottom view in FIG. 16(*o*), and the top view in FIG. 16(*p*). Such conductor films can be deposited by sputtering, printing, plating, chemical metal processing, and/or other methods. In this example, no conductor film is patterned in the slit shaped hole (169) so that a slit shaped through-hole is opened by combining the front side slit shaped hole (149) and the back side slit shaped hole (169), as shown in FIGS. 16(*n-p*), to serve the function of a scribe lane. The front side opening can be very narrow (149)—for example, narrower than 10 micrometers—so that the scribe lane can be significantly narrower than conventional scribe lanes. It is even possible to create chips without front side scribe lane using this method.

While specific embodiments of the invention have been illustrated and described herein, it is realized that other modifications and changes will become apparent to those skilled in the art. It is to be understood that there are many other possible modifications and implementations so that the scope of the invention is not limited by the specific embodiments discussed herein. For example, the front side insulator can be manufactured without using developed photo-resist materials. It is a practical option to use typical IC manufacture processes to manufacture those front side structures. An insulator through-hole is therefore not necessary completely formed inside developed photo-resist materials. The advantages of present invention typically can be achieved when more than half of a through-hole is defined by developed photo-resist materials. It is typically desirable to open smaller front side holes and larger back side holes to provide more area for building electrical components. The front side structures and the back side structures can be patterned in wide varieties of shapes. The structures shown in our examples are simplified for clarity. The conductor materials do not always fill the through-holes. A back side hole can reach multiple front side holes or part of front side holes to form through-holes. A front side hole also can reach multiple back side holes or a portion of a back side hole to form through-holes. A through-hole of the present invention also can be built in more than two steps.

The above exemplary methods for providing electrical connection(s) through a silicon substrate comprising the steps of: opening a hole into the silicon substrate; depositing electrical insulator material(s) inside the hole in the silicon substrate; patterning one or more hole(s) inside the insulator material(s) inside the hole in the silicon substrate; depositing electrical conductor material(s) into the hole(s) inside the insulator material(s), and using the electrical conductor material(s) deposited into the hole(s) as part of or all of the conductor material(s) that provide electrical connection(s) from the front surface to the back surface of the silicon substrate. The hole opened in the silicon substrate can be opened by dicing, LASER cutting, etching, or other method, and it can be a through hole or a partial hole that does not penetrate all the way through the silicon substrate at the time when the hole is opened. In the above examples, developed photo-resist materials are used to provide electrical insulating between the silicon substrate and the conductor material(s) inside the hole in the silicon substrate, while the insulator material(s) deposited into the hole in the silicon substrate can be photo-resist material(s), dried ink insulator material(s), or other types of insulator material(s). Prior art methods typically open one hole in a silicon hole while the present invention provides reliable methods to open multiple insulated holes inside of one silicon hole. The step of depositing electrical conductor material(s) into the hole(s) inside the insulator material(s) can be executed using sputtering, printing, electroplating, and/or other methods. FIGS. 17(a-f) are simplified symbolic cross-section diagrams of exemplary hole-filling procedures using printing technologies. FIGS. 18(a-l) are simplified symbolic cross-section diagrams of exemplary hole-filling procedures using electroplating.

FIGS. 17(a-c) are simplified symbolic cross-section diagrams for exemplary hole-filling procedures using screen printing. Starting from the structures shown in FIG. 16(f), holes (147-149) of various shapes have been opened inside insulator materials; in this example, developed photo-resist materials (162) are used. A stencil (949) with pre-defined printing patterns is placed above the silicon substrate. A roller (940) or other mechanism presses ink (941) onto the silicon substrate with desired patterns. FIG. 17(a) illustrates the situation when ink (941) is pressed into the first hole (147). Conductor ink materials (942) are deposited into the first hole (147) with desired pattern, as illustrated in FIG. 17(b). FIG. 17(b) also illustrates the situation when the roller (940) presses ink (941) into the second hole (148). Conductor ink materials (943) are deposited into the second hole (148) with desired pattern, as illustrated in FIG. 17(c). FIG. 17(c) also illustrates the situation when the roller (940) is moved above the third hole (149); in this example, we do not want to fill the third hole (149) so that the stencil (949) blocked ink deposition. After screen printing, proper heat treatments remove the solvent in the ink (942, 943) deposited into the holes (147, 148) to form dried-ink conductors (131, 132) as illustrated by the example in FIG. 16(g), and the dried-ink conductor materials formed using the printed electrical conductor materials (942, 943) are used as part of the conductor materials that provide electrical connections from the front surface to the back surface of the silicon substrate, as illustrated by the examples shown in FIGS. 16(g-p).

FIGS. 17(d-f) are simplified symbolic cross-section diagrams for exemplary hole-filling procedures using inkjet printing. Starting from the structures shown in FIG. 16(f), holes (147-149) of various shapes have been opened inside insulator materials. FIG. 17(d) illustrates the situation when a printer head (945) injects ink (946) into the first hole (147). Conductor ink materials (947) are deposited into the first hole (147) with desired pattern, as illustrated in FIG. 17(e). FIG. 17(e) also illustrates the situation when the printer head (945) injects ink (946) into the second hole (148). Conductor ink materials (948) are deposited into the second hole (148) with desired pattern, as illustrated in FIG. 17(f). FIG. 17(f) also illustrates the situation when the printer head (945) is moved above the third hole (149); in this example, we do not want to fill the third hole (149) so that the printer head (945) does not inject ink. After inkjet printing, proper heat treatments remove the solvent in the ink (947, 948) deposited into the holes (147, 148) to form dried-ink conductors (131, 132), as illustrated by the example in FIG. 16(g), and the dried-ink conductor materials formed using the printed electrical conductor materials (942, 943) are used as part of the conductor materials that provide electrical connections from the front surface to the back surface of the silicon substrate, as illustrated by the examples shown in FIGS. 16(g-p).

While specific embodiments of the invention have been illustrated and described herein, it is realized that other modifications and changes will become apparent to those skilled in the art. It is to be understood that there are many other possible modifications and implementations so that the scope of the invention is not limited by the specific embodiments discussed herein. For example, we can combine other methods such as electroplating or sputtering with printing to fill the insulator holes with conductor materials. Because inks are pressed into the holes, we are able to fill holes of shapes that can not be filled by sputtering. The cost efficiency of printing are typically better than sputtering.

FIGS. 18(a-l) are simplified symbolic cross-section diagrams for exemplary hole-filling procedures using electroplating. FIG. 18(a) shows the cross-section view of a silicon substrate (910). The top surface of the substrate is mostly covered by insulator (911) thin film. Active devices such as integrated circuits may have been built on the silicon substrate; they are not shown in the figures for clarity. FIG. 18(b) shows the structures when holes (913) are opened in the silicon substrate (910). FIG. 18(c) illustrates the cross-section structures when insulator materials (912) have been deposited into the holes (913) in the silicon substrate, and insulator holes have been opened in the insulator materials; the silicon substrate (910) is exposed at the bottom of those insulator holes. Multiple insulator holes can be opened in one silicon hole. During electroplating, electrolyte (915) containing one or more types of dissolved conductor ions (916) covers the surface of the substrate, as illustrated in FIGS. 18(d-f), where conductor ions (916) are represented symbolically by a circle that encloses a "+" sign. The silicon substrate (910) is connected to the cathode terminal so that the exposed silicon substrate at the bottom of the holes (914) provides cathode connections for the electroplating processes. Conductor ions (916) are therefore drawn toward the exposed silicon substrate (914) and reduced into conductor atoms (918) at the cathode interface, as illustrated in FIG. 18(d). The reduced conductor atoms (918) are represented symbolically by open circles in FIGS. 18(d-f). Starting from the exposed silicon at the bottom of the holes (914), conductor materials (917) starts to grow along the insulator holes, as illustrated in FIGS. 18(e, f). With proper control of electroplating conditions, conductor materials (917) fill the holes (913) in desired shapes, as illustrated in FIG. 18(g). Using methods such as those illustrated in FIGS. 16(a-p), the conductor materials filled by electroplating (917) can be used as part(s) of the conductor material(s) that provide electrical connection(s) from the front surface to the back surface of the silicon substrate. FIG. 18(h) illustrates the cross-section view when the bottom surface of the silicon substrate (910) is polished to the depth of the holes (913) so that the electroplated conductors (917) along form through-hole connections. FIGS. 18(i-l) illustrate another example. In this example, the bottom surface of the silicon substrate (910) is polished to a level that does not reach the holes (913), as illustrated in FIG. 18(i). A hole (920) is opened from the bottom surface, as illustrate in FIG. 18(j). Insulator materials (922) are patterned to form insulator holes (923) at the bottom surface, as illustrated in FIG. 18(k), and conductor materials (927) deposited from the bottom side combine with the electroplated conductors (917) to form through-hole connections, as illustrated in FIG. 18(l).

While specific embodiments of the invention have been illustrated and described herein, it is realized that other modifications and changes will become apparent to those skilled in the art. It is to be understood that there are many other possible modifications and implementations so that the scope of the invention is not limited by the specific embodiments discussed herein. For example, the bottom conductor (927) also can be formed by electroplating using top conductors (917) as the cathode terminals. We can combine other methods such as printing or sputtering with electroplating to fill the insulator holes with conductor materials. The above electroplating methods are self-aligned methods that may not need additional masking steps. Because conductors are grown along the holes, we are able to fill holes of shapes that can not be filled by sputtering. The electroplated conductors can have soldering metal ready for board level assembly or stacking. The overall costs of such methods are typically much lower than that of sputtering.

While specific embodiments of the invention have been illustrated and described herein, it is realized that other modifications and changes will become apparent to those skilled in the art. It is therefore to be understood that the appended claims are intended to cover modifications and changes as fall within the true spirit and scope of the invention.

What is claimed is:

1. A method for providing electrical connection(s) through a silicon substrate, comprising the steps of:
   opening a hole into the silicon substrate; depositing electrical insulator material(s) inside the hole in the silicon substrate; Patterning one or more hole(s) inside the insulator material(s) inside the hole in the silicon substrate; printing electrical conductor material(s) into the hole(s) inside the insulator material(s); using the dried-ink conductor material(s) formed using the printed electrical conductor material(s) as part of or all of the conductor material(s) for providing electrical connection(s) from a front surface to a back surface of the silicon substrate;
   wherein the step of, depositing the electrical insulator material inside the hole in the silicon substrate comprising a step of depositing developed photo-resist material(s) as the electrical insulator material for insulating the silicon substrate and the conductor material(s) inside the hole.

2. The Method in claim 1 wherein the step of opening a hole into the silicon substrate comprises a step of opening a through-hole extending from the front surface to the back surface of the silicon substrate.

3. The method in claim 1 wherein the step of opening a hole into the silicon substrate comprises a step of opening a hole penetrating partially through the silicon substrate when the hole is opened.

4. The method in claim 1 wherein the step of printing electrical conductor material(s) comprises a step of using screen printing to print electrical conductor material(s) into the hole(s) opened through the insulator material(s).

5. The method in claim 1 wherein the step of printing electrical conductor material(s) comprises a step of using inkjet printing to print electrical conductor material(s) into the hole(s) opened through the insulator material(s).

6. The method in claim 1 comprises a step of patterning two or more holes opened through the insulator material(s) filled inside the hole in the silicon substrate.

7. The method in claim 1 wherein the step of opening a hole into the silicon substrate comprises a step of opening the hole by applying a dicing process.

8. The method in claim 1 wherein the step of opening a hole into the silicon substrate comprises a step of opening the hole by applying a LASER cutting process.

9. A method for providing electrical connection(s) through a silicon substrate, comprising the steps of: opening a hole into the silicon substrate; depositing electrical insulator material(s) inside the hole in the silicon substrate; Patterning one or more hole(s) inside the insulator material(s) inside the hole in the silicon substrate, wherein the silicon substrate is exposed at the bottom of the hole(s); filling conductor material(s) into the hole(s) inside the insulator material(s) by electroplating, using a dried-ink conductor materials wherein the silicon substrate exposed at the bottom of the hole(s) provides cathode connection(s) for the electroplating process(es); using the conductor material(s) filled by electroplating as part(s) of the conductor material(s) that provide electrical connection(s) from the front surface to the back surface of the silicon substrate; and
   wherein the step of, depositing the electrical insulator material inside the hole in the silicon substrate comprising a step of depositing developed photo-resist material(s) as the electrical insulator material for insulating the silicon substrate and the conductor material(s) inside the hole.

10. The method in claim 9 comprises a step of patterning two or more holes opened through the insulator material(s) filled inside the hole in the silicon substrate.

11. The method in claim 9 wherein the step of opening a hole into the silicon substrate comprises a step of opening the hole by applying a dicing process.

12. The method in claim 9 wherein the step of opening a hole into the silicon substrate comprises a step of opening the hole by applying a LASER cutting process.

* * * * *